(12) United States Patent
Nagai

(10) Patent No.: US 7,420,218 B2
(45) Date of Patent: Sep. 2, 2008

(54) NITRIDE BASED LED WITH A P-TYPE INJECTION REGION

(75) Inventor: Hideo Nagai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 119 days.

(21) Appl. No.: 10/591,153

(22) PCT Filed: Mar. 16, 2005

(86) PCT No.: PCT/JP2005/005296

§ 371 (c)(1),
(2), (4) Date: Aug. 30, 2006

(87) PCT Pub. No.: WO2005/091388

PCT Pub. Date: Sep. 29, 2005

(65) Prior Publication Data

US 2007/0181895 A1    Aug. 9, 2007

(30) Foreign Application Priority Data

Mar. 18, 2004  (JP) ............... 2004-079299
Jul. 15, 2004   (JP) ............... 2004-208524

(51) Int. Cl.
   *H01L 33/00*   (2006.01)
(52) U.S. Cl. .................. 257/98; 257/81; 257/95; 257/99; 257/100
(58) Field of Classification Search .................. 257/81, 257/95, 98, 99, 100
See application file for complete search history.

(56) References Cited

U.S. PATENT DOCUMENTS

| 6,222,207 B1 | 4/2001 | Carter-Coman et al. |
| 6,316,785 B1 | 11/2001 | Nunoue et al. |
| 2004/0031956 A1 | 2/2004 | Saxler |

FOREIGN PATENT DOCUMENTS

| JP | 11-330552 | 11/1999 |
| JP | 2003-110138 | 4/2003 |

OTHER PUBLICATIONS

Yamada, Motokazu et al; InGaN-Based Near-Ultraviolet and Blue-Light-Emitting Diodes with High External Quantum Efficiency Using a Patterned Sapphire Substrate and a Mesh Electrode; Jpn. J. Appl. Phys vol. 41 (2002) pp. L1431-L1433, Part 2, No. 12B, Dec. 15, 2002, The Japan Society of Applied Physics.

*Primary Examiner*—Evan Pert
*Assistant Examiner*—Tan N Tran

(57) ABSTRACT

An LED chip (2) is composed of a p-GaN layer (10), an n-GaN layer (14), and an MQW emission layer (12) that is sandwiched between the GaN layers (10 and 14). Each layer is made of a GaN semiconductor. Light exits the LED chip (2) through the n-GaN layer (14). A p-electrode (16) of the LED chip (2) has a surface profile (24B) defined by a plurality of columnar projections (24A) formed in a uniformly distributed relation on the surface facing toward the p-GaN layer (10). The p-electrode (16) is in contact with the p-GaN layer (10) at the top surface of each projection (24A).

17 Claims, 36 Drawing Sheets

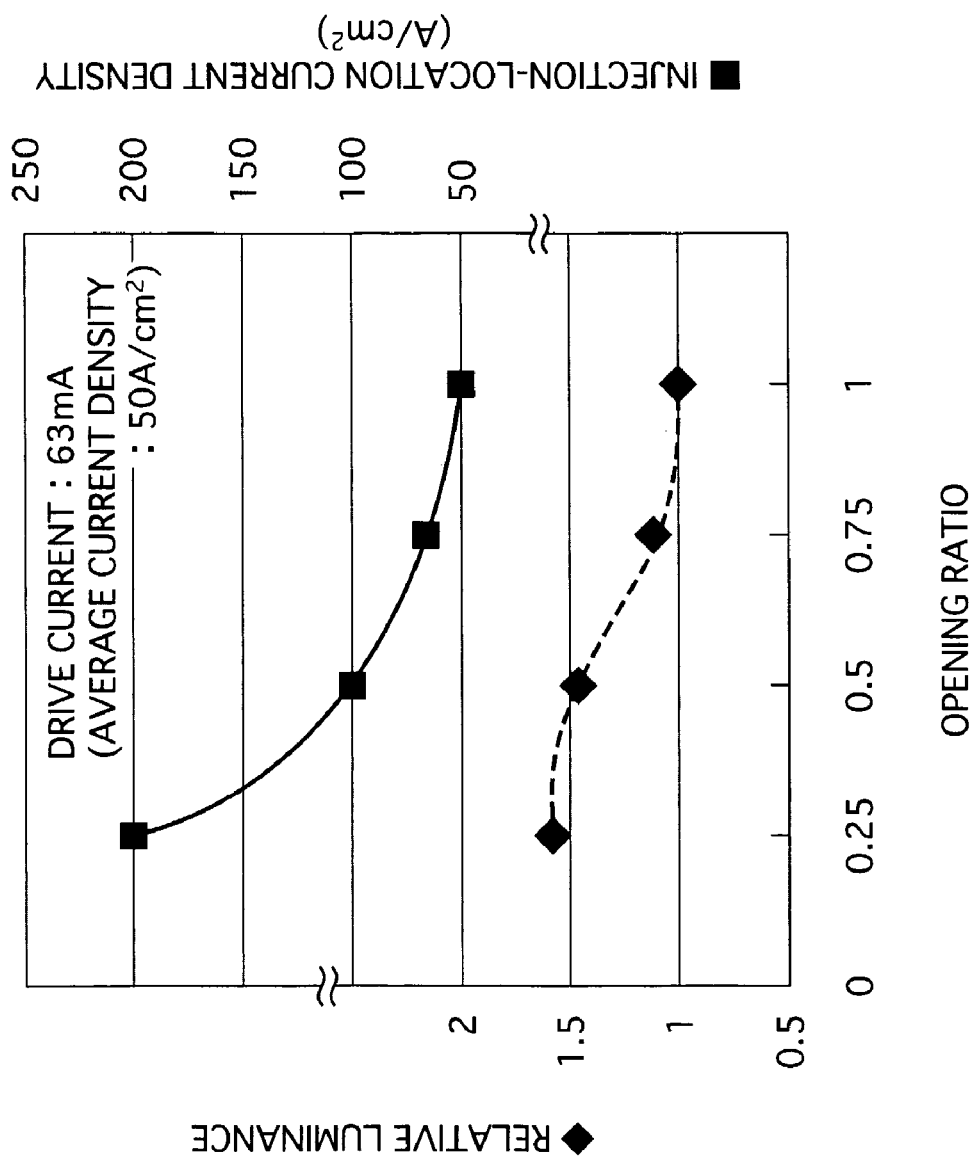

FIG.4
STEP A1
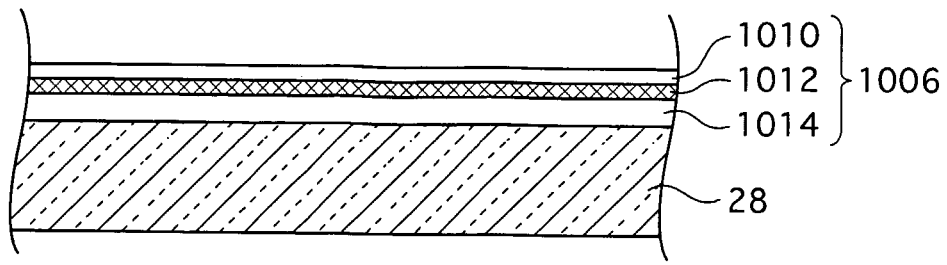
STEP B1
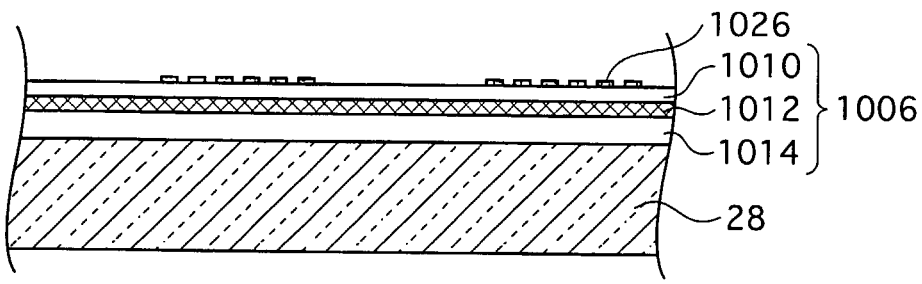
STEP C1
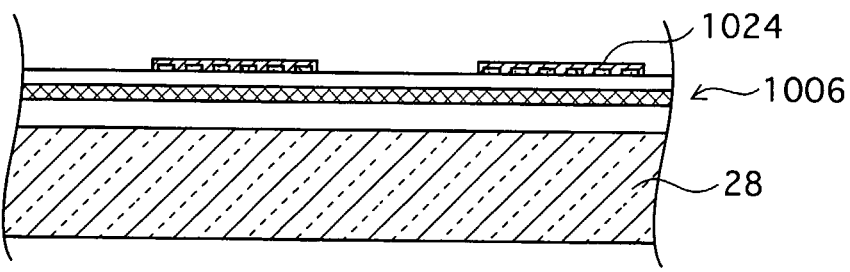
STEP D1
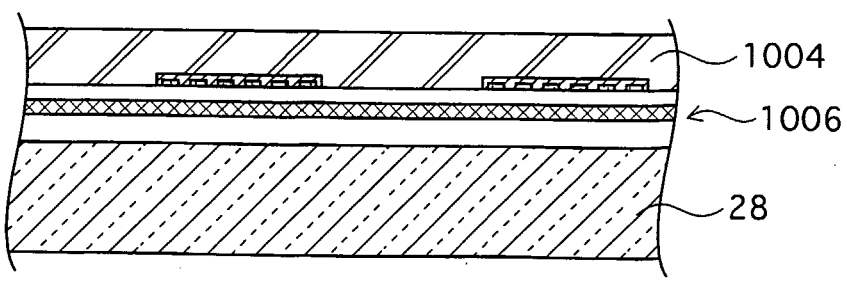

FIG.5
STEP E1
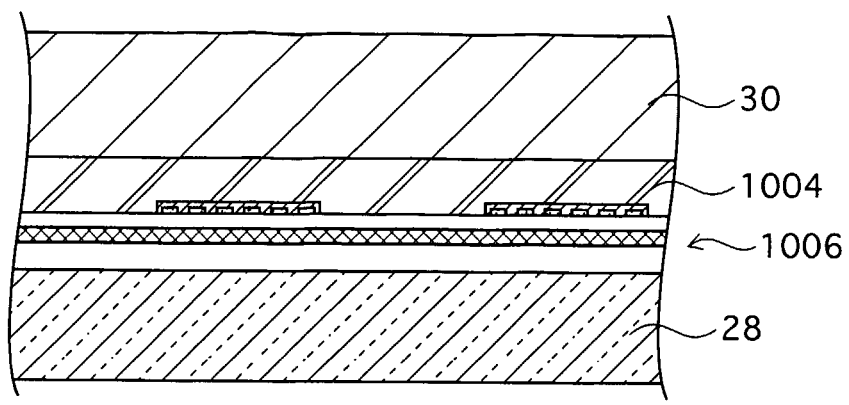
STEP F1
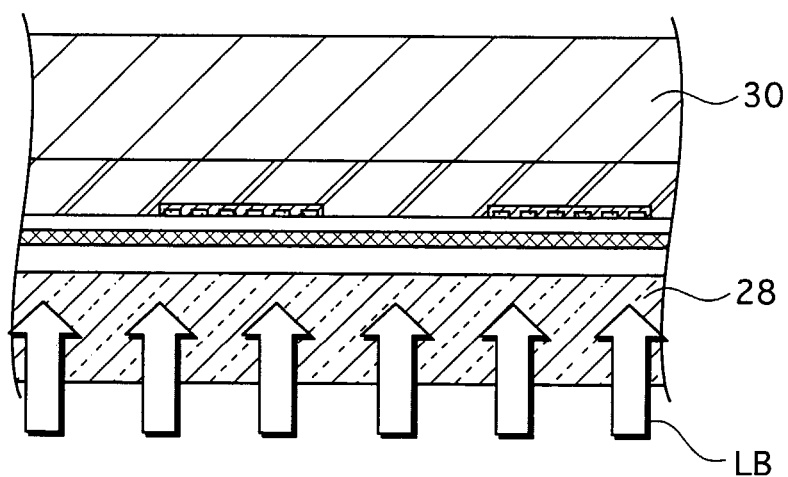
STEP G1
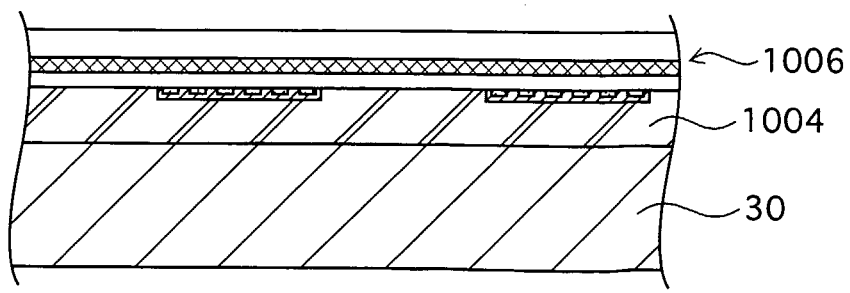

FIG.6
STEP H1
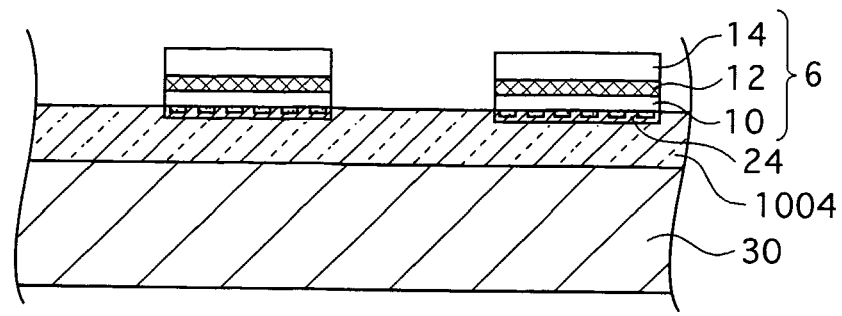
STEP I1
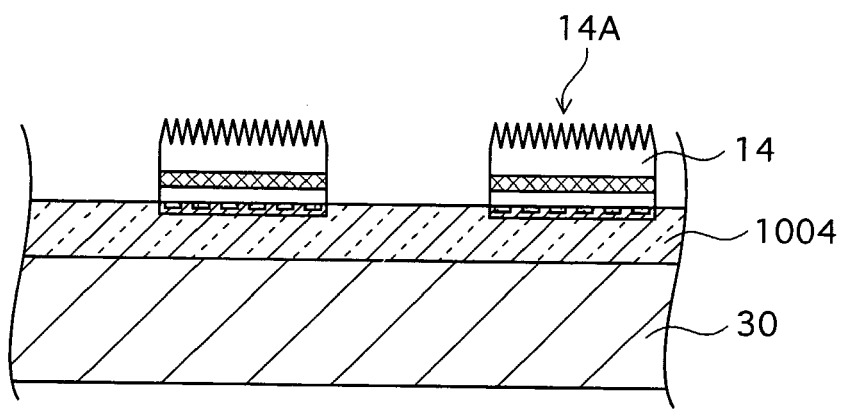
STEP J1
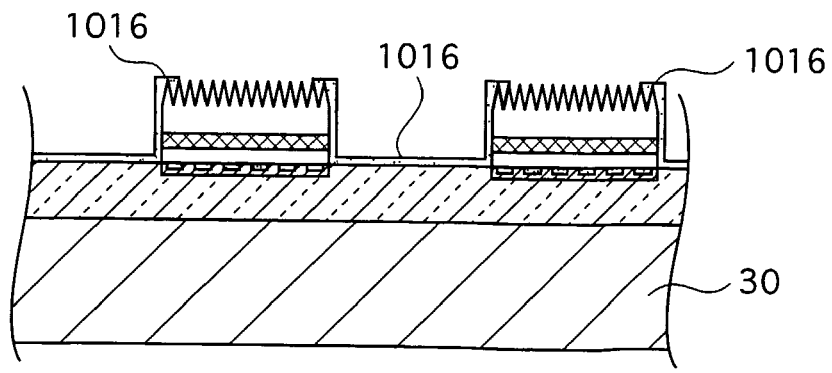

FIG.7
STEP K1
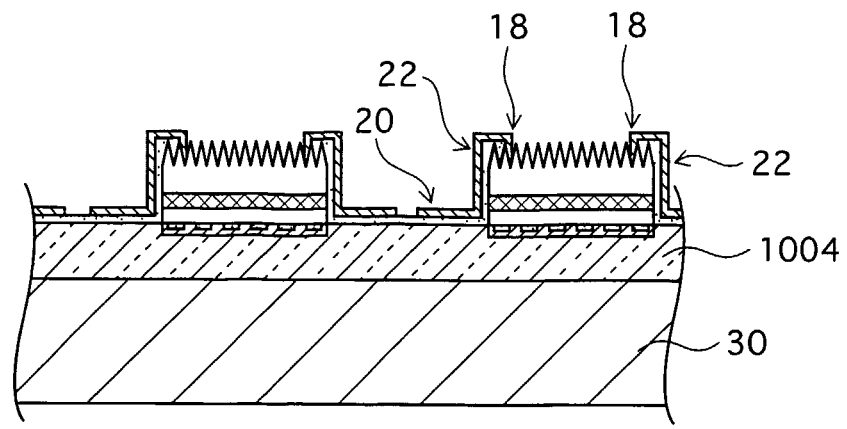
STEP L1
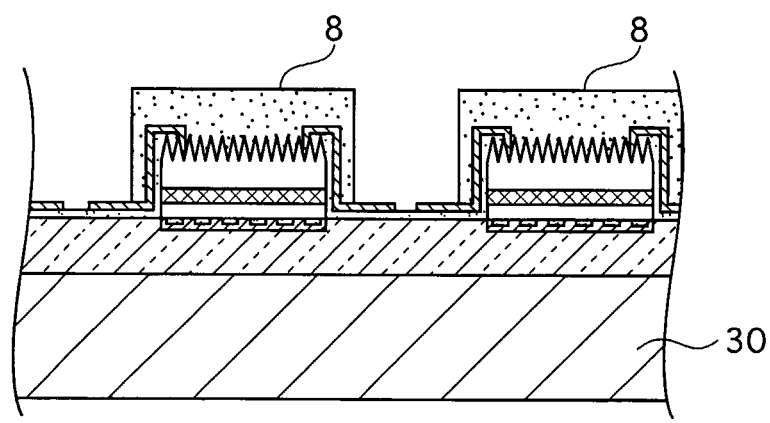
STEP M1
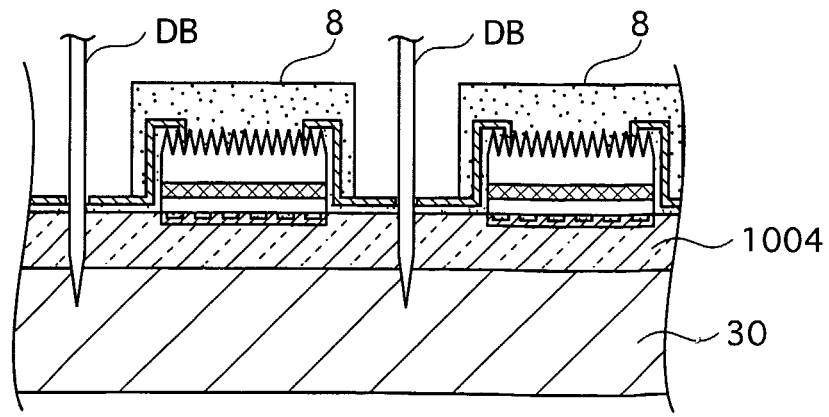

FIG.10
STEP A2
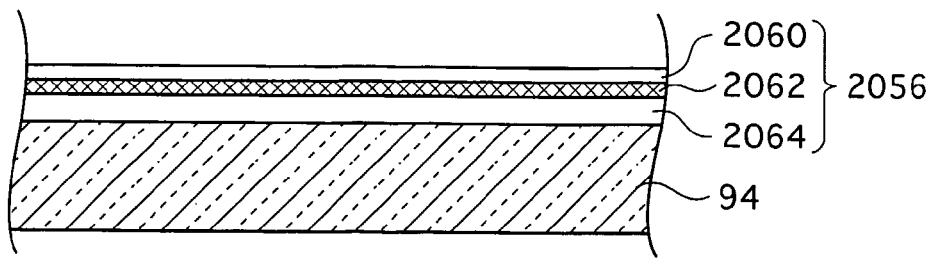
STEP B2
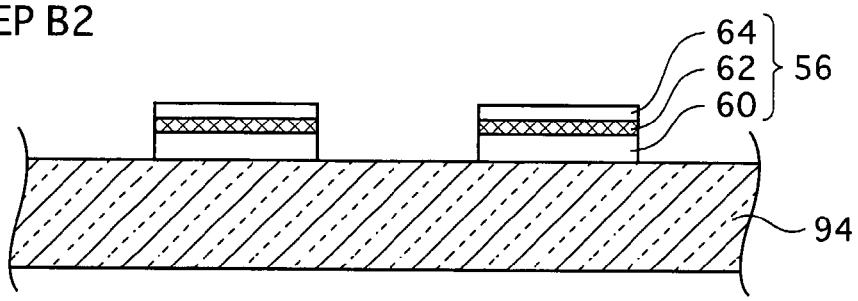
STEP C2
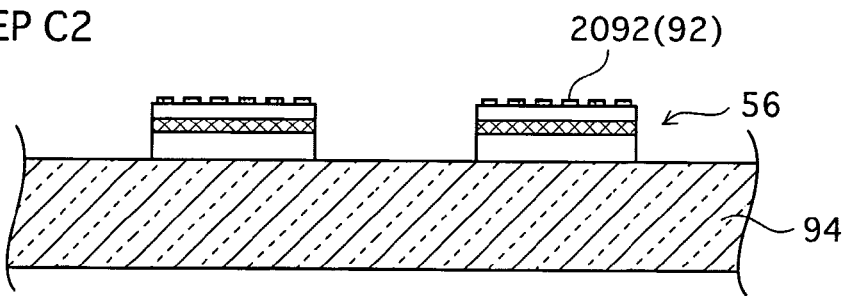
STEP D2
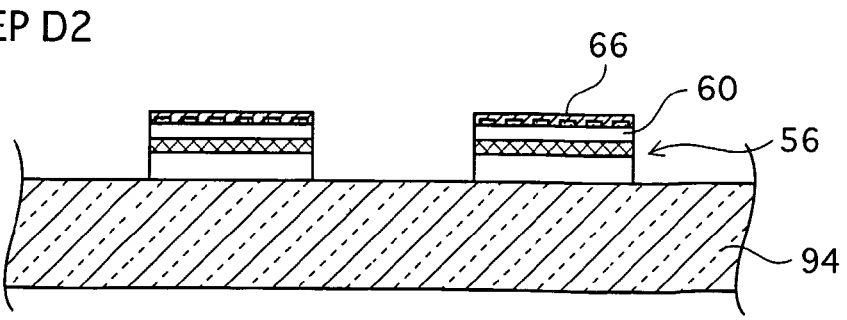

FIG.13
STEP E2
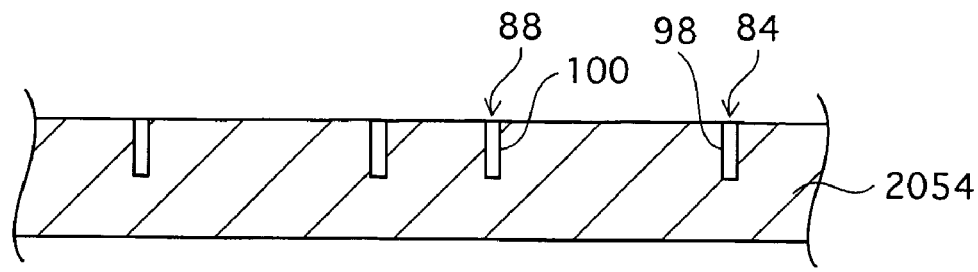
STEP F2
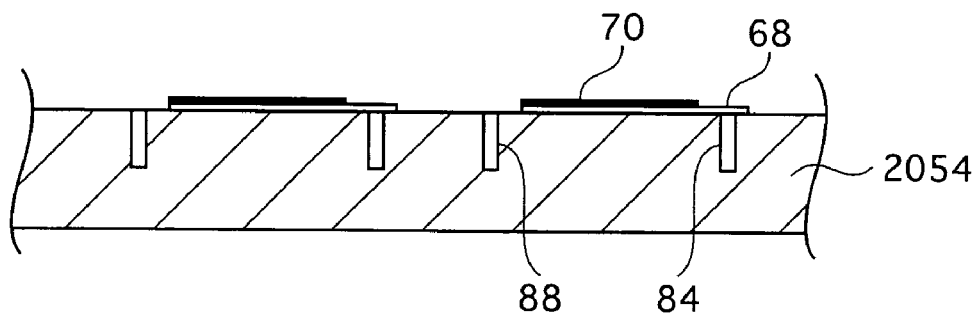
STEP G2
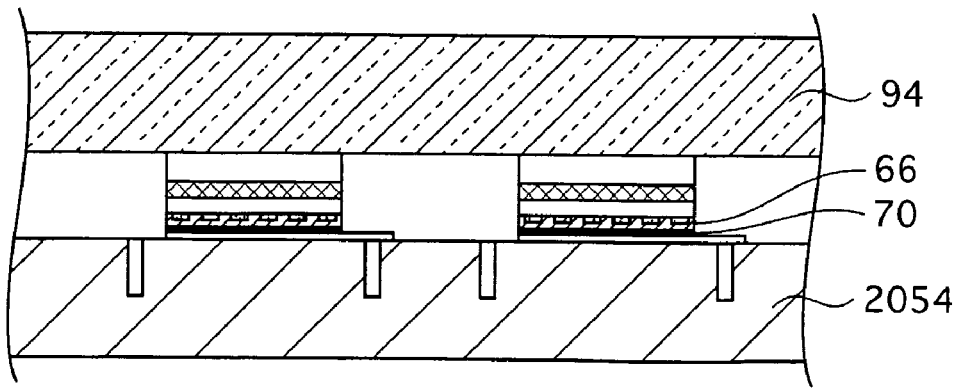

FIG. 14
STEP H2
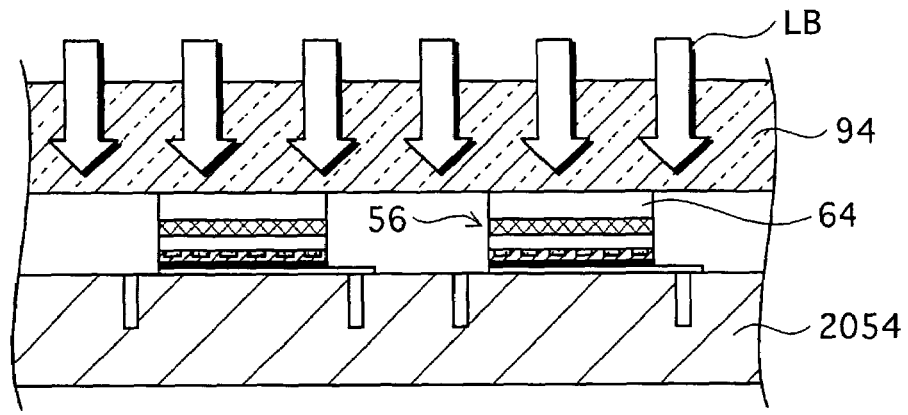
STEP I2
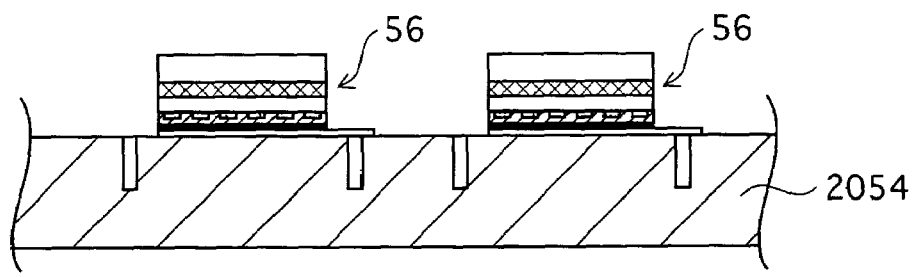
STEP J2
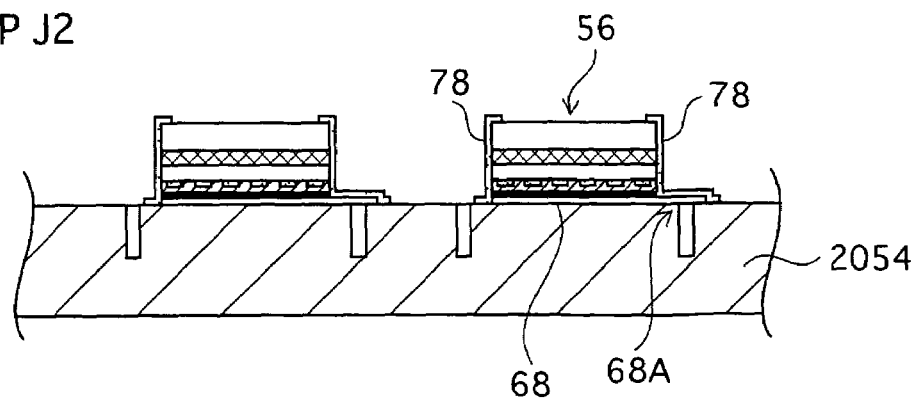

FIG.15
STEP K2
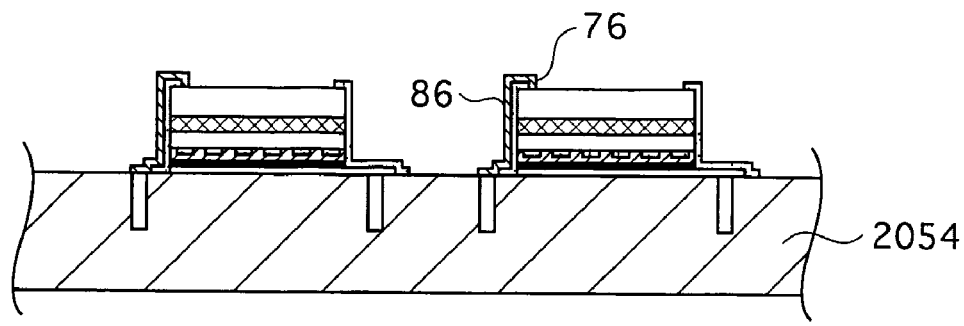
STEP L2
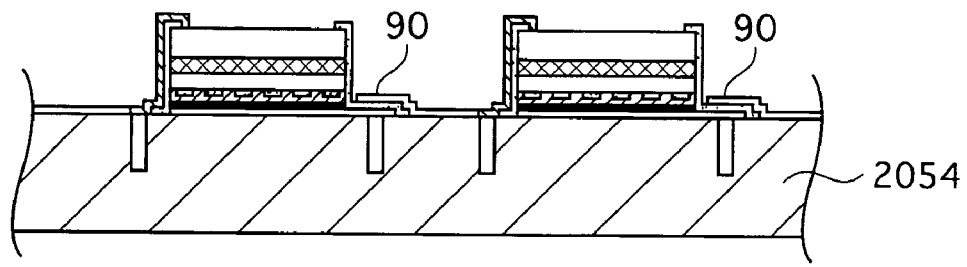
STEP M2
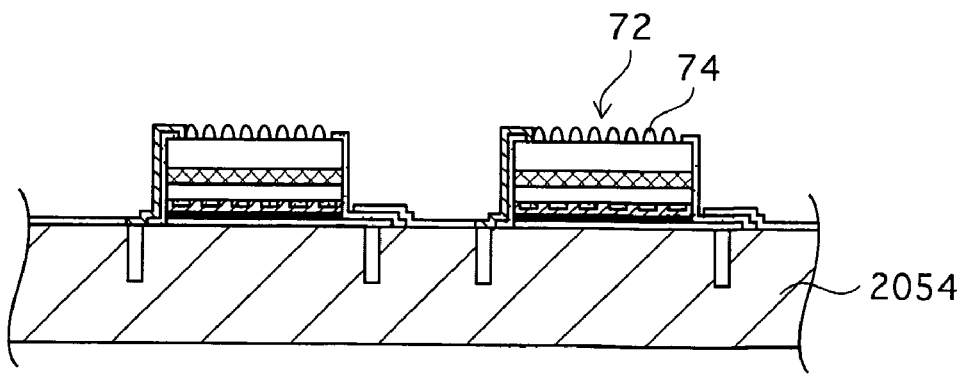

FIG.16
STEP N2
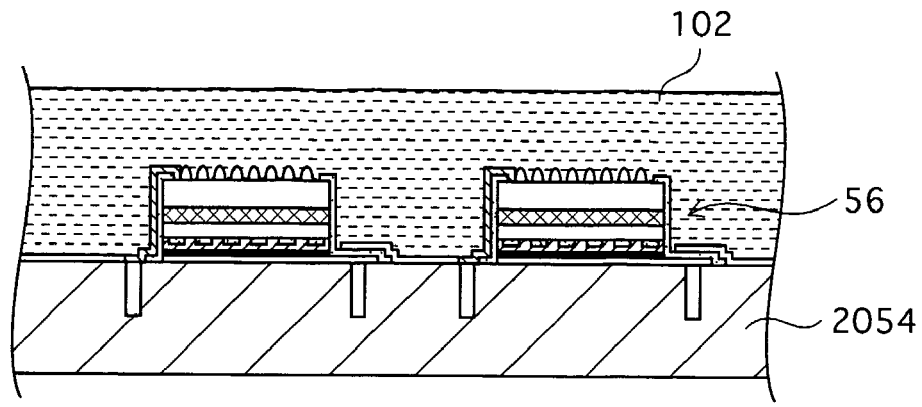
STEP O2
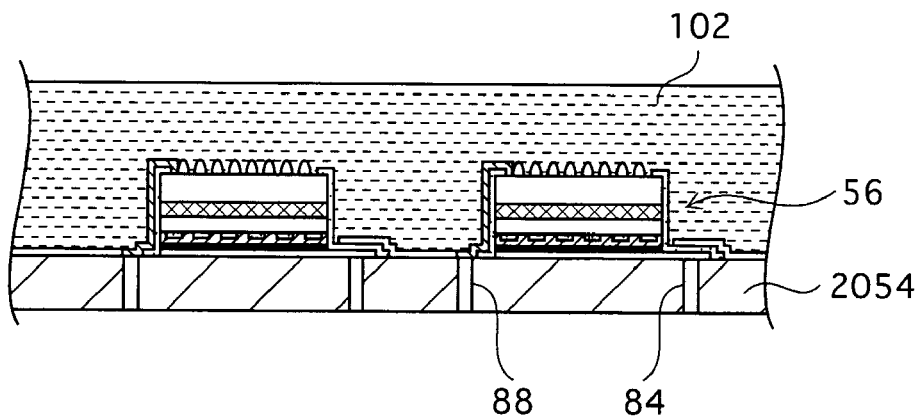
STEP P2
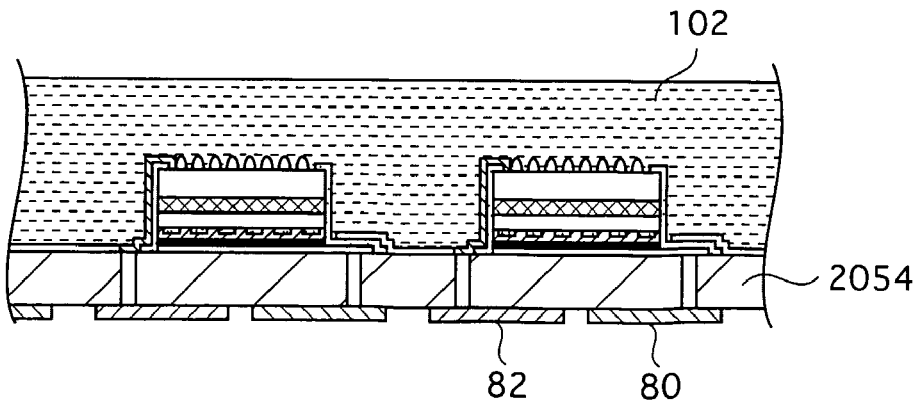

FIG.17
STEP Q2
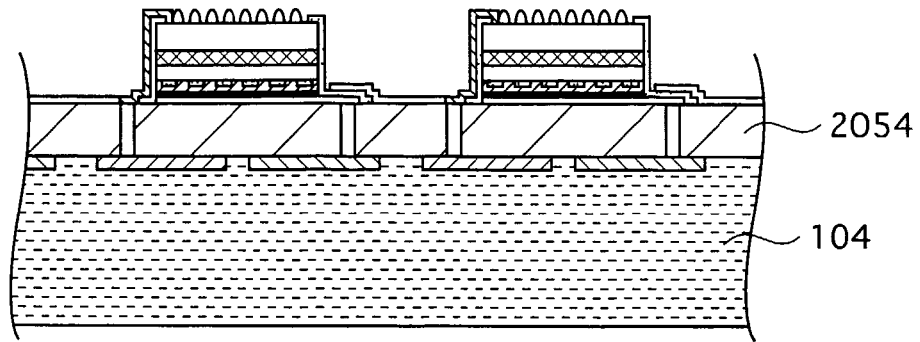
STEP R2
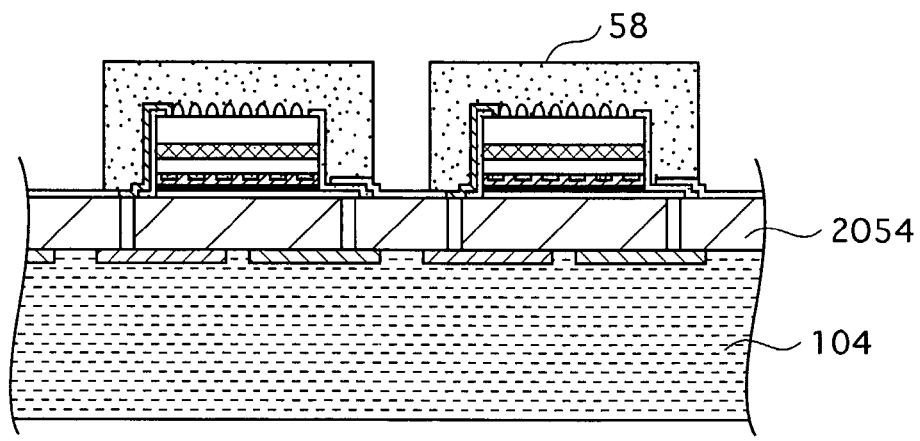
STEP S2
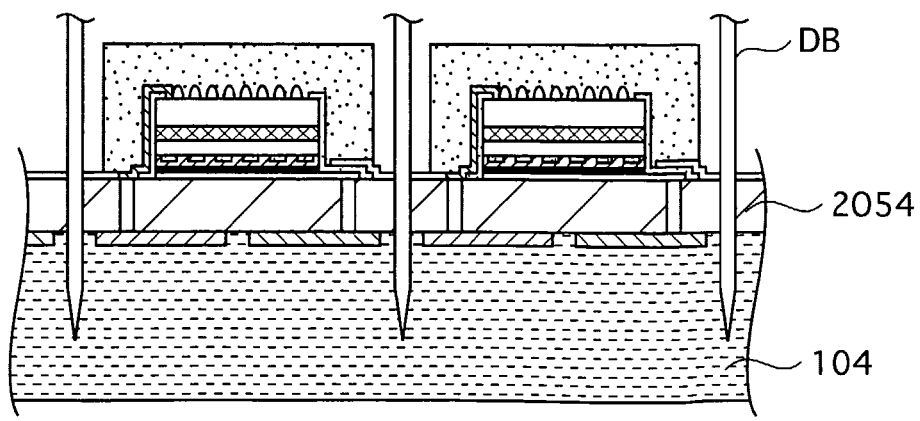

FIG. 30
STEP A3
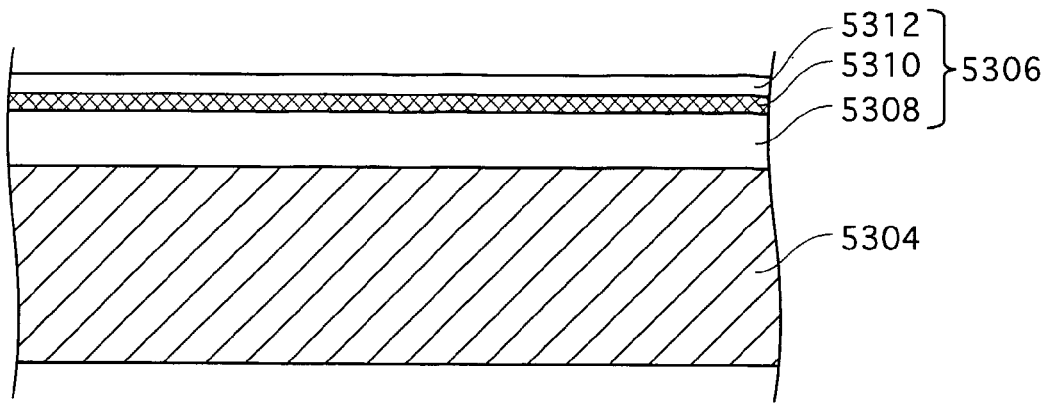
STEP B3
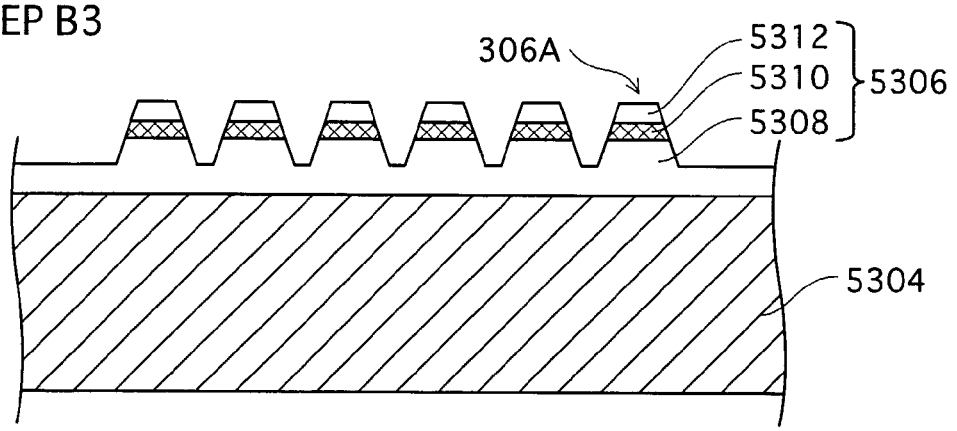
STEP C3
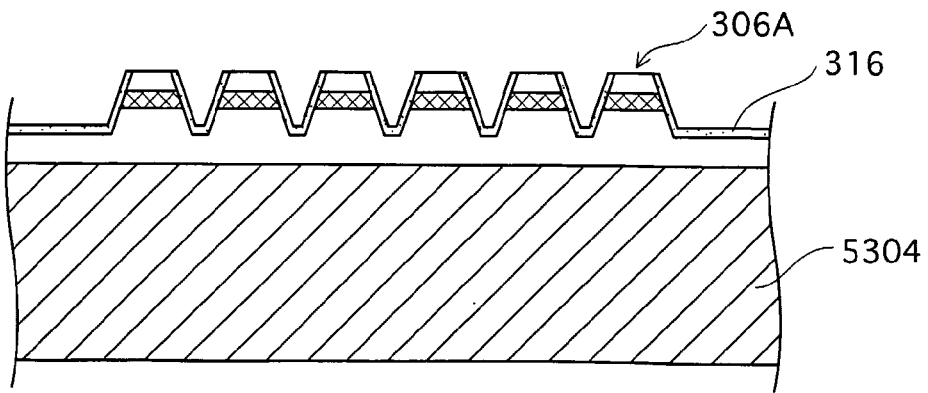

FIG.31
STEP D3
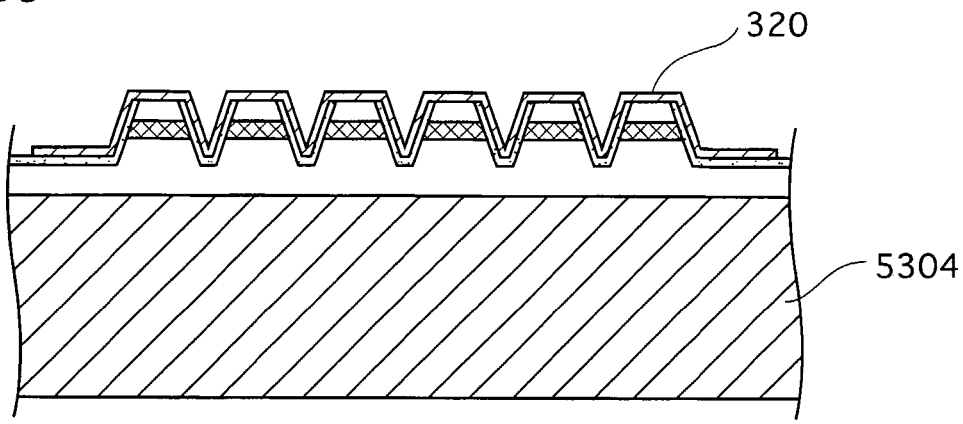
STEP E3
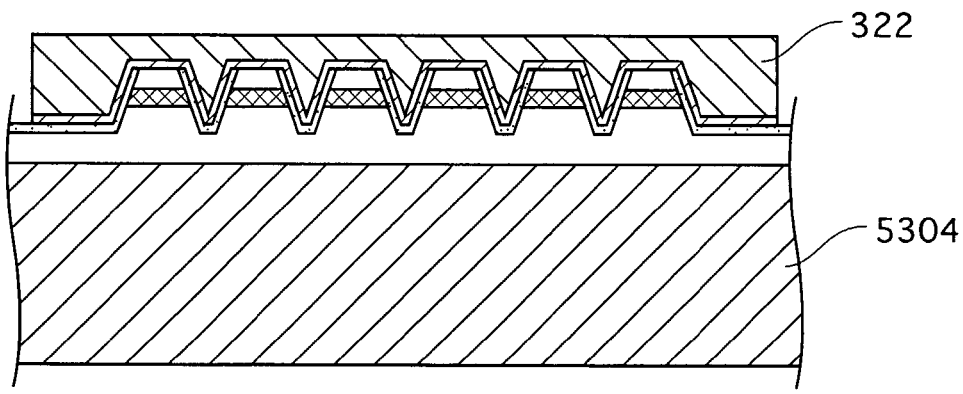
STEP F3
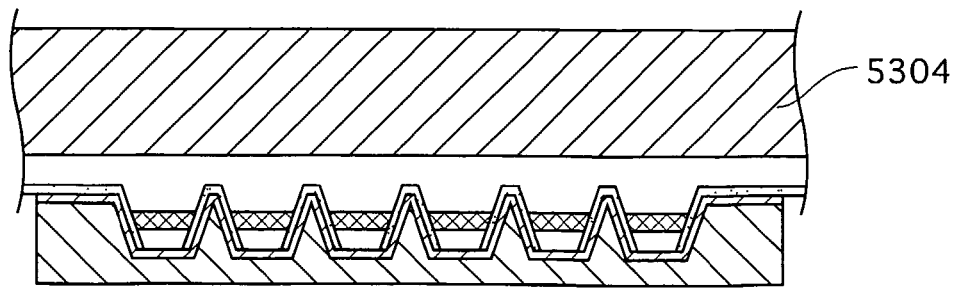

FIG.32
STEP G3
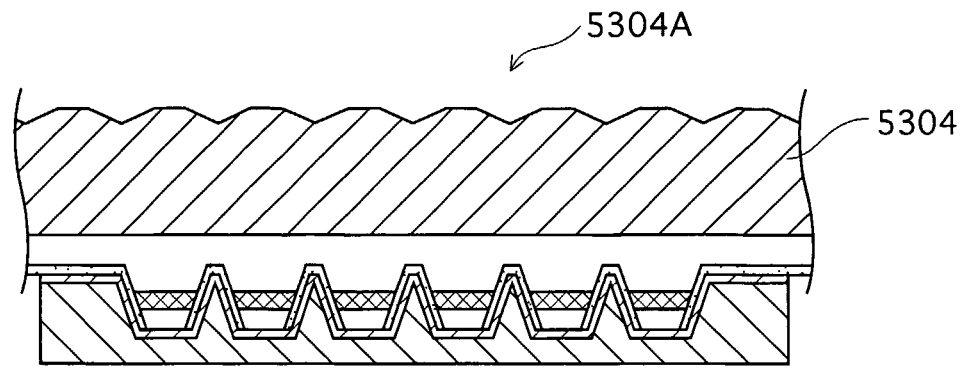
STEP H3
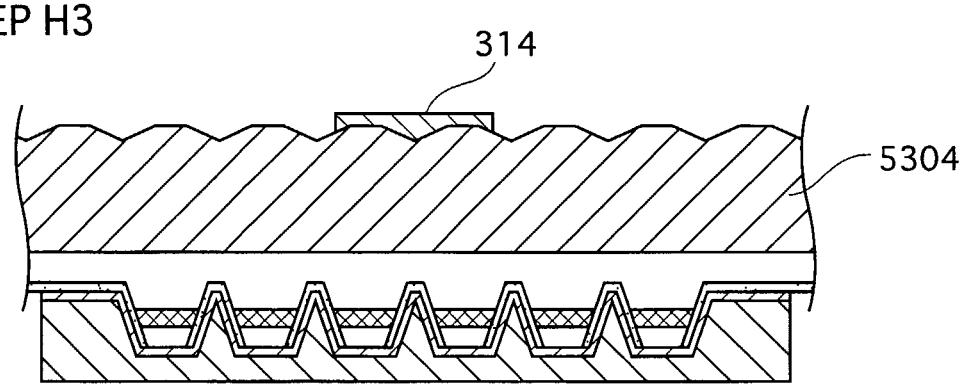
STEP I3
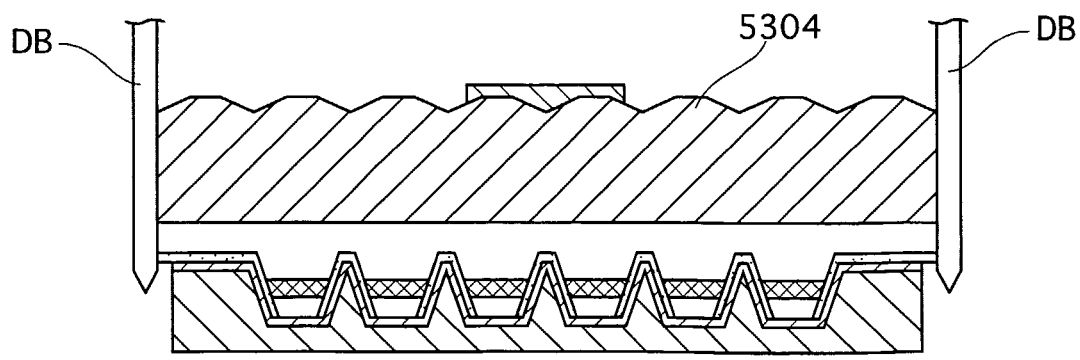

NITRIDE BASED LED WITH A P-TYPE INJECTION REGION

TECHNICAL FIELD

The present invention relates to a semiconductor light emitting device, a lighting module, a lighting device, a surface mounting device, and a display device. Especially, the present invention relates to a nitride semiconductor light emitting device having a quantum well emission layer.

BACKGROUND ART

Gallium nitride (GaN) semiconductors are III-V nitride semiconductors represented by a general formula $B_{1-x-y-z}Al_xGa_{1-x-y-z}In_yN_{1-v-w}As_vP_w$, where $0 \leq x \leq 1$, $0 \leq y \leq 1$, $0 \leq z \leq 1$, $0 \leq x+y+z \leq 1$, $0 \leq v \leq 1$, $0 \leq w \leq 1$, $0 \leq v+w \leq 1$ (generally denoted as BAlGaInNAsP). A light emitting diode (hereinafter "LED") is one known semiconductor light emitting device having a semiconductor multilayer structure each layer of which is made of a GaN semiconductor material. Such an LED emits light at a wide wavelength region from 200 nm to 1700 nm (from ultra-violet to infra-red), depending on the compositional ratios noted above. Especially, LEDs emitting blue light in a shorter wavelength range than blue-green light are now coming into wide use.

Ever increasing number of LEDs emitting blue light (blue LEDs) are widely used in electronic devices typified by mobile phones, in addition to white LEDs manufactured with blue LEDs in combination with phosphors. Furthermore, vigorous researches have been underway to use white LEDs for illumination purpose in view of its longevity superior to incandescent and halogen lamps. Currently, white LEDs are promising replacements for existing illumination sources.

In order for LEDs to be useable for a general illumination purpose, it is essential that the luminous efficiency be further improved. Generally, the luminous efficiency of LED is described by the internal quantum efficiency and the external quantum efficiency. The internal quantum efficiency is the ratio between the electric current injected into an emission layer and the amount of light produced within the emission layer. The internal quantum efficiency is proportional to the ratio of radiative recombination of electrons and positive holes. On the other hand, the external quantum efficiency is the ratio between the injection current and the amount of light extracted from the LED chip. In other words, the external quantum efficiency is the product of the internal quantum efficiency and the ratio of light emitted by the emission layer to light extracted from the LED chip (light extraction efficiency).

One basic LED has a junction structure of a p-type semiconductor layer, an emission layer, and an n-type semiconductor layer laminated in the stated order. The emission layer emits light in response to a current supplied from an n-electrode and a p-electrode formed on the respective semiconductor layers. It is important that the electrode provided on a light extraction surface does not obstruct light escaping from the LED. For example, when the p-semiconductor layer constitutes the light extraction surface, it is desirable that the p-electrode is provided at a corner of the main surface of the p-semiconductor layer in a manner of occupying a smallest possible area.

In the case of GaN semiconductor materials, it is generally difficult to manufacture a p-semiconductor layer having low resistance. With the electrodes provided as above are in sufficient to uniformly supply an electric current throughout the entire emission layer. As a result, the light emission takes place in the limited regions of the emission layer, such as directly under and in the vicinity of the electrodes. To address the above problem, one conventional technique provides a layer of transparent electrode on the entire surface of the p-semiconductor layer, and then provides a p-electrode on the transparent electrode (See JP Patent Application Publication No. 2003-110138). By the presence of the transparent electrode, an electric current supplied from the p-electrode spreads throughout the p-semiconductor layer and reaches the emission layer from the entire contacting surface. As a result, the luminance efficiency improves.

In another attempt made to improve the luminous efficiency, there is disclosed a quantum well structure, i.e. an emission layer that is made as thin as the wavelength of electron wave (See JP Patent Application Publication No. 11-330552). By employing a quantum well structure, the ratio of recombination of electrons and positive holes (radiative recombination) increases, and thus the luminous efficiency further improves.

Unfortunately, however, GaN based LEDs have the following problem, although LEDs employing a quantum well structure exhibit improved luminous efficiency than that would otherwise be.

Existing GaN semiconductor materials suffer from piezoelectric effects generated under stress induced due to the property inherent in the materials. The piezoelectric effects obstruct radiative recombination of electrons and holes, thereby decreasing the internal quantum efficiency. The mechanism of decrease will be briefly described below.

A quantum well structure improves the ratio of radiative recombination within the emission layer by confinement of electrons and positive holes (i.e. carriers) with an energy barrier. The existence probability of carriers in the well layer is obtained by a wave distribution function. The spatial overlap between electrons and positive holes (the probability existence of electrons and positive holes at the same locations) is proportional to the ratio of radiative recombination.

However, the electric field created by the piezoelectric effect scatters electrons and positive holes away toward mutually opposite ends of the well layer, thereby reducing the spatial overlap between the electrons and positive holes. This spatial separation of electrons and positive holes reduces the ratio of radiative recombination, thereby decreasing the luminous efficiency.

The piezoelectric effect can be canceled by increasing the carrier density in the well so as to cause the screening effect which compensates the internal electric field. Consequently, the spatial overlap between electrons and positive holes increases, and thus the ratio of radiative recombination increases. As a result, the internal quantum efficiency improves.

The carrier density increases with the increase of current injected to the emission layer. With the increase of current, however, it is inevitable that more heat is generated to elevate the temperature of LED chip. As a result, various problems are caused, such as deterioration of property of the LED chip itself or of resin normally provided to cover the LED chip.

In view of the above problems, the present invention aims to provide a semiconductor light emitting device with improved luminous efficiency, while maintaining the injected current within a permissible range. The present invention also aims to provide a lighting module, a lighting device, a surface mounting device, and a display device all of which employs the above semiconductor light emitting device.

DISCLOSURE OF THE INVENTION

A semiconductor light emitting device according to the present invention includes: a semiconductor multilayer structure composed of a p-semiconductor layer, a quantum well emission layer, and an n-semiconductor layer each made of a nitride semiconductor and laminated in the stated order, light from the emission layer exiting through the n-semiconductor layer; and a p-electrode facing and in ohmic contact with the p-semiconductor layer. The p-semiconductor layer has an intensive-injection region into which an electric current from the p-electrode is injected more intensively than another region, and the intensive-injection region spans substantially across an entire surface of the p-semiconductor layer. With the stated structure, the electric current from the p-electrode is intensively injected into the p-semiconductor layer. That is to say, the current supplied to the p-electrode is injected to the p-semiconductor layer and then to the quantum well emission layer, with increased density (current density). Accordingly, the current density (carrier density) in the emission layer is increased to cause the screening effect, which cancels out the piezoelectric effect. As a result, the ratio of electron-hole recombination increases, and thus emission light increases. In addition, since the intensive-injection region spans substantially across the entire surface of the p-semiconductor layer, emission light increases substantially uniformly throughout the emission layer. Thus, light emitted by the overall emission layer increases. As a result, the luminous efficiency improves without requiring an increase of the drive current (the total amount of current injected to the emission layer).

Here, the intensive-injection region may be realized by a contact structure of the p-electrode with the semiconductor layer. In this case, the p-electrode may have, on a surface facing toward the p-semiconductor layer, a plurality of projections or depressions that are distributed substantially uniformly, and the p-electrode may be in contact with the p-semiconductor layer at a top surface thereof. With the stated structure, on supply of a drive current to the p-electrode, the current concentrates at the top surface of the p-electrode, thereby increasing its density (current density). With the increased density, the current is injected to the p-semiconductor layer and sequentially to the emission layer. Consequently, the current density (carrier density) in the emission layer is higher in a region corresponding laterally to the top surface of the p-electrode. In the corresponding region of the emission layer, the screening effect is caused to cancel the piezoelectric effect, thereby increasing the radiative recombination ratio. Since the top surface of the p-electrode spans substantially across the entire surface facing toward the p-semiconductor layer, emission light increases substantially uniformly throughout the emission layer. Thus, light emitted by the overall emission layer increases. Consequently, the luminous efficiency improves without requiring an increase of the drive current (the amount of current injected to the emission layer).

Alternatively, the intensive-injection region may be realized by a contact structure of the p-semiconductor layer with the p-electrode. In this case, the p-semiconductor layer may have, on a surface facing toward the p-electrode, a plurality of projections or depressions that are distributed uniformly, and the semiconductor multilayer structure may be in contact with the p-electrode at a top surface of the p-semiconductor layer. With the stated structure, on supply of a drive current to the p-electrode, the current is injected from the p-electrode to the semiconductor multilayer structure through the top surface of the p-semiconductor layer. Thus, the current is made to converge at the top surface of the p-semiconductor layer, thereby increasing its density (current density). With the increased density, the injected current is successively injected into the emission layer. As a result, the current density (carrier density) in the emission layer is higher in a region corresponding laterally to the top surface of the p-semiconductor layer. In the region of the emission layer, the screening effect is caused to cancel the piezoelectric effect, thereby increasing the radiative recombination ratio, and thus increasing emission light. Since the top surface of the p-semiconductor layer spans substantially across its entire surface, emission light increases substantially uniformly throughout the emission layer. Thus, light emitted by the overall emission layer increases. Consequently, the luminous efficiency improves without requiring an increase of the drive current (the amount of current injected to the emission layer).

A lighting module, a lighting device, a surface mounting device, and a display device according to the present invention each employ semiconductor light emitting devices as stated above having high luminous efficiency. Consequently, improved luminous efficiency and/or downsize of the respective modules and devices are achieved.

Furthermore, owing to its higher light efficiency, the semiconductor light emitting device produces the same level of light output with significantly less heat, in comparison with a conventional device. Consequently, the longevity of the semiconductor light emitting device is increased. Furthermore, since it is possibly to further simplify a heat dissipation mechanism, the lighting device, the surface mounting device, and the display device can be reduced both in size (thickness) and manufacturing cost.

BRIEF DESCRIPTION OF THE DRAWINGS

FIG. 2 is a graph showing relation between relative luminous levels and injection-location current densities, measured on LEDs having p-electrodes with different opening ratios;

FIG. 4 is a view of manufacturing steps of the LED chip according to the embodiment 1;

FIG. 5 is a view of manufacturing steps of the LED chip according to the embodiment 1;

FIG. 6 is a view of manufacturing steps of the LED chip according to the embodiment 1;

FIG. 7 is of manufacturing steps of the LED chip according to the embodiment 1;

FIG. 10 is a view of manufacturing steps of the LED chip according to the embodiment 2;

FIG. 13 is a view of manufacturing steps of the LED chip according to the embodiment 2;

FIG. 14 is a view of manufacturing steps of the LED chip according to the embodiment 2;

FIG. 15 is a view of manufacturing steps of the LED chip according to the embodiment 2;

FIG. 16 is a view of manufacturing steps of the LED chip according to the embodiment 2;

FIG. 17 is a view of manufacturing steps of the LED chip according to the embodiment 2;

FIG. 30 is a view of manufacturing steps of the LED chip according to the embodiment 5;

FIG. 31 is a view of manufacturing steps of the LED chip according to the embodiment 5;

FIG. 32 is a view of manufacturing steps of the LED chip according to the embodiment 5;

BEST MODE FOR CARRYING OUT THE INVENTION

The following describes embodiments of the present invention, with reference to the accompanying drawings.

Embodiment 1

Figure 1A:
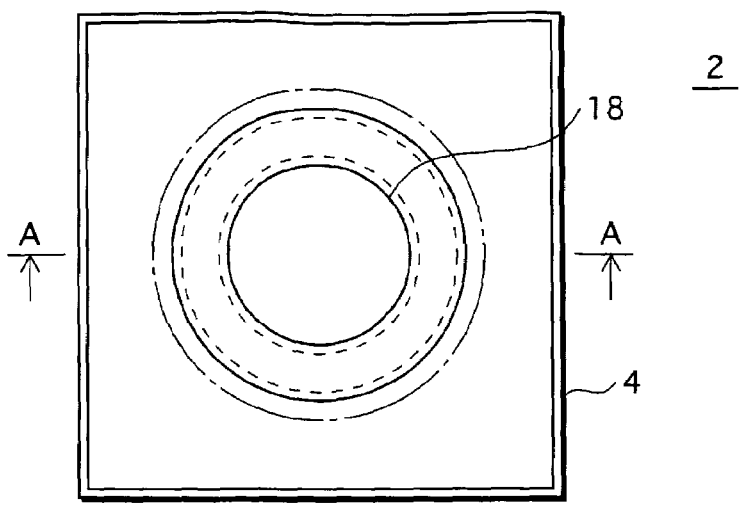
FIG. 1 are views of an LED chip according an embodiment 1 of the present invention.
Figure 1B:
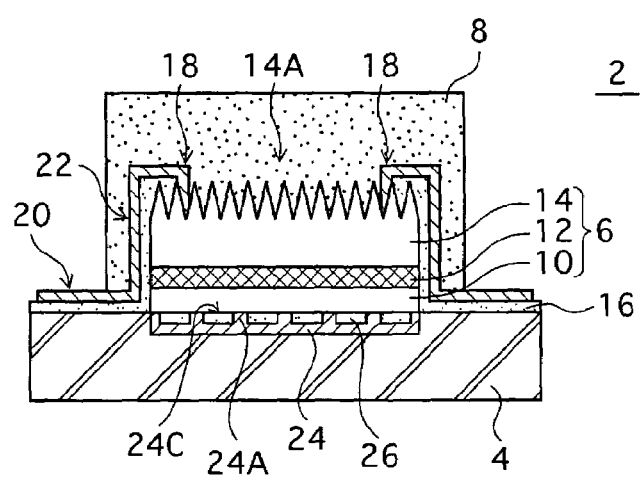

FIG. 1A is a plan view showing the schematic structure of a white LED chip 2 (hereinafter, simply "LED chip 2"), which is a semiconductor light emitting device. FIG. 1B is a sectional view taken along the line A-A of FIG. 1A. In FIG. 1A, a later-described phosphor film 8 is removed (the phosphor film 8 is shown in phantom in dot-dash lines). Note that in FIG. 1 as well as in the other figures, components are not shown on the same scale.

As shown in FIGS. 1A and 1B, the LED chip 2 is composed of: a metal substrate 4 as a base substrate; a disk-shaped (columnar) semiconductor multilayer structure 6 disposed on the metal substrate 4; and the phosphor film 8 covering the upper and side surfaces of the semiconductor multilayer structure 6. The metal substrate 4 is made of gold (Au). The dimensions of the entire LED chip 2 are as follows: the metal substrate 4 is a 500 μm square and 50 μm thick, and the phosphor film 8 is 460 μm in diameter and 200 μm in thickness.

The semiconductor multilayer structure 6 has a quantum well structure composed of: a p-GaN layer 10 (200 nm thick), which is a p-semiconductor layer; an InGaN/GaN multiple quantum well (MQW) emission layer 12 (50 nm thick); an n-GaN layer 14 (3 μm thick), which is an n-semiconductor layer, laminated over the metal substrate 4 in the stated order. The semiconductor multilayer structure 6 is 400 μm in diameter.

An insulating film 16 made of silicon nitride is disposed to cover the entire side surface and part of the upper surface (light extraction surface) of the semiconductor multilayer structure 6. The insulating film 16 also covers the exposed upper surface region of the metal substrate 4.

On the outer main surface of the n-GaN layer 14, a ring-shaped n-electrode 18 is disposed along its periphery. The n-electrode 18 is composed of Ti/Pt/Au films laminated in the stated order. This arrangement of the n-GaN layer 14 is to uniformly inject an electric current to the entire emission layer 12. On the insulating film 116 that is in turn laminated on the metal substrate 4, a conductive film is disposed by laminating Ti/Pt/Au films in the stated order. This conductive film constitutes a cathode supply terminal 20. The n-electrode 18 is connected to the cathode supply terminal 20 via a wire 22. The wire 22 is a conductor made of a stack of Ti/Pt/Au films. The n-electrode end of the wire 22 extends from the n-electrode 18 laterally beyond the edge of outer main surface of the n-GaN layer 14 (light extraction surface). Note that the n-GaN layer 14 has a plurality of cones upwardly projecting from the upper surface (light extraction surface) thereof, thereby defining a projection-depression surface profile 14A. This projection-depression surface profile 14A serves to improve the light extraction efficiency.

Figure 1C:
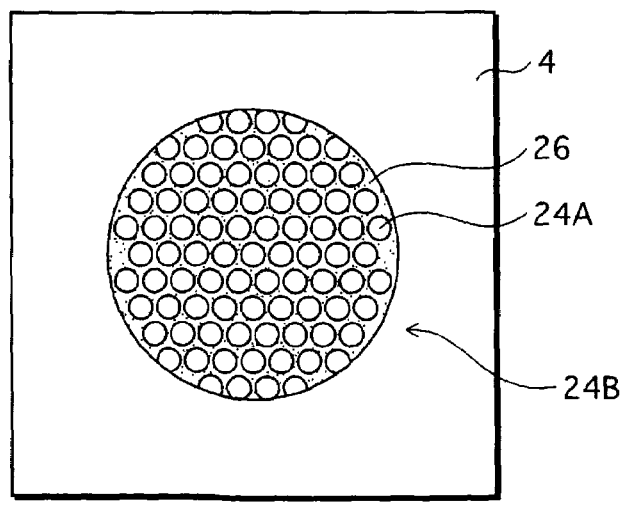

A p-electrode 24 is disposed so as to face substantially entirely of the undersurface of the p-GaN layer 10 (emission layer 12). FIG. 1C is a plan view of the LED chip 2 from which the p-GaN layer 10 and the layers above are removed. As shown in FIGS. 1B and 1C, the p-electrode 24 has a plurality of substantially uniformly distributed columnar projections 24A each of which is about 10 μm in diameter, thereby defining a projection-depression surface profile 24B. The top surface of each projection 24A is in contact with the undersurface of the p-GaN layer 10. That is, the p-GaN layer 10 in contact with the p-electrode 24 is electrically connected with the metal substrate 4 via the p-electrode 24. Thus, the metal substrate 4 acts as an anode supply terminal 4. Note that the p-electrode 24 is made of Rh/Pt/Au films laminated over the p-GaN layer 10 in the stated order, and reflects light from the emission layer 12 towards the n-GaN layer 14 at high reflectivity. A depression 24C in the projection-depression surface profile 24B are filled with an insulator 26 made of $Ta_2O_5$. Note, however, that it is applicable to leave the depression 24C as a clearance, rather than filling with the insulator 26.

The phosphor film 8 has a profile as if it is received by the metal substrate 4, and is made of a transparent resin such as silicone in which phosphor particles and fine particles of metal oxide such as $SiO_2$ are dispersed. Specifically, the phosphor particles are of green-yellow phosphor such as (Ba, Sr)$_2$SiO$_4$:Eu$^{2+}$ or Y$_3$(Al, Ga)$_5$O$_{12}$:Ce$^{3+}$, and red phosphor such as Sr$_2$Si$_5$N$_8$:Eu$^{2+}$ or (Ca, Sr)S: Eu$^{2+}$. It is applicable to use an epoxy resin as the transparent resin. It is also applicable to replace the transparent resin with a glass material made of a metal alkoxide as a starting material or a polymer ceramic precursor.

On application of an electric current to the LED chip 2 having the above structure via the anode supply terminal 4 and the cathode supply terminal 20, the emission layer 12 emits blue light at 460 nm. Part of the blue light emitted from the emission layer 12 travels toward the p-GaN layer 10 and is reflected toward the n-GaN layer 14 by the p-electrode 24, which is a high-reflective electrode. Owing to the effect of the projection-depression surface profile 14A, light directed to the n-GaN layer 14 passes through without being reflected, and then reaches the phosphor film 8 where part of the light is absorbed and converted to yellow-green light and red light. The blue, yellow-green, and red light is all mixed so that the phosphor film 8 emits white light.

As described above, the LED chip 2 is provided with the high-reflective p-electrode 24 facing substantially entirely of the surface of the p-GaN layer 10, and emission light is made to exit from the n-GaN layer 14. With this structure, in addition to light emitted from the emission layer 12 directly toward the n-GaN layer 14, light emitted initially toward the p-GaN layer 10 is extracted after being reflected by the p-electrode 24. Thus, the LED chip 2 ensures an excellent luminous efficiency.

Furthermore, as described above, the p-electrode 24 has the projection-depression surface profile facing toward the p-GaN layer 10, and is in contact with the p-GaN layer 10 at the top surfaces of the projections. This structure also largely contributes to improvement of the luminous efficiency, without increasing the amount of drive current. Hereinafter, a description is given to why the luminous efficiency improves.

As mentioned earlier, it is known that the following problems (i) and (ii) can solved. The problem (i) is a decrease of luminous efficiency owing to the fact that the p-GaN layer is highly resistant. This problem can be solved for example by laminating a transparent electrode on the entire surface of p-semiconductor layer (hereinafter, the electrode laminated on the entire surface of the p-semiconductor layer is referred to as "entire-surface contact electrode"). The problem (ii) is a decrease of luminous efficiency pertinent to an LED employing a quantum well structure, due to the piezoelectric effect producing an electric field in the quantum well layer. This problem can be solved by supplying a larger electric current via the entire-surface contact electrode, so that the adverse effect of the electric field is reduced and thus the luminous efficiency improves. Unfortunately, however, by simply supplying a larger electric current, there remain problems associated with the heat generated by the overall chip.

According to the present embodiment, the p-electrode 24 is disposed so as to face substantially entirely of the surface of the p-GaN layer 10 (p-semiconductor layer). Yet, the p-electrode 24 makes electric contact with the p-GaN layer 10 only at the top surfaces of the uniformly districted projections. As a result, the electric current (drive current) supplied to the p-electrode 24 converges locally to the projections to increase the density (current density). The electric current is injected to the p-GaN layer 10 and then to the emission layer 12, while remaining converged (because the p-GaN layer 10 has a high electrical resistance, the electric current hardly spreads in the surface direction). Consequently, the current density (carrier density) in the emission layer 12 is higher at locations corresponding, to the projections. At those locations, a screening effect is caused, so that the piezoelectric effect is canceled out, thereby increasing the ratio of radiative recombination.

Here, it is preferable that the thickness of the p-GaN layer 10 is smaller than the spacing between adjacent projections 24A (the width of any region of the depression 24C that appears as one recess in FIG. 1B) of the p-electrode 24. In other words, it is preferable that the relation t<d is satisfied, where t is the thickness of the p-GaN layer 24 and d is the width of the depression 24C (the width of the spacing). With this arrangement, an electric current supplied from the top surfaces of the projections 24A to the p-GaN layer 10 flows directly upward to the emission layer 12, with no substantial divergence in the surface direction. It is more preferable that the relation 5t≦d is satisfied. It is even more preferable that the relation 10t≦d is satisfied. In terms of a specific thickness size of the GaN layer 24, it is preferable that t≦1 μm is satisfied. It is more preferable that t≦0.5 μm is satisfied. It is even more preferable that t≦0.2 μm is satisfied. Note that the above description regarding the thickness of the p-GaN layer also holds in later-described embodiments 2 and 3.

As stated above, the projections of the p-electrode 24 are distributed substantially uniformly in relation to the p-GaN layer 10 (emission layer 12). Thus, the amount of light emitted by the emission layer 12 increases uniformly over the entire emission layer 12.

The inventor of the present application conducted an experiment to confirm the effect described above. Prior to the experiment, the inventor conducted another experiment and confirmed that the upper limit of supply current to the LED chip 2 having the above size (main surface of the emission layer: 0.1256 mm$^2$) was desirably about 63 mA in view of deterioration by heat. Specifically, it was confirmed that supply of electric current exceeding 63 mA caused the LED to come to the end of its operating life before 10,000 hours, although the minimum desirable operating life hours were 10,000 for LEDs for illumination use. Note that the average current density calculated by dividing the drive current 63 mA by the main surface area of the emission layer (p-GaN layer) is about 50 A/cm$^2$. That is to say, the sufficient operating life hours are likely to be ensured with the drive current that results in the average current density not exceeding 50 A/cm$^2$, irrespective of the chip size (the area of emission layer).

Subsequently, four LED chips were so prepared that the p-electrode of each chip had projections with different spacing densities. The chips were then operated with the drive current of 63 mA to measure their luminance levels. Specifically, the spacing densities were made to mutually differ by providing different numbers of projections. The levels of spacing densities are expressed in terms of opening ratios. The opening ratios are the ratio of the contacting area of the p-electrode (the total area of the top surfaces of projections) to the main surface area of the p-GaN layer (emission layer). The opening ratio of "1" means that the p-electrode is an entire-surface contact electrode (i.e. a conventional p-electrode). The smaller the opening ratio is, the sparser the projections are. The opening ratios may be adjusted by varying the top surface area of each projection (the size of projections), rather than the number of projections.

The opening ratios of four LED chips used in the experiment were "1", "0.75", "0.5", and "0.25". Further, no phosphor film was provided to the LED chips. Regarding each of the four LEDs, blue light emitted from the upper surface of the n-GaN layer was measured at a position 3 cm above the n-GaN layer.

FIG. 2 shows a graph of the experimental results. In FIG. 2, the horizontal axis of the graph represents the opening ratios, whereas the left vertical axis represents the relative luminance levels of the LEDs. The relative luminance levels are values calculated by dividing the respective measurements of luminance by the measurement of luminance of the LED whose opening ratio is "1". The right vertical axis represents the current densities [A/cm$^2$] calculated by dividing the drive current (63 mA) by the surface area where the p-electrode and p-GaN layer were in contact. Hereinafter, this current density is referred to as "injection-location current density" as it represents the current density in a region of the semiconductor layer where the electric current is injected.

As apparent from FIG. 2, when the opening ratio is smaller than "1", i.e. the injection-location current density is greater, the relative luminance is higher. This is ascribable to the fact that the increase in the current density (carrier density) in the emission layer caused the screening effect, which canceled out the piezoelectric effect. Consequently, the ratio of radiative recombination increased and thus the luminous efficiency improved.

The smaller the opening ratio is, the more the relative luminance improves. Yet, after the opening ratio is below 0.5, the relative luminance peaks out at about 1.5 and substantially stays flat at that level. When the opening ratio is 0.5, the injection-location current density is about 100 A/cm$^2$. That is, for the LED chip to exhibit the maximum relative luminance, the injection-location current density needs to be at least 100 A/cm$^2$. In other words, the p-electrode needs to be formed to have a projection-depression surface profile with such an opening ratio that results in the injection-location current density not below 100 A/cm$^2$. It goes without saying that the upper limit of opening ratio resulting in the injection-location current density of 100 A/cm$^2$ is not necessarily the above-mentioned value of 0.5. It is because the injection-location current density varies depending on the drive current (average current density). Yet, the highest average current density is limited to 50 A/cm$^2$ in view of possible adverse effects by heat. Note that the above description regarding the upper limit on the average current density (i.e. 50 A/cm$^2$) and the minimum injection-location current density (i.e. 100 A/cm$^2$) also holds in later-described embodiments 5 and 6.

The inventor of the present application further confirmed the effect of distributing the contact regions of the p-electrode 24 with the p-GaN layer 10 (i.e. projections of the p-electrode 24). For comparison purposes, the following semiconductor light emitting devices (hereinafter, "comparative examples") were prepared each with a p-electrode having a single region in contact with a p-GaN layer. Specifically, the comparative examples were prepared with different contact-region ratios (i.e. ratios under an identical concept with the opening ratios) of "0.75", "0.5", and "0.25" to measure their respective luminance levels. Each comparative example had a circular contact region, and the contact-region ratio was adjusted by the size of circle.

Figure 3:
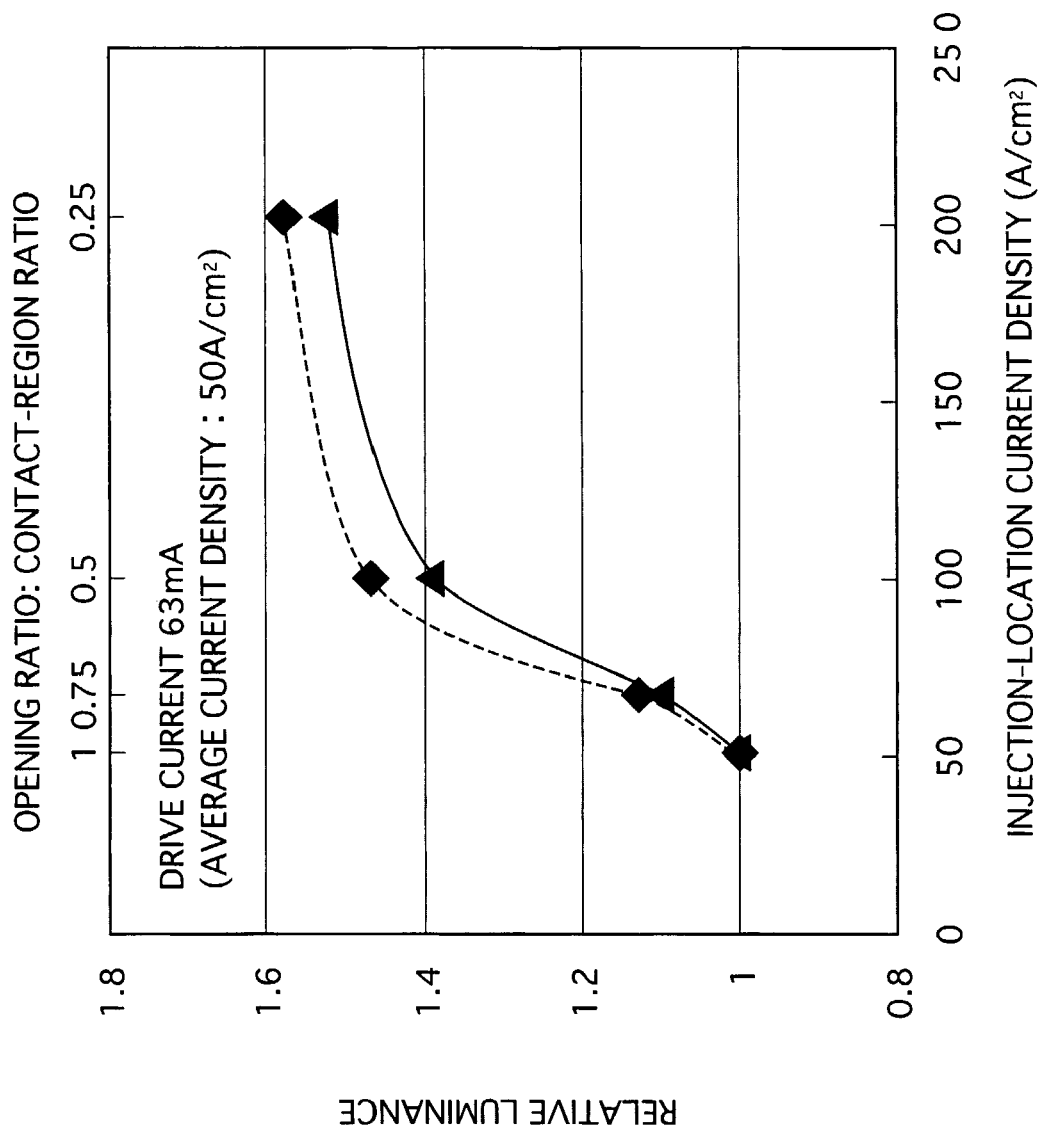
FIG. 3 is a graph showing relation between relative luminous levels and injection-location current densities, measured on LEDs having p-electrodes contacting with p-GaN layers either at a single location or at plurality of locations.

The measurements are shown in FIG. 3 as a line graph with a solid line plotted with black delta symbols "▲". For comparison, the graph also shows a line plotted with black rhombus symbols "♦", expressing the measurements of the semiconductor light emitting device according to the present embodiment, which are also shown in the doted lines in FIG. 2. Note that the graphs in FIGS. 2 and 3 show the same measurements although the formats are different.

As FIG. 3 clarifies, similarly to the semiconductor light emitting device of the present embodiment, the comparative examples exhibited higher luminance as the injection-location current density became higher. Yet, the difference between the present embodiment and the comparative examples are notable as the current density approaches 100 A/cm$^2$. The graph shows that the luminance of comparative examples does not improve as much as that of the semiconductor light emitting device of the present embodiment.

This may be ascribable to the following reason.

The luminance of LEDs becomes lower with increase in the temperature of heat generated by the LEDs. In the case of comparative examples, it is believed that the heat was generated locally at one location and thus elevated the temperature higher than that of the LED of present embodiment. As a result, it is belied that the comparative examples underwent greater heat degradation in luminance than the LED of present embodiment. In other words, since the LED of the present embodiment generates heat at a plurality of distributed locations, heat generated at those heating locations may more easily escape to non-heating locations (i.e. regions of the semiconductor multilayer structure where the current density is low), thereby lowering the overall temperature of the generated heat. As a result, drop of the luminance is suppressed.

It is described above that as long as the average current density is the same, all LED chips undergo thermal degradation substantially at the same rate. Yet, this holds on precondition that the heating locations are uniformly distributed. That is, the above comparative examples are believed to have shorter operating hours than the LED of the present embodiment, despite the same average current density.

In addition, the LED chip 2 of the present embodiment has the following effect.

The insulator 26 fills the depression 24C in the surface profile 24B of the p-electrode 24, and the insulator 26 is made of Ta$_2$O$_5$ that is transparent to blue light form the emission layer 12 (and is transparent to entire visible light). Thus, the depression 24C reflects incident light on the surface thereof toward the n-GaN layer 14. In addition, the refractive index of Ta$_2$O$_5$ is relatively closer to that of GaN. Accordingly, losses of light due to reflection and adsorption are small, which is another factor improving the luminous efficiency. Note that the insulating material used to fill the depression 24C is not limited to Ta$_2$O$_5$. Examples of alternative insulating materials include ZrO$_2$, ZnO, Y$_2$O$_3$, TiO$_2$, and SrTiO$_3$, which are know to have a refractive index substantially equal to the refractive index of GaN and transparent to visible light. Alternatively, it is applicable to use any of silicon oxide and silicon nitride, which are generally used as insulating materials of semiconductor devices. Alternatively, the above-mentioned insulating materials may be used in combination, so that it is possible to optimize the refractive index. By laminating those insulating materials in multiple layers to fill the depression, the resulting insulator may serve as a distributed Bragg reflector.

Note that the insulator (or insulating material) used in this specification and appended claims refers to a material having a resistance of 10$^2$ Ω·cm or higher, preferably of 10$^5$ Ω·cm or higher, and more preferably of 10$^8$ Ω·cm or higher. Thus, a material generally referred to as a high resistance material is included, and a GaN-based, high resistance semiconductor material is one example.

Furthermore, since the LED chip 2 is without a sapphire substrate disposed over the light extraction surface of the semiconductor multilayer structure 6, it is ensured that the light is extracted from the semiconductor multilayer structure 6 with high efficiency.

Besides the above-stated effects relating to the luminous efficiency, the LED chip 2 achieves the following effect.

The LED chip 2 is provided with the p-electrode 24 facing substantially entirely of the surface of the p-GaN layer. The p-electrode 24 injects an electric current through the projections 24A that are distributed substantially uniformly. Thus, it is ensured that the electric current is injected throughout the semiconductor multilayer structure 6 (emission layer 12), so that the operating voltage can be reduced.

Since the LED chip 2 is structured to allow the heat generated mainly in the emission layer 12 to be dissipated into a later-described mounting substrate 12 (ceramic substrate 202, see FIG. 26) through the metal substrate 4 having high thermal conductivity. This is another factor suppressing the emission layer 12 from overheating, and thus realizing a high-power and long-life LED chip (semiconductor light emitting device). Further, the embodiment described below provides an LED chip without any obstruct such as a bonding wire disposed on the light extraction surface. Thus, it is ensured that shadowless light is emitted. Still further, since no insulating substrate such as a sapphire substrate is included, the electrostatic withstand voltage improves.

As described above, the LED chip 2 has the semiconductor multilayer structure that is about 3 μm thick, whereas the phosphor film has a sufficient thickness of 200 μm. Furthermore, the phosphor film is also provided on the lateral peripheral surface of the semiconductor multilayer structure. In other words, the phosphor film that is substantially uniform in thickness is disposed around the semiconductor multilayer structure. This arrangement ensures that white light is produced almost without color variations resulting from uneven thickness of the phosphor film.

The LED chip 2 has the semiconductor multilayer structure 6 including the emission layer 12 that is substantially in the shape of a disc (column). In addition, the phosphor film 8 is disposed in substantially uniform thickness on the semiconductor multilayer structure 12. Consequently, the LED chip 2 emits light that will produce a substantially circular spot. Thus, the LED chip 2 is suitable as an illumination light source.

The LED chip 2 has a metal substrate (Au plating) that is sufficiently thick for supporting the semiconductor multilayer structure. In addition, the phosphor film 8 also supports the semiconductor multilayer structure. This arrangement ensures easy handling of the LED chip 2.

With reference to FIGS. 4-7, a description is given to a method of manufacturing an LED chip having the above structure. In FIGS. 4-7, materials of the components of the LED chip 2 are denoted by reference numbers in the one thousands and its last two digits correspond to the reference numbers denoting the respective LED chip components.

First, as shown in FIG. 4, the following layers are epitaxially grown by MOCVD (Metal Organic Chemical Vapor Deposition) method over a sapphire substrate 28 which is 2-inch in diameter. That is, a GaN buffer layer (not illustrated), an n-GaN layer 1014, an InGaN/GaN MQW emission layer 1012, a p-GaN layer 1010 are laminated in the stated order [Step A1].

Next, a $Ta_2O_5$ film 1026 is laminated by sputtering in order to form the insulator 26 (see FIG. 1). Prior to the lamination, a mask pattern (not illustrated) is provided to cover regions of the p-GaN layer 1010 where the insulator 26 should not be formed. The mask pattern is removed after laminating the $Ta_2O_5$ film 1026, thereby forming the insulator 26 covering desired regions of the p-GaN layer 1010 [Step B1]. Alternatively, the $Ta_2O_5$ film 1026 may be laminated first and a mask pattern next, so that unnecessary regions of $Ta_2O_5$ film 1026 is removed by etching.

Next, a stack of Rh/Pt/Au films 1024 is formed in the stated order by, for example, electron beam evaporation [Step C1]. Subsequently, an Au plating 1004 is formed in a thickness of 50 μm [Step D1].

Next, steps of removing the sapphire substrate 28 are performed. First, a polymeric film 30 such as a Teflon sheet is attached to the Au plating 1004 [Step E1]. The polymeric film 30 is used to support a semiconductor multilayer structure 1006 and the Au plating 1004 after removal of the sapphire substrate 28, and to allow for easy handling of in-process wafer in the manufacturing.

After the attachment of the polymeric film 30, a YAG layer scans over the entire surface of the sapphire substrate 28 with a laser beam LB emitted at the 355 nm third harmonic [Step F1]. The radiated laser beam LB passes through the sapphire substrate 28 without being absorbed. Absorption of the laser beam LB occurs exclusively at the interface between the sapphire substrate 28 and the n-GaN layer 1014. The absorption induces thermal decomposition of the GaN bonded structure locally in the vicinity of the interface. As a result, the sapphire substrate 28 and the semiconductor multilayer structure 1006 are separated in terms of the epitaxial structure. Yet, the sapphire substrate 28 is still physically attached to the semiconductor multilayer structure 1006 with metallic Ga yielded by the decomposition. Since the melting point of metallic Ga is as low as 29° C., the sapphire substrate 28 can be easily removed from the semiconductor multilayer structure 1006 by immersion in a heated hydrochloric acid, for example [Step G1]. Note that it is applicable to replace the YAG third harmonic laser beam with a KrF excimer laser beam with a wavelength of 248 nm or a mercury lamp emission line with a wavelength of 365 nm. It is also applicable to remove the sapphire substrate 28 by grinding.

Next, to form the semiconductor multilayer structure 6 of the LED chip 2, a mask pattern (not illustrated) is disposed to cover a region of the semiconductor multilayer structure 1006 to be later formed as the LED chip 2. Then, unnecessary portion of the semiconductor multilayer structure 1006 is removed by vapor or liquid phase etching until the Au plating is exposed [Step H1]. After removal of the mask pattern (not illustrated), in order to form the projection-depression surface profile 14A on the light extraction surface of the n-GaN layer 14, another mask pattern (not illustrated) is disposed in a manner of leaving exposed the upper surface of semiconductor multilayer structure 6. The in-process wafer is then immersed in a solution such as KOH. As a result, conical projections and depressions are formed on the exposed surface. The depressions and projections are controlled to take a desired shape by adjusting the conditions such as the concentration and/or temperatures of solution, the period of immersion, and the applied current/voltage. After the depressions and projections (the projection-depression surface profile 14A) are formed, the mask pattern (not illustrated) is removed [Step I1].

In order for the surface protection and insulation of the semiconductor multilayer structure 6, a silicon nitride film 1016 is formed next. A mask pattern is disposed on the n-GaN layer 14 to cover upper surface thereof, slightly leaving its outer edge exposed. Next, the silicon nitride film 1016 is laminated by sputtering, for example. The mask pattern is then removed. As a result, except on the upper surface of the n-GaN layer 14, the silicon nitride film 1016 is formed on the upper and side surfaces of the semiconductor multilayer structure 6, as well as on the surface of Au plating 1004 facing toward the semiconductor multilayer structure 6 [Step J1].

After the silicon nitride film 1016 is formed, the next steps are to form the n-electrode 18, the wire 22, and the cathode supply terminal 20. To this end, a stack of Al/Pt/Au films is formed in the following way [Step K1]. First, a mask pattern (not illustrated) is disposed on the upper surface of the n-GaN layer 14, slightly leaving its outer edge exposed. In addition, regions along which the LED chip 2 will be later detached are also left exposed. Thereafter, Al/Pt/Au films are laminated in the stated order by electron beam evaporation, for example, and the mask pattern is removed.

Next, a description is given to steps of forming the phosphor film 8. The phosphor film 8 is formed three-dimensionally to cover not only the upper surface but also the side surface of the semiconductor multilayer structure 6. For this purpose, the first step is to prepare a paste of the silicon resin in which suitable amounts of the phosphor and metal oxide particles mentioned above are dispersed. The paste is applied by screen printing, for example, so as to cover a necessary region of the semiconductor multilayer structure 6. The paste is then thermally cured, so that the phosphor film 8 is formed [Step L1].

Generally, changes in the phosphor film thickness leads to changes in the ratio of the blue light from the emission layer to the green-yellow and red light from the phosphor film. Accordingly, the color tone of white light produced as a mixture of the light changes. Since the screen printing allows the phosphor film to be uniform in thickness, the white light is produced with a tone substantially as designed. Yet, for the illumination purpose, a slight deviation in the color tone matters. In such a case, it is applicable to form the phosphor film thicker than the design value and check the tone of resulting white light. If the tone falls outside a permissible range, the phosphor film is ground to a thickness that would produce white light with a tone as designed. The adjustment of phosphor film thickness may be carried out either before or after the LED chip is detached. There is another advantage achieved by forming the phosphor film by screen printing. That is, the phosphor film thickness is uniform not only within one LED chip but also throughout all chips concurrently manufactured on the same wafer. Consequently, color variation is eliminated not only within each chip but also among all the LED chips. In addition, since each LED chip is already provided with a phosphor film, it is possible to select LED chips that emit light in a desired color before mounting each LED chip to a mounting substrate. As a result, the mounting yield significantly improves in comparison with general white LEDs manufactured by mounting blue LED chips and later providing a phosphor film to each blue LED chip.

Finally, the wafer is cut into chips with a dicing blade DB, thereby completing the LED chip 2 (see FIG. 1) [Step M1].

Embodiment 2

Figure 8A:
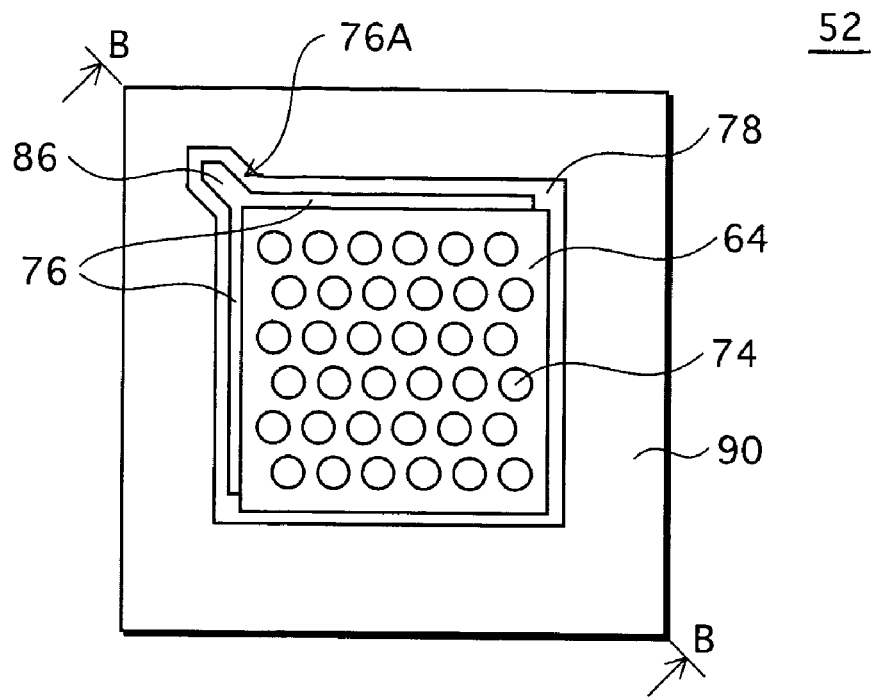
FIG. 8 are views of an LED chip according to an embodiment 2 of the present invention.
Figure 8B:
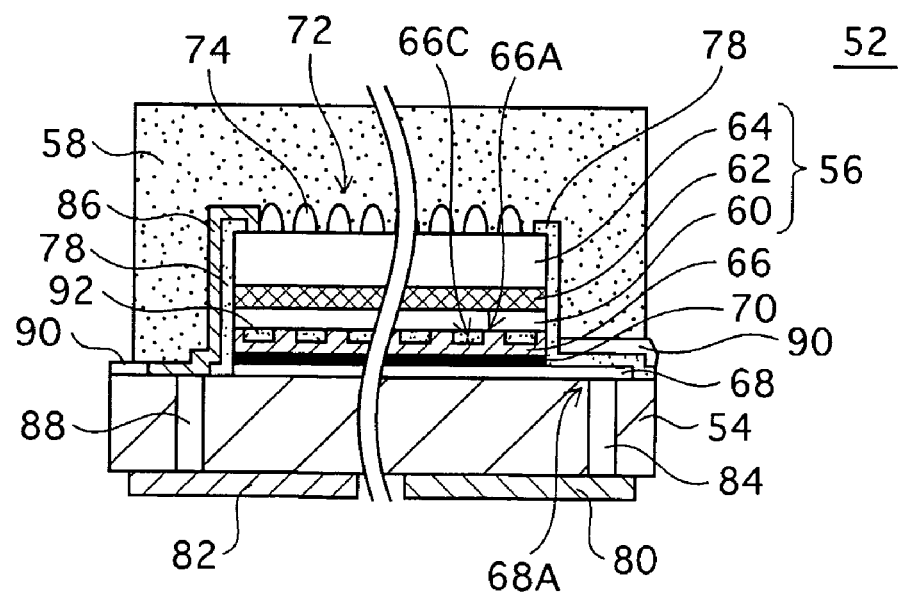
Figure 9A:
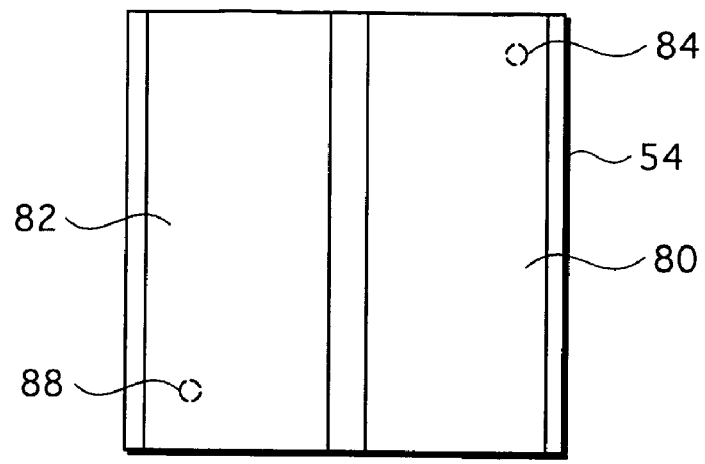
FIG. 9 are views of the LED chip according to the embodiment 2.

FIG. 8A is a plan view of a white LED chip 52 (hereinafter, simply "LED chip 52"), which is a semiconductor light emitting device, whereas FIG. 8B is a sectional view taken along the line B-B of FIG. 8A. FIG. 9A is a bottom view of the LED chip 52. Note that FIG. 8A shows the LED chip 52 from which a later-described phosphor film 58 (see FIG. 8B) is removed.

As shown in FIG. 8, the LED chip 52 is composed of a high-resistance Si substrate 54 (hereinafter, simply "Si substrate 54") as a base substrate, and a semiconductor multilayer structure 56 and the phosphor film 58 laminated over the Si substrate 54. The Si substrate 54 has a main surface slightly larger than that of the semiconductor multilayer structure 56. The semiconductor multilayer structure 56 is disposed centrally on one main surface of the Si substrate 54.

The semiconductor multilayer structure 56 has a quantum well structure composed of: a p-AlGaN layer 60 (200 nm thick), which is a p-semiconductor layer; an AlGaN/InGaN MQW emission layer 62 (40 nm thick); an n-AlGaN layer 64 (20 μm thick), which is an n-semiconductor layer; and an n-GaN layer (5 μm thick: not illustrated in FIG. 8).

The dimensions of the LED chip 52 chip are as follows: a 500 μm square, 250 μm thick (the Si substrate 54: 50 μm thick+the phosphor film 58: 200 μm (i.e. the height from the upper surface of the Si substrate 54)). The thickness of the semiconductor multilayer structure 56 is as stated above, and the main surface is 400 μm square.

A p-electrode 66 is disposed so as to face substantially entirely of the undersurface of the p-AlGaN layer 60 (a main surface facing away from the emission layer 62). The p-electrode 66 is made of Rh/Pt/Au films laminated over the p-AlGaN layer 60 in the stated order, and reflects light from the emission layer 62 with high reflectivity toward the n-AlGaN layer 64. Note that the semiconductor multilayer structure 56 and the p-electrode 66 are initially formed on a later-described sapphire substrate 94 (see FIG. 10) using wafer process, and then transferred onto the Si substrate 54.

The Si substrate 54 has a conductive film 68 formed on the upper surface thereof so as to cover at least a region facing toward the p-electrode 66. The conductive film 68 is made of a stack of Ti/Pt/Au films, and connected to the p-electrode 66 via a bonding layer 70 that is made from conductive materials such Au/Sn.

In order to improve light extraction efficiency, the light extraction surface of the semiconductor multilayer structure 56, i.e. the upper surface of the n-AlGaN layer 64 (the main surface facing away from the emission layer 62) has a projection-depression surface profile 72. As described later, the projection-depression surface profile 72 is formed by selectively etching a tantalum oxide ($Ta_2O_5$) film 74 having been formed into a uniform thickness on the upper surface of the n-AlGaN layer 64, thereby to remove unnecessary portions of the $Ta_2O_5$ film 74. In addition, a substantially L-shaped n-electrode 76 is formed by laminating Ti/Pt/Au films on the upper surface of the n-AlGaN layer 64.

An insulating film 78 made of silicon nitride is disposed to entirely cover the side surface of the semiconductor multilayer structure 56 and partially cover the upper surface thereof (in a manner of hemming the upper surface).

On the undersurface of the Si substrate 54 (the main surface facing away from the semiconductor multilayer structure 56), an anode supply terminal 80 and a cathode supply terminal 82 are formed both from Ti/Au.

The conductive film 68 mentioned above has a region 68A extending beyond the undersurface of the semiconductor multilayer structure 56. The conductive film 68 is electrically connected at the extended region 68A to the anode supply electrode 80 via a plated-through hole 84 formed in the Si substrate 54.

Separately, a wire 86 that extends to the Si substrate 54 is connected at one end to a corner region 76A of the L-shaped n-electrode 76. More specifically, the wire 86 extends, from its n-electrode end, laterally beyond the main surface of the n-AlGaN layer 64 (light extraction surface) and then extends to the Si substrate 54 across the side surface of the semiconductor multilayer structure 56. Note that the wire 86 is made of a stack of Ti/Pt/Au films, and electrically insulated from the semiconductor multilayer structure 56 by the insulating film 78. The Si substrate end of the wire 86 is electrically connected to the cathode supply terminal 82 via a plated-through hole 88 formed in the Si substrate 54. Note that the plated-through holes 84 and 88 are both formed by filling, with Pt (platinum), holes formed through the Si substrate 54 in the thickness direction.

The phosphor film 58 has a profile as if it is received by the Si substrate 54 and covers the side surface of the semiconductor multilayer structure 56 and the main surface facing away from the Si substrate (the light extraction surface). The phosphor film 58 is prepared by dispersing, in a transparent resin such as silicone, four different colors of blue, green, yellow, and red phosphor particles as well as fine particles of metal oxide, such as $SiO_2$. The example of each color phosphor is as follows. That is, the blue phosphor is at least one of $(Ba, Sr)MgAl_{10}O_{17}$: $Eu^{2+}$ and $(Ba, Sr, Ca, Mg)_{10}(PO_4)_6Cl_2$: $Eu^{2+}$. The green phosphor is at least one of $BaMgAl_{10}O_{17}$: $Eu^{2+}$, $Mn^{2+}$ and $(Ba, Sr)_2SiO_4$:$Eu^{2+}$. At least one type of the yellow phosphor, such as $(Sr, Ba)_2SiO_4$:$Eu^{2+}$, is used. The red phosphor is at least one of $La_2O_2S$:$Eu^{3+}$, $CaS$:$Eu^{2+}$, and $Sr_2Si_5N_8$:$Eu^{2+}$. It is applicable to use an epoxy resin as the transparent resin. It is also applicable to replace the transparent resin with a glass material made of a metal alkoxide as a starting material or from a polymer ceramic precursor. Note that the phosphor film 58 is substantially uniform throughout its thickness.

Between the Si substrate 54 and the phosphor film 58, a light reflecting film 90 is disposed so as to surround the semiconductor multilayer structure 56 in plan view.

Similarly to the LED chip 2 of the embodiment 1, the p-electrode of the LED chip 52 has a projection-depression surface profile on a surface facing toward the p-semiconductor layer.

Figure 9B:
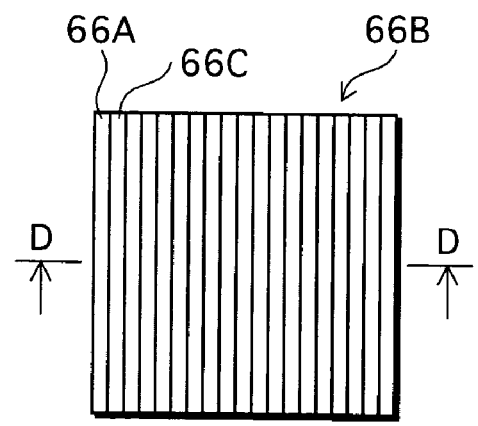
Figure 9C:
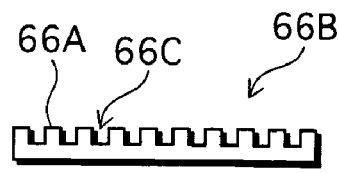

FIG. 9B is a plan view showing the p-electrode 66 alone (see FIG. 8B), whereas FIG. 9C is a sectional view taken along the line D-D of FIG. 9B.

With reference to FIGS. 9B and 8B, the p-electrode 66 includes ridged projections 66A substantially equally spaced in a parallel relation (substantially uniformly distributed), thereby defining a striped projection-depression surface profile 66B. Each projection 66A makes a contact at the top thereof with the undersurface of the p-AlGaN layer 60. Grooved depressions 66C in the projection-depression surface profile 66B are filled with an insulator 92 made of a silicon oxide. Alternatively to the silicon oxide, the insulator 92 may be made of any of the materials mentioned in the embodiment 1, including $Ta_2O_5$. The semiconductor multilayer structure 56 has linear lattice defects oriented in the laminating direction. These linear lattice defects, also known as dislocations, are areas in a crystal where the atomic arrangement is broken. Through the manufacturing process, the lattice defects are controlled to appear in regions where the insulator 92 will be disposed. Details of the lattice defects are given later in a description of a manufacturing method of the LED chip 52.

On application of an electric current to the LED chip 52 having the above structure via the anode supply terminal 80 and the cathode supply terminal 82, the emission layer 62 included in the semiconductor multilayer structure 56 emits near-ultraviolet light having the wavelength of 390 nm. Most of the near-ultraviolet light emitted from the emission layer 62 exits the semiconductor multilayer structure 56 through the n-AlGaN layer 64, and absorbed by the phosphor film 58 where the near-ultraviolet light is converted to white light.

As described above, the semiconductor multilayer structure 56 is about 25 μm thick. Comparatively, the phosphor film 58 has a sufficient thickness of 200 μm. Furthermore, the phosphor film 58 also covers the side surface of the semiconductor multilayer structure 56. In other words, the phosphor film 58 has a substantially uniform thickness and surrounds the semiconductor multilayer structure 56. Thus, white light is produced almost without color variations resulting from uneven thickness of the phosphor film 58.

The LED chip 52 according to the present embodiment employs a high-reflective electrode as the p-electrode 66, thereby significantly improving the efficiency of light extraction from the semiconductor multilayer structure 56. Further, the projection-depression surface profile 72 of the upper surface of the n-AlGaN layer 64 also serves to improve the efficiency of light extraction from the semiconductor multilayer structure 56. Still further, the light reflecting film 90 improves the efficiency of light extraction from the LED chip 52.

In addition, since the LED chip 52 is without a sapphire substrate on the light extraction surface of the semiconductor multilayer structure 56, the efficiency of light extraction from the semiconductor multilayer structure 56 is significantly higher in comparison with an LED chip of which emission light from an emission layer exits through a sapphire substrate.

Further, the p-electrode 66 is provided so as to face substantially entirely of the surface of the p-AlGaN layer 60, and an electric current is injected from the projections 66A that are substantially uniformly distributed. Thus, similar effects to those of the embodiment 1 are achieved.

The LED chip 52 is mounted onto a mounting substrate by directly bonding the supply terminals 80 and 82 to a pair of pads disposed on the mounting substrate. Since the LED chip 52 is already provided with the phosphor film and thus emits white light, it is possible to test the optical properties of the LED chip 52 before mounting. Consequently, it is prevented that a finished product mounted onto a mounting substrate is rejected (as a nonconforming product) because of insufficient optical properties. Thus, the yield rates of conforming products improve.

Further, in the LED chip 52, the anode supply terminal 80 and the cathode supply terminal 82 are provided on the undersurface of the semiconductor multilayer structure 56. That is to say, there is no obstruction, such as a bonding wire, to light exiting from the light extraction surface 94, which is positioned at the top of the LED chip 52 when mounted. Thus, it is ensured that the LED chip 52 emits shadowless light.

Now, with reference to FIGS. 10-17, a description is given to a manufacturing method of the LED chip 52 having the above structure. In FIGS. 10-17, materials of components of LED chip 52 are denoted by reference numbers in the two thousands, and the last two digits correspond to the reference numbers denoting the respective LED chip components.

First, as shown in FIG. 10, the following layers are epitaxially grown by the MOCVD method over a sapphire substrate, which is a single-crystal substrate. That is, a GaN layer (not illustrated in FIG. 10), an n-AlGaN layer 2064, an InGaN/AlGaN MQW emission layer 2062, and a p-AlGaN layer 2060 are laminated in the stated order [Step A2]. Note that the sapphire substrate 94 measures 2 inches in diameter and 300 μm in thickness.

Next, a mask pattern is provided so as to partially cover some regions of a grown semiconductor multilayer structure 2056, and the remaining regions are etched by dry etching until the sapphire substrate 94 is exposed. One region of the semiconductor multilayer structure 2056 left unetched constitutes the semiconductor multilayer structure 56 (see FIG. 8B) of the LED chip 52 [Step B2].

Next, to form the insulator 92 (see FIG. 8), a silicon oxide film 2092 is laminated by sputtering. Prior to the lamination, a mask pattern (not illustrated) is provided to cover regions of the n-AlGaN layer 64 where the insulator 92 should not be formed. The mask pattern is removed after laminating the silicon oxide film 2092, thereby forming the insulator 92 on the desired regions [Step C2]. Next, a stack of Rh/Pt/Au films is formed on the upper surface of the semiconductor multilayer structure 56 (p-AlGaN layer 60) in the stated order by electron beam evaporation, for example. This completes manufacturing of the p-electrode 66 [Step D2].

The insulator 92 is formed on high-defect regions of the semiconductor multilayer structure where lattice defects are localized. Generally, a GaN semiconductor layer formed on a sapphire substrate has liner lattice defects due to the lattice constant disparity between GaN and sapphire. According to the present embodiment, lattice defects are controlled to grow in a specific orientation to be locally gathered, so that the lattice defects collectively appear on a surface of a semiconductor layer at predetermined intervals. The insulator 92 is provided to cover regions of the semiconductor multilayer structure where the lattice defects are densely present (high-defect regions). The semiconductor multilayer structure also has low-defect regions formed in the vicinity of the high-defect regions, and those low-defect regions are in contact with the top surfaces of the projections of the p-electrode. The technique for controlling the growing orientation of lattice defects is known in the art and disclosed for example in U.S. Pat. No. 6,617,182. Thus, a description thereof is given briefly without details, with reference to FIGS. 11 and 12.

FIGS. 11 and 12 illustrate the steps shown in FIGS. 10A-10C in greater detail.

Figure 11A:
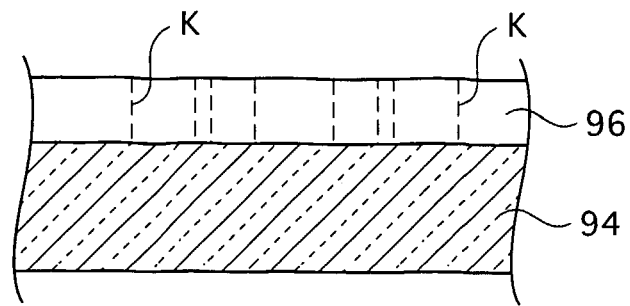
FIG. 11 are views showing details of the manufacturing steps shown in FIG. 10.

First, a buffer layer (not illustrated) is formed in a thickness of 10 nm by the MOCVD method on the (0, 0, 0, 1) surface of the sapphire substrate 94, and a GaN layer 96 is subsequently formed in a thickness of 5 μm [FIG. 11A]. Due to the lattice constant disparity between GaN and sapphire, linear lattice defects K are present in the GaN layer 96.

Figure 11B:
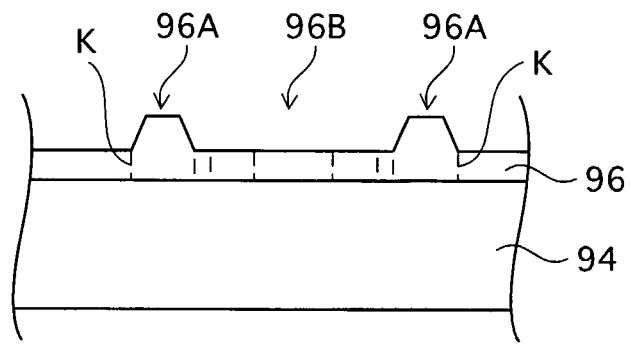
Figure 11C:
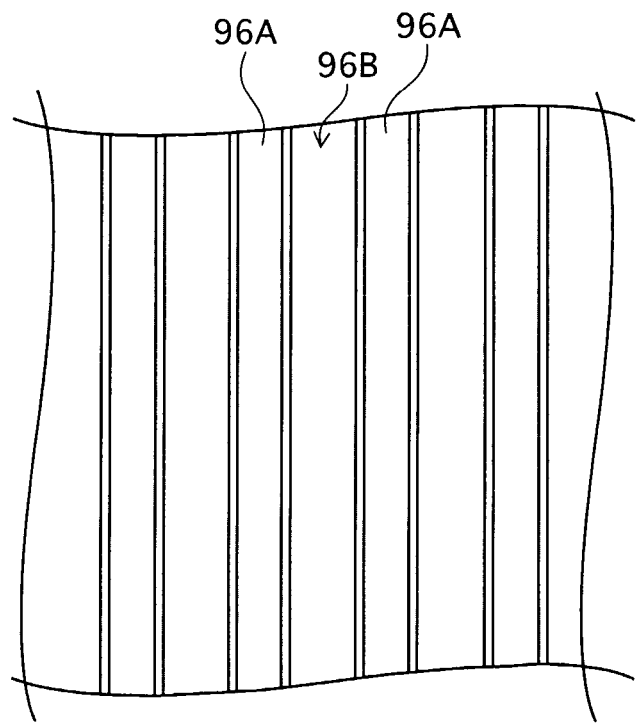

Next, a first set of projections/depressions is formed on the surface of the GaN layer 96 by etching [FIG. 11B]. The pitch of projections/depressions is 10 μm. Each projection 96A measures 2 μm in the top surface width, and 3 μm in height. With these projections/depressions, each grooved depression 96B appearing vertically in the figure is oriented in the <1, 1, −2, 0> direction. FIG. 11C is a view of the projections/depressions seen from above.

Figure 12A:
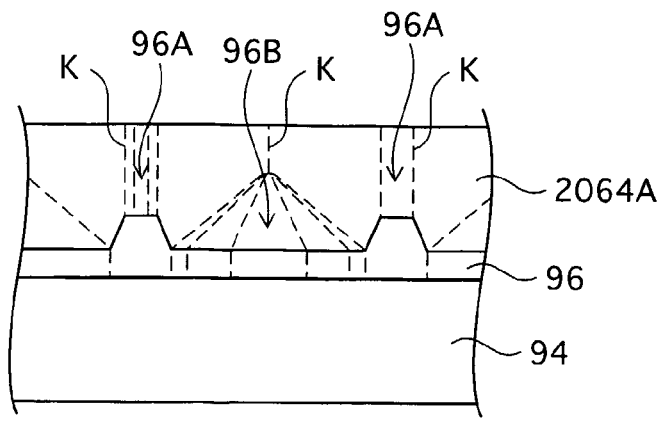
FIG. 12 are views showing details of the manufacturing steps shown in FIG. 10.

Next, a first AlGaN layer 2064A is further formed in a thickness of 10 μm on the first set of projections/depressions, using the MOCVD method [FIG. 12A]. The lattice defects K are initially present in the first AlGaN layer 2064A at locations corresponding to the depressions 96B. With progress of the first AlGaN layer deposition, the lattice defects K grow toward the longitudinal center of each depression 96B and finally gather into a single streak of lattice defect per depression. That is, lattice defects appearing on the surface of the first AlGaN layer 2064A are confined into regions corresponding to the longitudinal center of each depression 96B and to the top of each projection 96A. Thus, the regions of the first AlGaN layer 2064A other than the above-mentioned regions are low-defect regions.

Figure 12B:
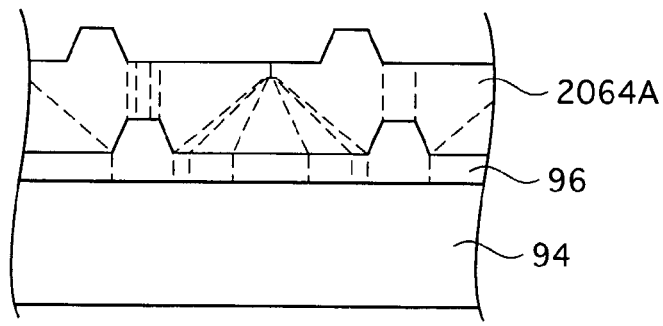

In order to further reduce the number of lattice defects present on the surface of the first AlGaN layer 2064A, a projection is formed on the surface of the first AlGaN layer 2064A per every other low defect region [FIG. 12B]. The manufacturing method and structure are the same as those described with respect to the first set of projections/depressions of the GaN layer 96.

Figure 12C:
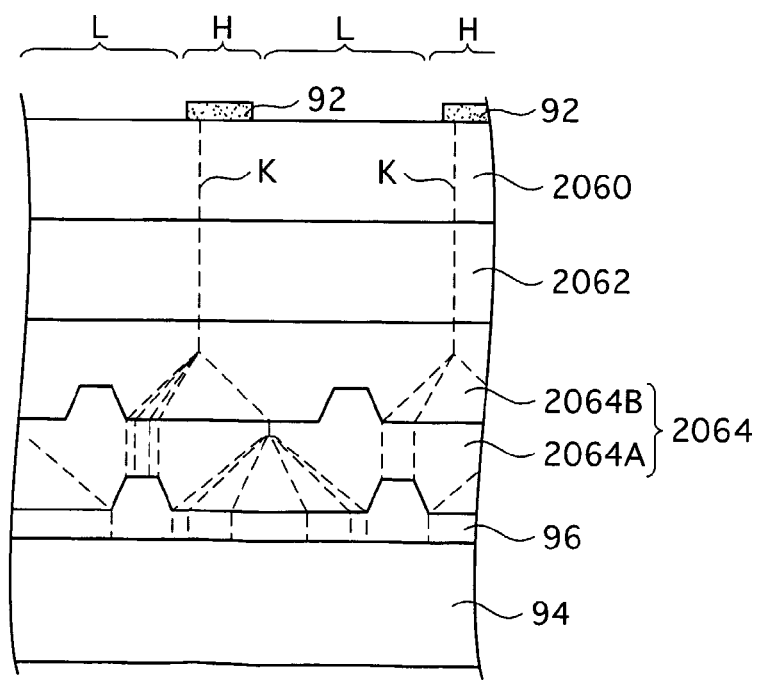

Next, a second AlGaN layer 2064B is further formed in a thickness of 10 μm on the first AlGaN layer 2064A, using the MOCVD method [FIG. 12C]. With progress of the second AlGaN layer deposition, the lattice defects present on the surface of first AlGaN layer 2064A grow toward the longitudinal center of each grooved depression of the second AlGaN layer 2064B and finally gather into a single streak of lattice defect per depression. As a result, the number of lattice defects present on the surface of the second AlGaN layer 2064B is further reduced in comparison with that present on the surface of the first AlGaN layer 2064A, The streaks of lattice defects grow substantially straight up sequentially in the emission layer 2062 and the p-AlGaN layer 2060. As a result, the streaks of lattice defect appear as pits in the surface (upper surface) of the p-AlGaN layer 2060. According to the present embodiment, the insulator 92 is formed on high-defect regions H in which such pits are likely to appear (into which lattice defects are localized). On the other hand, contact with the projections of the p-electrode is made in low-defect regions L present in the vicinity of the high-defect regions. With this arrangement, the luminous efficiency of the LED chip improves because it is made possible to inject electric current into regions where little lattice defects are present. As is known, lattice defects present in the emission layer convert the injected current exclusively to heat, thereby lowering the luminous efficiently.

Figure 28:
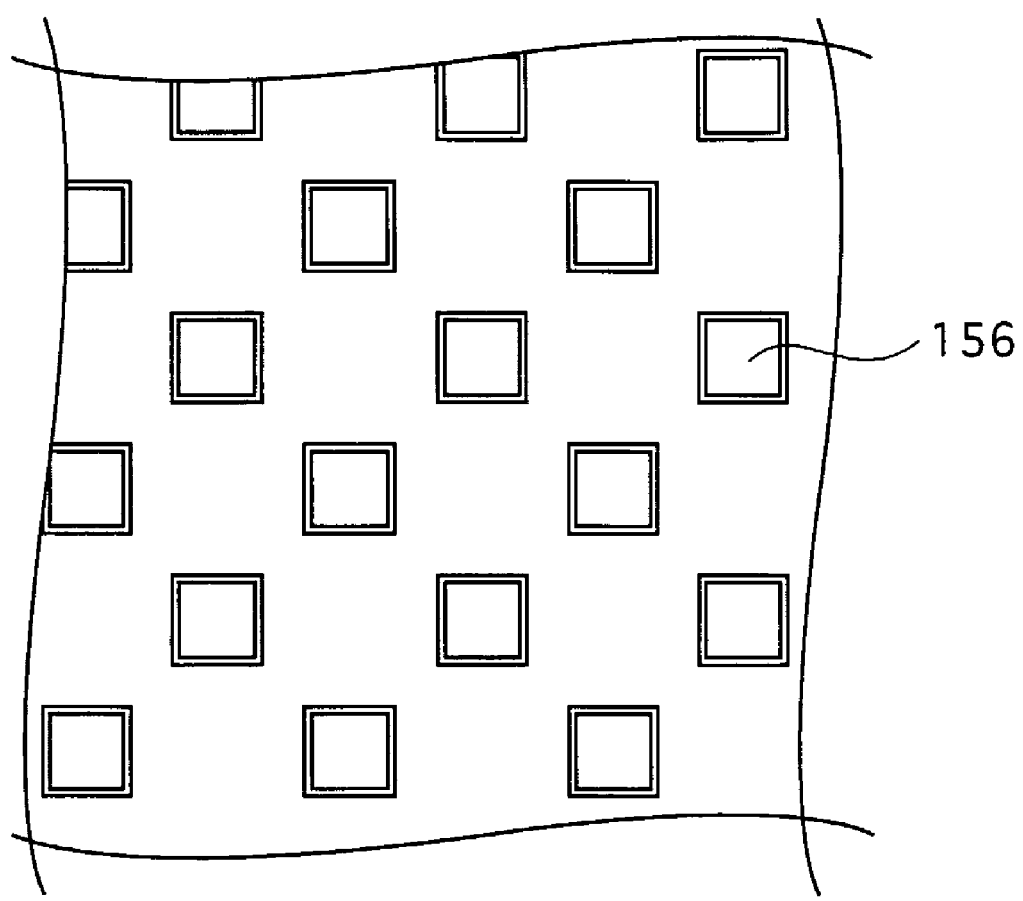
FIG. 28 is a view of an example of a projection-depression surface profile formed, through wafer process, on a buffer layer or an n-semiconductor layer for forming high defect regions in which lattice defects are localized.

It is also applicable that the LED chip 2 (FIG. 1) of the embodiment 1 has the semiconductor multilayer structure having high-defect regions at locations in contact with the projections 24A of the p-electrode 24 and low-defect regions at locations of the insulator 26. In this case, the GaN buffer layer or the n-GaN layer is formed to have the upper surface conforming to the projection-depression surface profile of the p-electrode. That is, as shown in FIG. 28, the upper surface of the GaN buffer layer or the n-GaN layer has projections 156 in a staggered arrangement. Note that FIG. 28 shows the state corresponding to FIG. 11C.

In parallel with the above steps, steps E2 and F2 shown in FIG. 13 are performed.

First, bores 98 and 100 are formed by dry etching through a high-resistance Si substrate 2054 in the thickness direction. The bores 98 and 100 are then filled with Pt by electroless plating, thereby forming the plated-through holes 84 and 88 [Step E2].

Next, a stack of Ti/Pt/Au films is disposed on the upper surface of the Si substrate 2054 to cover a predetermined region thereof, thereby forming the conductive film 68. Then, a stack of Au/Sn films is formed on the conductive film 68 to cover a predetermined region thereof, thereby forming the bonding layer 70 [Step F2].

Next, the sapphire substrate 94 and the Si substrate 2054 are stacked in a manner that the p-electrode 66 and the bonding layer 70 are joined together. While being pressed, the substrates are heated until the temperature of the bonding layer 70 reaches about 300° C. [Step G2]. As a result, the p-electrode 66 and the bonding layer 70 are bonded together by eutectic bonding.

Subsequent to the step of bonding the p-electrode 66 and the bonding layer 70, the sapphire substrate 94 is separated from the semiconductor multilayer structure 56 [Steps H2 and I2]. The separation steps are identical to the separation steps according to embodiment 1 and thus no description is given.

After removal of the sapphire substrate 94 and transfer of the semiconductor multilayer structure 56 to the Si substrate 2054, the inner stress is no longer induced by the lattice constant disparity between the n-AlGaN layer 64 and the sapphire substrate 94. Consequently, distortion in the resulting semiconductor multilayer structure 56 is minimized. Such a semiconductor multilayer structure provides more flexibility in selection of an LED chip substrate (base substrate) supporting the semiconductor multilayer structure. For example, it is applicable to use, as a base substrate, a substrate having higher thermal dissipation (thermal conductivity) than the substrate used for epitaxial growth.

Next, for the insulation and surface protection of the semiconductor multilayer structure 56, a silicon nitride film is sputtered by high-frequency sputtering, for example, thereby forming the insulating film 78 [Step J2]. To be more specific, the silicon nitride film is formed to cover the side surface and the outer edge of upper surface of the semiconductor multilayer structure 56 (n-AlGaN layer 64), as well as the extended region 68A of the conductive film 68.

Next, Ti/Pt/Au films are laminated to form the n-electrode 76 and the wire 86 [Step K2]. That is, the n-electrode 76 is integrally formed with the wire 86.

Next, an Al film is layered to form a light-reflecting film [Step L2].

Then, a $Ta_2O_5$ film 74 is deposited on the exposed surface of the n-AlGaN layer 64 by sputtering, for example, and remove unnecessary portions of the $Ta_2O_5$ film 74 by etching to define the projection-depression surface profile 72 [Step M2].

Next, a first polymeric film 102 is adhered to a surface of the Si substrate 2054 on which the semiconductor multilayer structure 56 is formed [Step N2]. The adhesion is achieved via an adhesive layer (not illustrated) that foams to lose its adhesive power when heated. An adhesive layer made of polyester is one example.

After the first polymeric film 102 is adhered, the Si substrate 2054 is ground from rear to a thickness of 100 μm [Step O2]. As a result, the plated-through holes 84 and 88 come to be exposed on the rear surface of the Si substrate 2054.

After the plated-through holes 84 and 88 are made to appear, stacks of Ti/Au films are formed on the Si substrate 2054 to cover predetermined regions thereof, thereby forming the anode supply terminal 80 and the cathode supply terminal 82 [Step P2].

Next, the first polymeric film 102 having been adhered to the front surface of the Si substrate 2054 is removed. To the rear surface of the Si substrate 2054, a second polymeric film 104, which is a dicing sheet, is attached [Step Q2].

Thereafter, the phosphor film 58 is formed by screen printing [Step R2]. Finally, the in-process wafer is diced by a dicing blade DB, thereby completing the LED chip 52 [Step S2].

Embodiment 3

In the above embodiments 1 and 2, a semiconductor multilayer structure is initially formed on a sapphire substrate (single crystal substrate) and later bonded to a substrate of different material, such as a metal or a semiconductor. In an embodiment 3, the present invention is applied to a well-known LED chip that is manufactured by epitaxially growing a semiconductor multilayer structure on a single crystal substrate, such as an SiC substrate or sapphire substrate, and thus without involving separation of the semiconductor multilayer structure from the single crystal substrate.

FIG. 18 show an LED chip 112 according to the third embodiment. FIG. 18A is a plan view of the LED chip 112. FIG. 18B is a sectional view taking along the line C-C of FIG. 18A. FIG. 18C is a plan view exclusively of a p-electrode 126, which will be described later. Note that FIGS. 18C and 18D and FIG. 19 all show the p-electrode in plan view, and the solidly shaded areas represent the projected regions of the p-electrode.

As shown in FIG. 18, the LED chip 112 is composed of an n-SiC substrate 114, and a semiconductor multilayer structure 116 directly formed on the n-SiC substrate 114 by epitaxial growth. The semiconductor multilayer structure 116 is in turn composed of an n-GaN layer 118, an InGaN quantum well emission layer 120, and a p-GaN layer 122 laminated over the n-SiC substrate 114 in the stated order.

On the upper surface of the n-SiC substrate 114, an n-electrode 124 is formed by laminating Ti/Au films. On the substantially entire undersurface of the p-GaN layer 122, the p-electrode 126 is formed by laminating Rh/Pt/Au films.

Figure 18A:
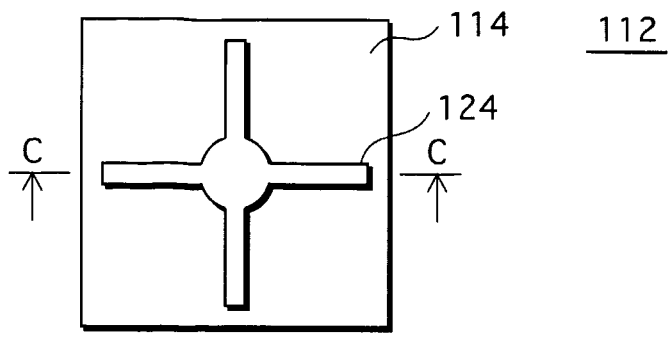
FIG. 18 are views of an LED chip according to an embodiment 3 of the present invention.
Figure 18B:
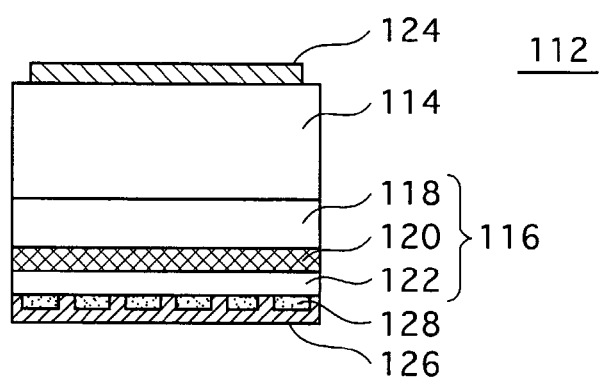
Figure 18C:
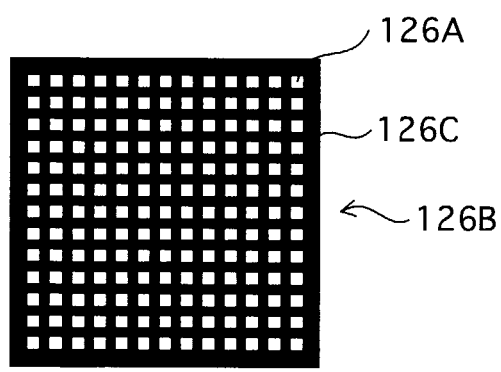

As shown in FIG. 18C, the p-electrode 126 has a projection-depression surface profile 126B defined by uniformly distributed depressions 126A each of which is rectangular in transverse section. In other words, the p-electrode 126 has a single latticed projection 126C defining the projection-depression surface profile 126B.

The p-electrode 126 is in contact with the p-GaN layer 122 at the top surface of the latticed projection 126C. Each depression 126A is filled with an insulator 128 made of silicon oxide.

The LED chip 112 is mounted onto a mounting substrate such as a printed circuit board, by bonding the undersurface of the p-electrode 126 to an anode pad formed on the mounting substrate. Furthermore, the n-electrode 124 is connected with a bonding wire to a cathode pad also formed on the mounting substrate.

In order to produce white light, a phosphor film is formed over the mounting substrate so as to entirely cover the LED chip 112, after the bonding wire connection.

Figure 18D:
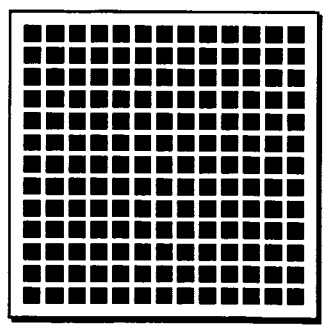

In the above example, the projection-depression surface profile of the p-electrode is defined by forming a plurality of depressions. Yet, it is applicable to define the projection-depression surface profile by forming a plurality of prismatic projections in a substantially uniformly spaced relation, as shown in FIG. 18D.

Alternatively, the p-electrode may have surface profiles as shown in FIG. 19.

Figure 19A:
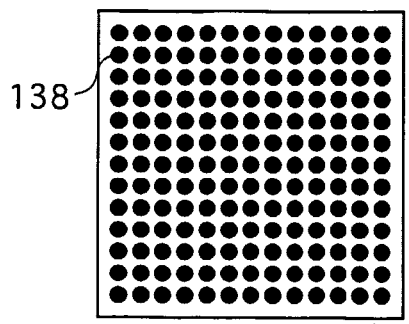
FIG. 19 are views of modified projection-depression surface profiles of a p-electrode.
Figure 19B:
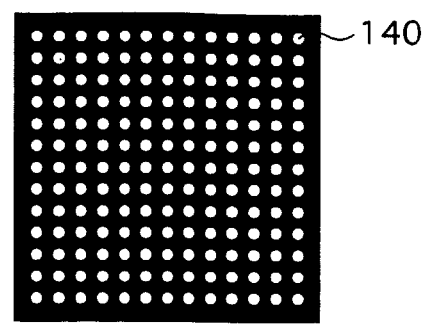

In the example shown in FIG. 19A, columnar projections 138 are formed in a substantially uniformly spaced relation, similarly to the embodiment 1. In the example shown in FIG. 19B, depressions each having a circular transverse section are formed in a substantially uniformly spaced relation.

Figure 19C:
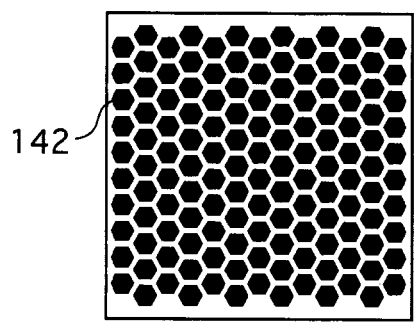
Figure 19D:
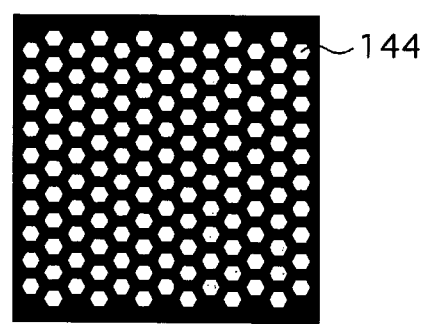

In the example shown in FIG. 19C, hexagonal prismatic projections 142 are formed in a substantially uniformly spaced relation. In the example shown in FIG. 19D, depressions 144 each having a hexagonal transverse section are formed in a substantially uniformly spaced relation.

Figure 19E:
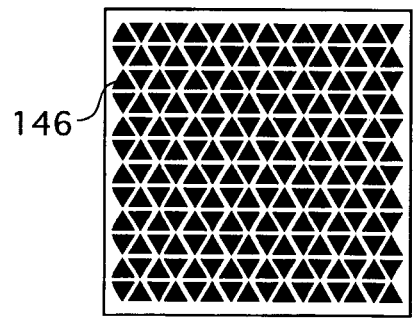
Figure 19F:
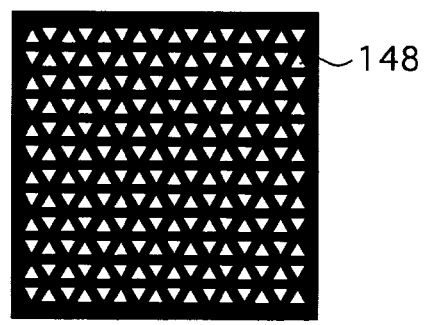

In the example shown in FIG. 19E, triangular prismatic projections 146 are formed in a substantially uniformly spaced relation. In the example shown in FIG. 19F, depressions 148 each having a triangular transverse section are formed in a substantially uniformly spaced relation.

Figure 19G:
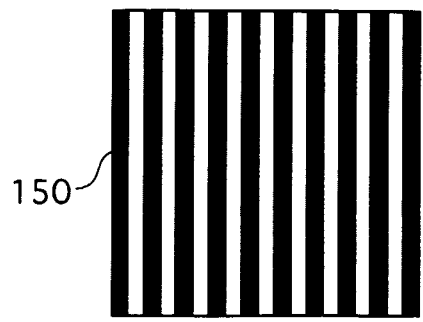
Figure 19H:
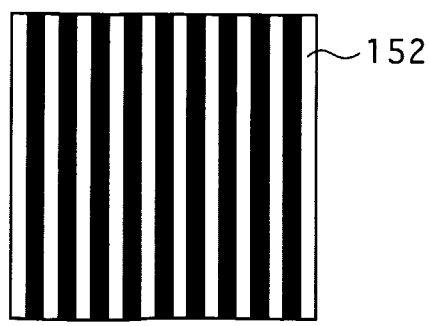

In the example shown in FIG. 19G is similar to the embodiment 2 in that streak-like projections 150 are formed in a substantially uniformly spaced relation (at substantially equal spaced intervals). In the example shown in FIG. 19H, straight grooved depressions 152 are formed in a substantially uniformly spaced relation (at substantially equal spaced intervals).

Note that the p-electrode according to the embodiment 1 may have any of the surface profiles shown in FIGS. 18C, 18D, and 19B-19H. Similarly, the p-electrode according to the embodiment 2 may have any of the surface profiles shown in FIGS. 18C, 18D, and 19B-19H.

Embodiment 4

Figure 20:
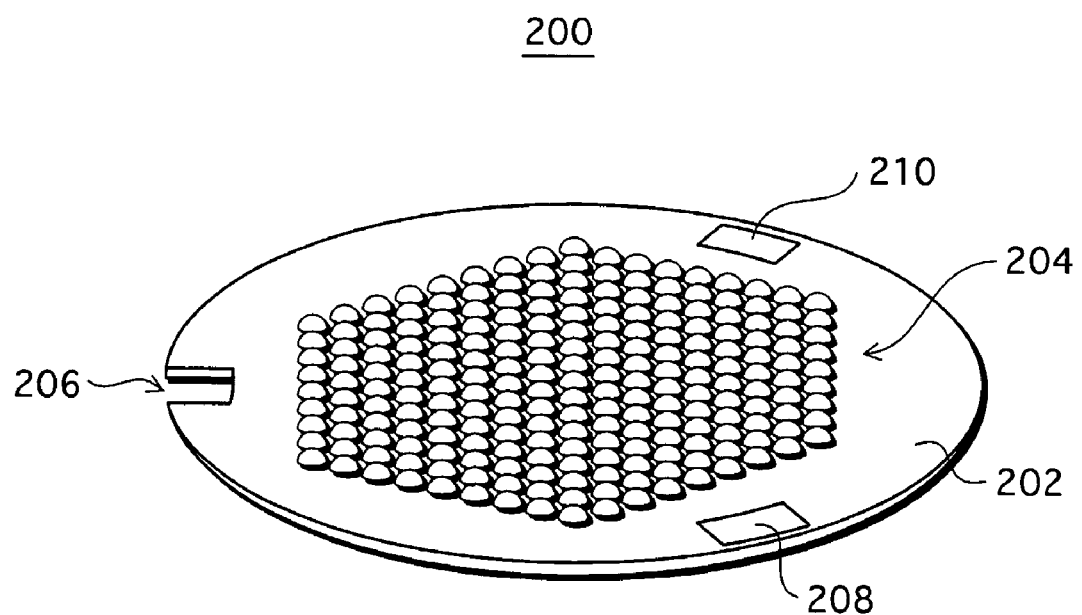
FIG. 20 is an oblique view of a white LED according to an embodiment 4 of the present invention.

FIG. 20 is an external oblique view of a while LED module (hereinafter, referred to simply as an "LED module") 200, which is a lighting module having the LED chips 52 (see FIG. 8) according to the embodiment 2. The LED module 200 is mounted to a later-described lighting fixture 232 (FIG. 23) when put to use.

The LED module 200 includes 217 resin lenses 204 and a circular ceramic substrate 202 which measures 5 cm in diameter and made of AlN (aluminum nitride). In addition, the ceramic substrate 202 is provided with a guide notch 206 and terminals 208 and 210 for power supply from the lighting fixture 232.

Figure 21A:
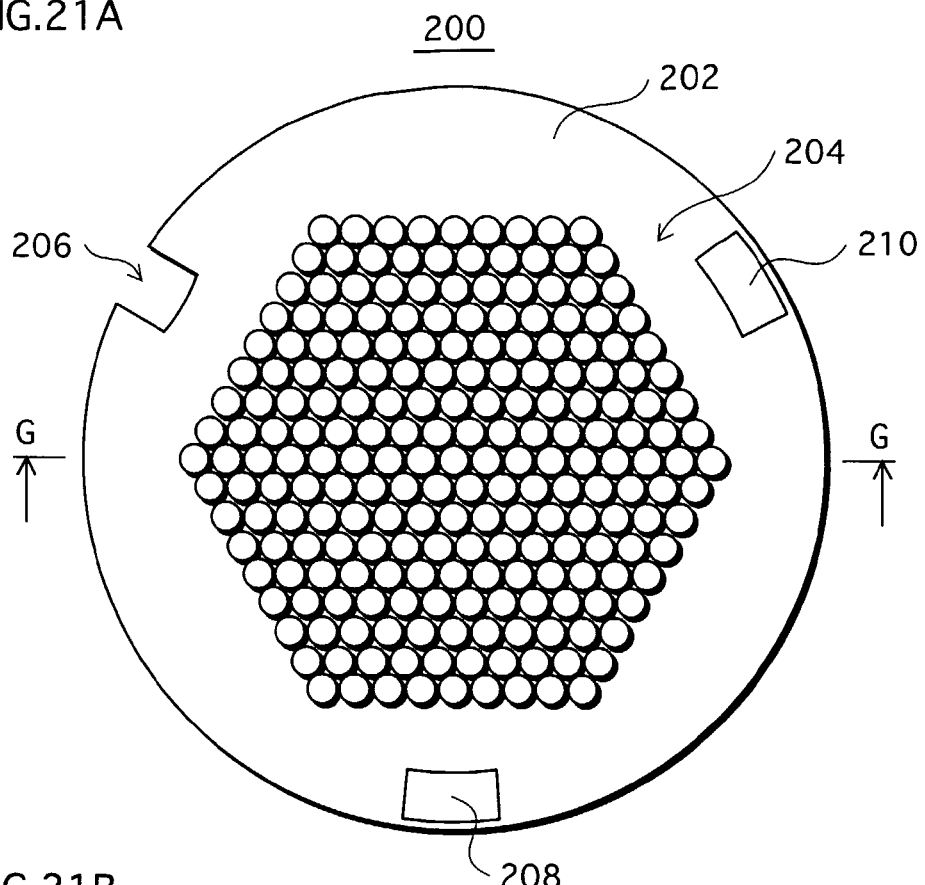
FIG. 21A is a plan view of the white LED shown in FIG. 20.
Figure 21B:
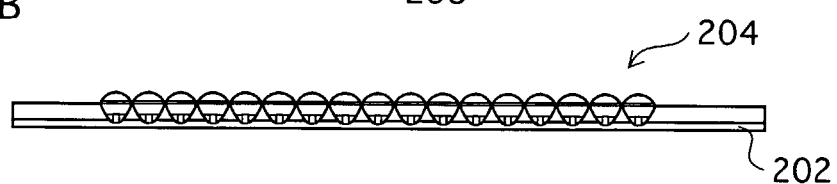
FIG. 21B is a sectional view taken along the line G-G of FIG. 21A.
Figure 21C:
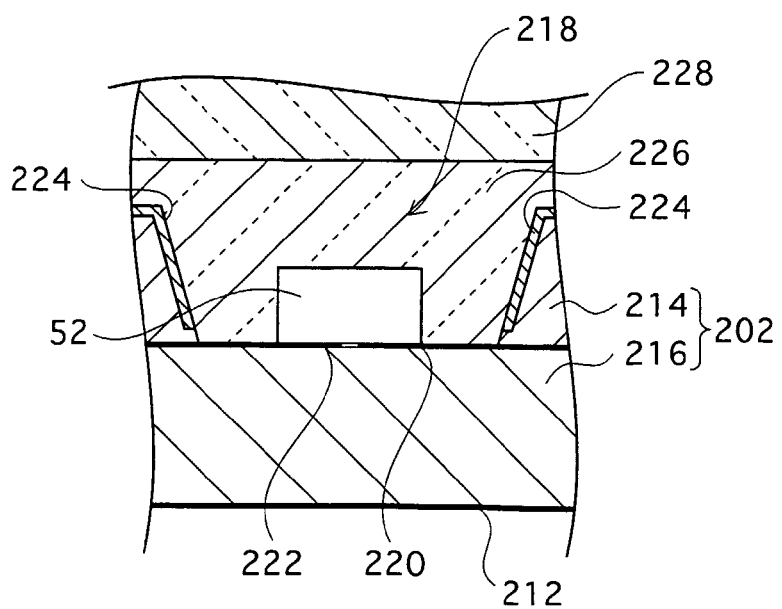
FIG. 21C is an enlarged view of a chip mounting portion shown in FIG. 21B.

FIG. 21A is a plan view of the LED module 200, whereas FIG. 21B is a sectional view taken along the line G-G of FIG. 21A. FIG. 21C is an enlarged view showing a mounting portion of a chip.

As shown in FIG. 21C, the undersurface of the ceramic substrate 202 is covered with gold plating 212 in order to improve thermal dissipation.

The LED chips 52 (a total of 217 chips) are mounted on the ceramic substrate 202 each at a location corresponding to the center of a respective lens illustrated as a circle in FIG. 21A.

The ceramic substrate 202 is a laminate of two ceramic substrates 214 and 216 each of which is 0.5 mm thick and made mainly of AlN. Alternatively to AlN, the ceramic substrates 214 and 216 may be made of various materials including $Al_2O_3$, BN, MgO, ZnO, SiC, and diamond.

The LED chips 52 are mounted on the ceramic substrate 216, which is the lower layer. The ceramic substrate 214, which is the upper layer, is provided with downwardly tapered through holes 218 for securing mounting space of the LED chips 52.

Figure 22A:
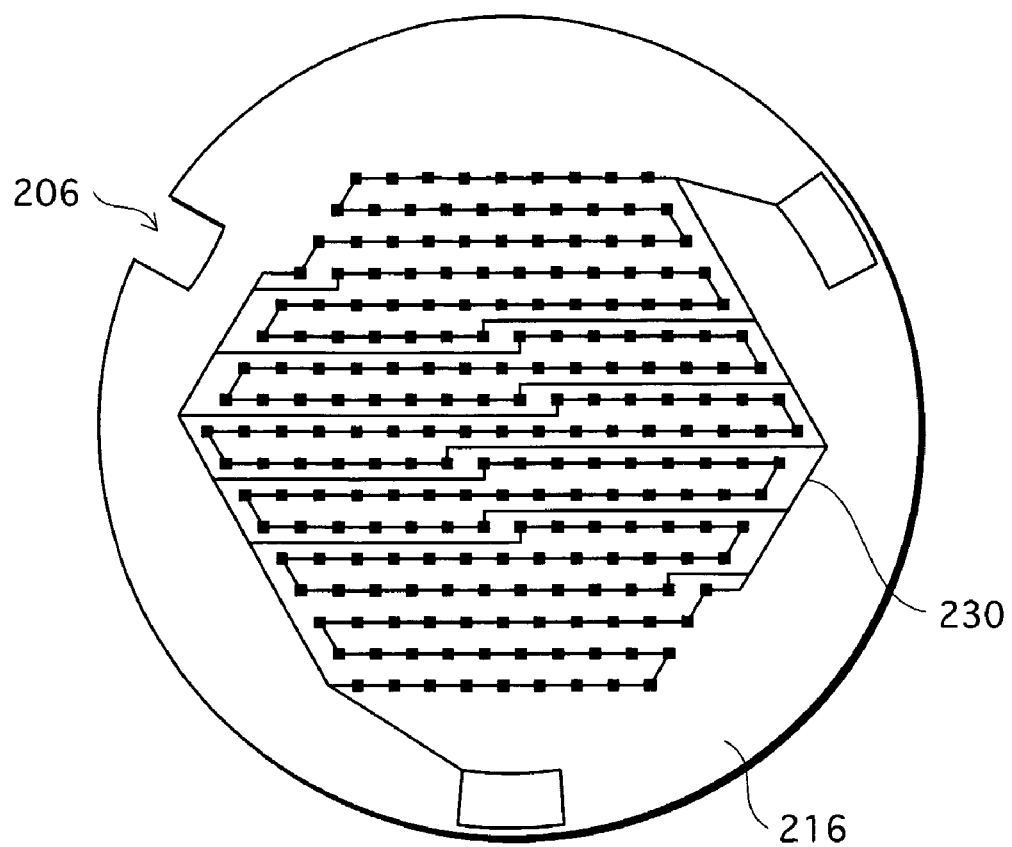
FIG. 22A is a view of a wiring pattern of the white LED shown in FIG. 20A.
Figure 22B:
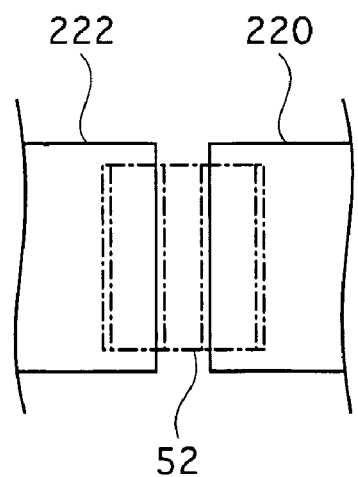
FIG. 22B is a view of an arrangement pattern of pads formed on a ceramic substrate constituting the white LED.

The ceramic substrate 216 has, on the upper surface thereof, pairs of a cathode pad 220 and an anode pad 222, which are bonding pads as shown in FIG. 22B. Each pair of pads is located correspondingly to the mounting locations of the LED chips 52. Each of the pads 220 and 222 is made of Cu plated with Au, and soldered with PbSn to the gold-plated supply terminals 80 and 82 of the LED chip 52 (see FIG. 8).

Alternatively, the supply terminals 80 and 82 of the LED chip 52 may be further plated with a PbSn solder. This arrangement eliminates the step of putting a solder on each of the pads 220 and 222. After placing the LED chips 52 one on each pair of pads, the ceramic substrate 202 is heated in a reflow furnace to until the temperature of the ceramic substrate reaches a melting point of the solder. In this manner, all of the 217 LED chips 52 are soldered all at once. The reflow soldering is duly carried out by optimizing conditions, such as the shape of pads, the amount of solder, the shape of supply terminals of the LED chip 52, although the conditions are not specifically mentioned herein. Alternatively to the solder, a silver paste or a bump may be used for bonding.

The LED chip 52 ready for mounting has already passed tests on optical properties, such as color variation and color temperature. That is to say, according to the present embodiment, the LED chip 52 is already provided with a phosphor film and thus produces white light. Consequently, it is possible to test the optical properties of the LED chip 52 before mounting. As a result, it is prevented that an LED module is rejected (as a nonconforming product) because of insufficient optical properties. Thus, manufacturing yields of finished products (LED module) improve.

As shown in FIG. 21C, an aluminum reflecting film 224 coats the side walls of each though-hole 218 formed through the upper ceramic substrate 214. The aluminum reflecting film 224 also coats the upper surface of the ceramic substrate 214.

After mounting the LED chip 52 onto the ceramic substrate 216, the LED chip 52 is covered with a first resin 226, such as silicon. Then, lenses 204 are formed by injection molding a second resin 228, such as epoxy. It is also applicable to form the lenses 204 by molding epoxy resin alone without silicon resin.

The 217 LED chips 52 are connected in a 31 series×7 parallel arrangement by a wiring pattern 230 formed on the upper surface of the ceramic substrate 216.

FIG. 22A is a plan view of the LED module 200 without the lenses 204 and the upper ceramic substrate 214. At each mounting location of the LED chips 52, a pair of the anode pad 222 and the cathode pad 220 is provided (FIG. 22B).

The wiring pattern 230 connects the anode pads 222 and the cathode pads 220 bonded to the respective LED chips 52 in a manner that there are seven groups of 31 serially connected LED chips 5 and that the groups of LED chips are connected in parallel. One end of the wiring pattern 230 is connected to the positive terminal 208 shown in FIG. 21A via a plated-through hole (not illustrated), and the other end is connected to the negative terminal 210 also shown in FIG. 21A via a plated-though hole (not illustrated).

The LED module 200 having the above structure is fixed to the lighting fixture 232 when put to use. The LED module 200 and the lighting fixture 232 together constitute a lighting device 234.

Figure 23A:
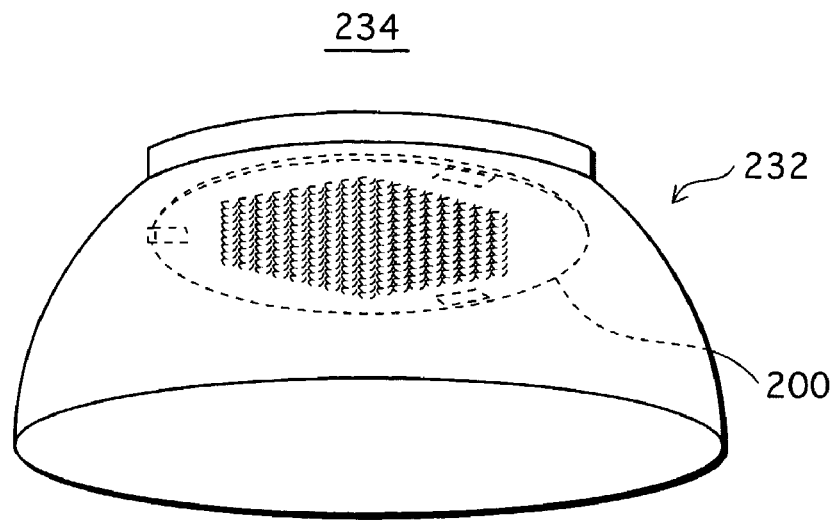
FIG. 23A is an oblique view of, and FIG. 23B is a bottom view of a lighting device according to the embodiment 4.
Figure 23B:
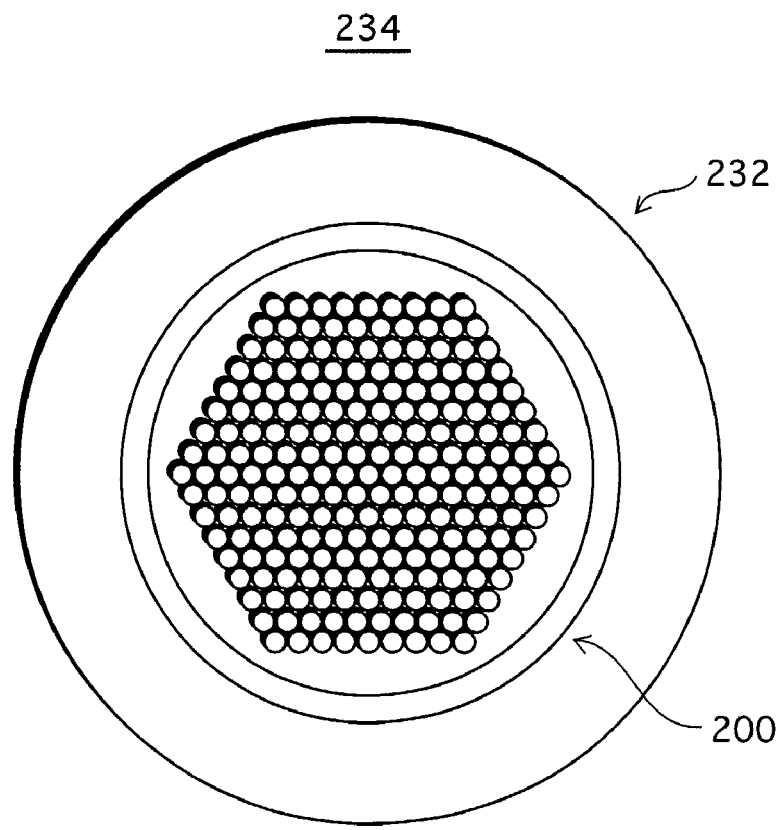

FIG. 23A is a schematic oblique view of the lighting device 234, whereas FIG. 23B is a bottom view of the lighting device 234.

The lighting fixture 232 is fixed in a ceiling of a room, for example. The lighting fixture 232 is provided with an electric circuit (not illustrated) for converting an alternating current from a commercial power source (for example, 10 V, 50/60 Hz) to a direct current required to drive the LED module 200.

Figure 24:
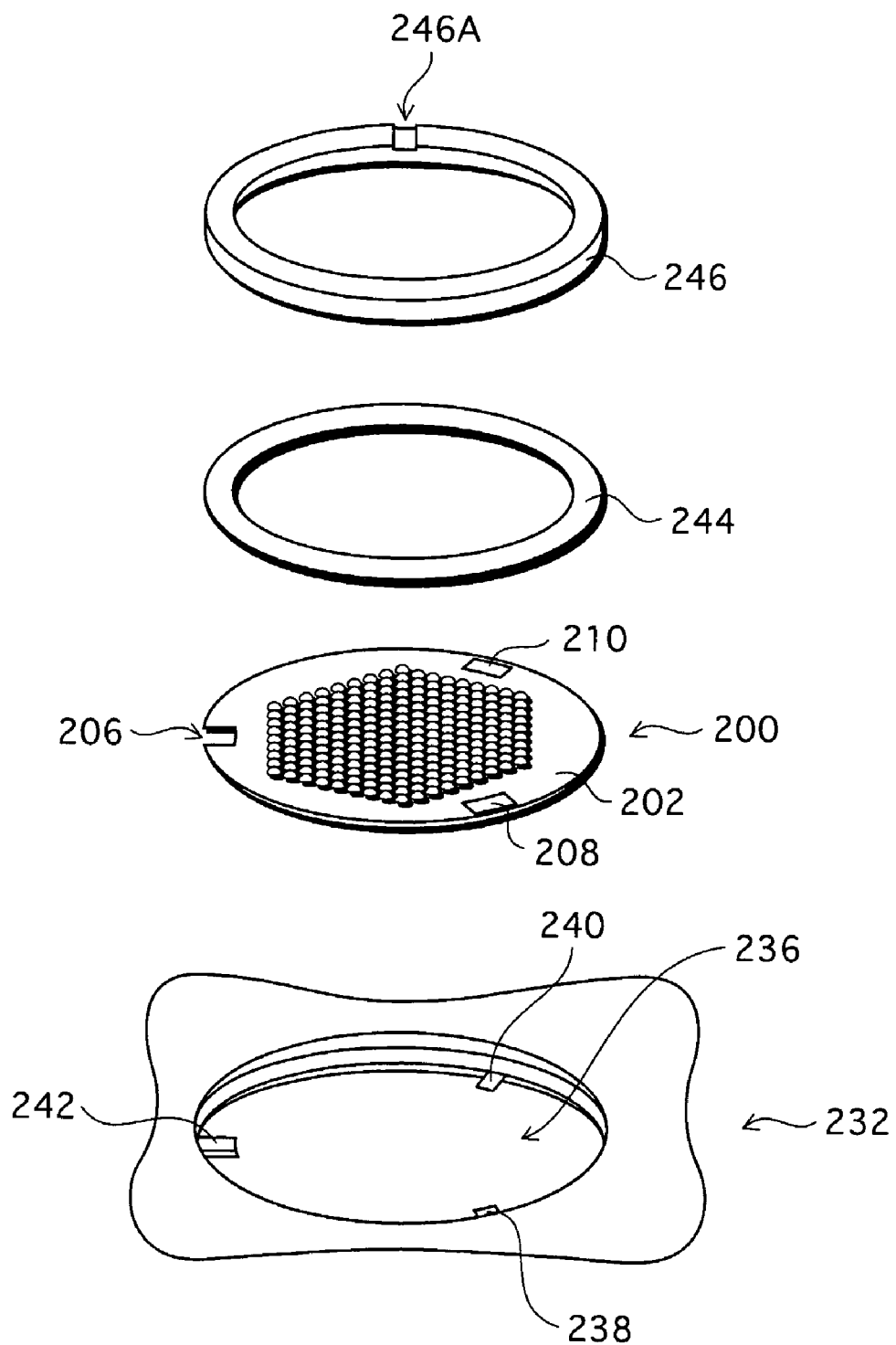
FIG. 24 is a disassembled oblique view of the lighting device according to the embodiment 4.

With reference to FIG. 24, a description is given to the structure for attaching the LED module 200 to the lighting fixture 232.

The lighting fixture 232 has a circular recess 236 for fitting the LED module 200 therein. The circular recess 236 has a flat bottom and an inner wall that is internally threaded (not illustrated) at a portion adjacent its opening. Flexible supply terminals 238 and 240 and a guide pawl 242 inwardly project from points on the inner wall between the threaded portion and the bottom. The supply terminal 238 is a positive terminal, whereas the supply terminal 240 is a negative terminal.

For attachment of the LED module 200 to the lighting fixture 232, there are provided an O-ring 244 made of silicon rubber and a ring screw 246. The ring screw 246 is substantially rectangular in cross section and has an externally threaded outer surface (not illustrated). In addition, the ring screw 246 has a notch 246A in the circumferential direction.

Now, a description is given to an attachment procedure.

First, the LED module 200 is fit into the circular recess. At the time of fitting, the LED module 200 is so positioned that the ceramic substrate 202 comes between the bottom surface and the supply terminals 238 and 240, and that the guide notch 206 engages with the guide pawl 242. Through the engagement between the guide notch 206 and the guide pawl 242, the supply terminals 238 and 240 are properly positioned relatively to the positive terminal 208 and the negative terminal 210.

After the LED module 200 is fit, the O-ring 244 is placed and the ring screw 246 is screwed into the circular recess 236 to secure the ring screw 246 in place. As a result, the positive terminal 208 and the negative terminal 210 come into intimate contact with the supply terminals 238 and 240, respectively, thereby reliably establishing electrical connection. In addition, the substantially entire surface of ceramic substrate 202 is brought into intimate contact with the flat bottom surface of the circular recess 236. Thus, heat generated by the LED module 200 is effectively conducted to the lighting fixture 232, thereby improving cooling effect of the LED module 200. To further improve the heat conductivity, silicone grease may be applied to the ceramic substrate 202 and the bottom surface of the circular recess 236.

On application of an electric current from a commercial power source to the lighting device 234 having the above structure, the LED chips 52 emit white light through the lenses 204.

Figure 25A:
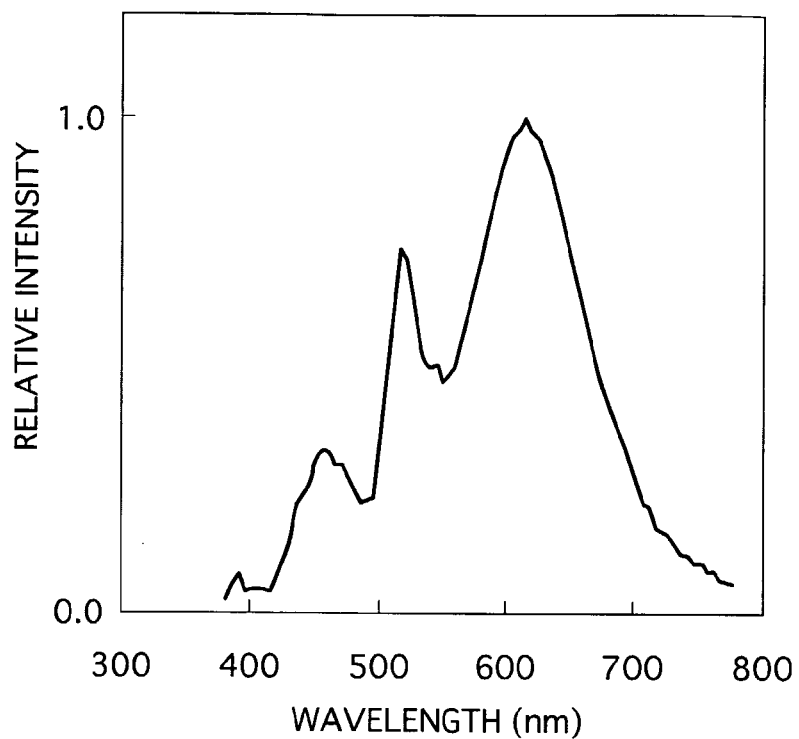
FIG. 25 are a graph of emission spectrum and a chromaticity diagram of the lighting device according to the embodiment 4.
Figure 25B:
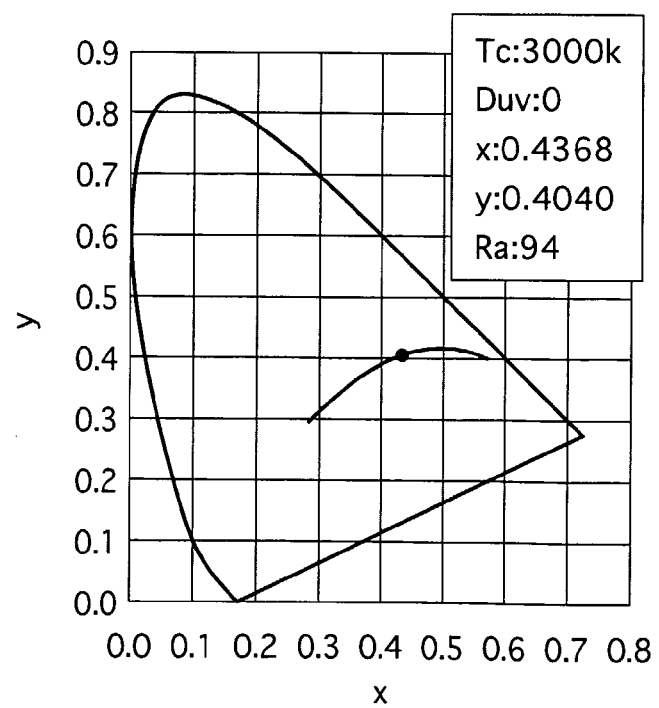

The LED module 200 typically exhibited the following optical properties on application of an electric current of 560 mA: the total luminous flux of 2,800 lm, and an on-axis luminous intensity of 5,000 cd. FIGS. 25A and 25B are a graph of the exhibited emission spectrum and its chromaticity diagram, respectively.

Note that in the above example, the LED module is composed of the LED chips 52 according to the embodiment 2. Alternatively, the LED chips 2 according to the embodiment 1 may be used.

Figure 26A:
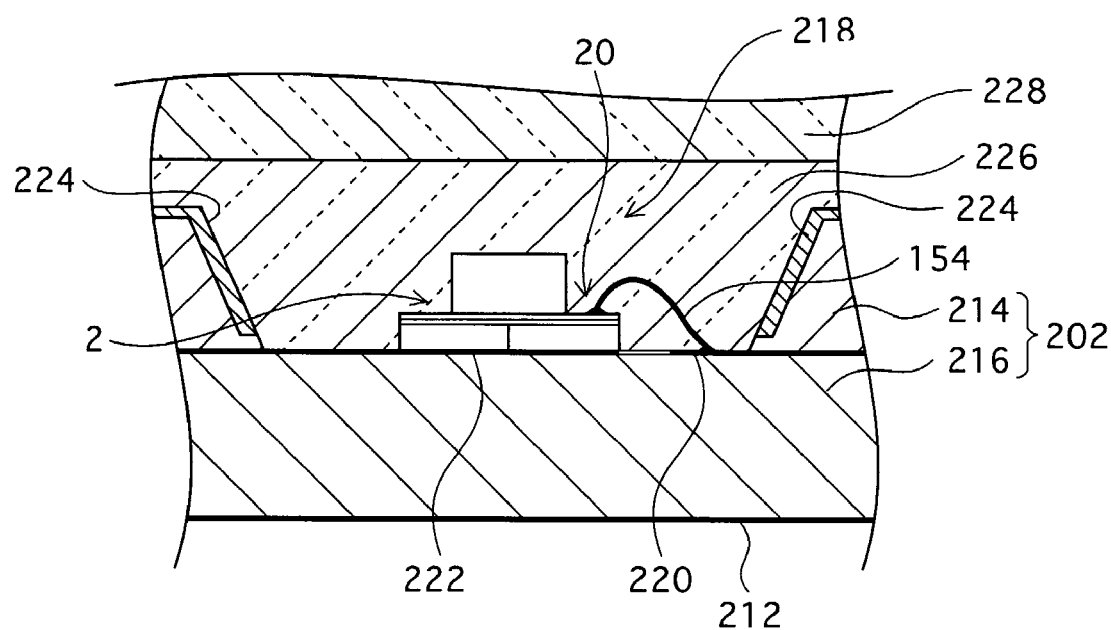
FIG. 26 are views of a modification of the embodiment 4.
Figure 26B:
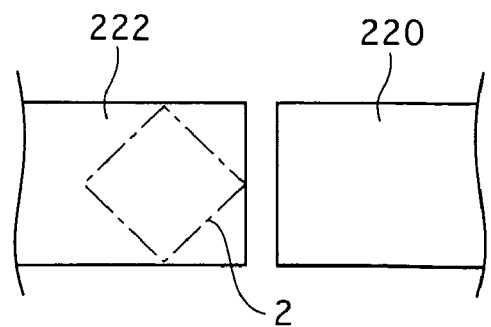

FIG. 26 are views showing the LED chip 2 attached to an LED module. FIGS. 26A and 26B correspond to FIGS. 21C and 22B, respectively. Note that in the case of LED chip 2, the diameter of the through hole 218 needs to be slightly larger because a bonding wire is used as described below. Otherwise, the LED module composed LED chips 2 is similar to that composed of LED chips 52. In view of this, the same reference numbers are used in FIG. 26 for components similar to those shown in FIGS. 21C and 22B, and no description is given to such components.

Each LED chip 2 is mounted onto the ceramic substrate 202 by bonding the anode supply terminal 4 (see FIG. 1B) at the bottom to the anode pad 222. The cathode supply terminal 20 is connected to the cathode pad 220 with a bonding wire 154.

As mentioned above, each LED chip 2 is mounted using the bonding wire 154. The bonding wire 154 extends from the cathode supply terminal 20 that is positioned at the rear of the light extraction surface in the light emission direction. That is, the bonding wire 154 does not obstruct, not even partially, the path of emission light from the light extraction surface. It is thus highly unlikely that the bonding wire 154 cast its shadow on the radiated surface.

Figure 27A:
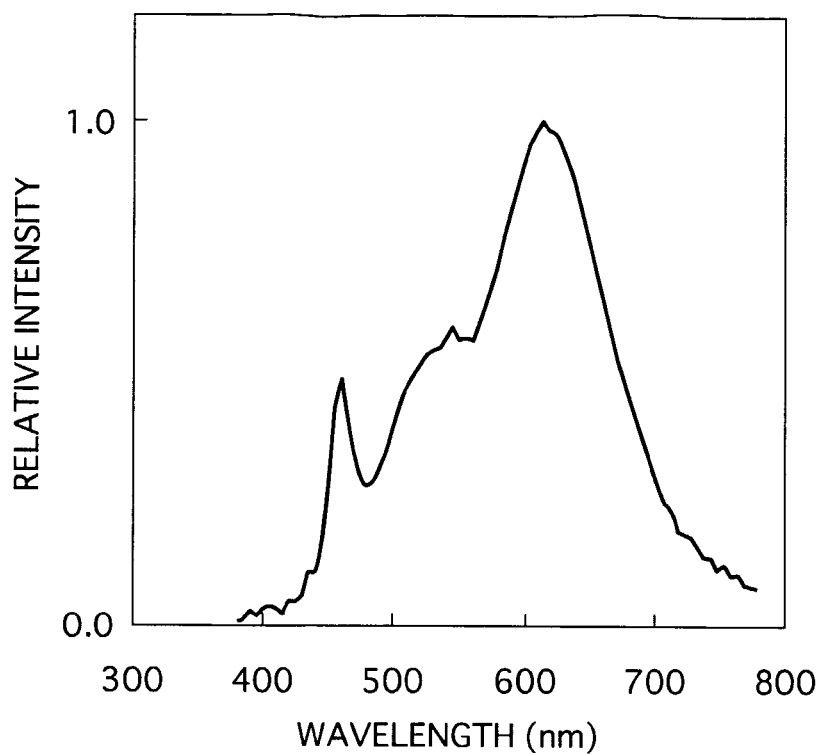
FIG. 27 are a graph of emission spectrum and a chromaticity diagram of the lighting device according to the modified embodiment 4.
Figure 27B:
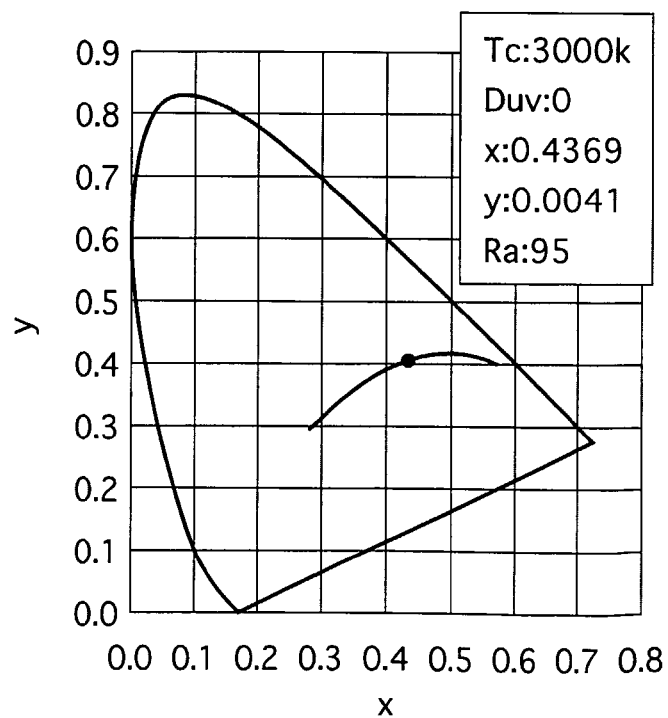

The LED module composed of the LED chips 2 exhibited the emission spectrum and chromaticity of as shown in FIGS. 27A and 27B, respectively.

Up to this point, the description has been given to the examples in which the semiconductor light emitting devices are used for illumination, such as lighting modules and lighting devices. Yet, applications of the semiconductor light emitting devices of the present invention (LED chips) are not limited to such, and another application may be a display purpose. Specifically, it is applicable to use the semiconductor light emitting devices according to the present invention as a light source of a display element. One example of display element is a surface mounting device (SMD) LED manufactured by packaging an LED chip. The SMD LED may have such a structure that a semiconductor light emitting device (LED chip) is mounted and sealed (molded) on a ceramic substrate with a transparent epoxy resin. Note that specific examples of such SMD LEDs will be given later.

Generally, SMD LEDs are used singly or in combination. Examples of singly used SMD LEDs include the ones used in remote controllers for home appliances, such as television sets, video players, and air conditioners. Examples of a plurality of LEDs used in combination include the ones used in dot-matrix display devices for displaying alphanumeric characters and symbols. In the latter example, each LED is used as one dot. The semiconductor light emitting devices (LED chips) of the present invention may be made smaller in size and still produce equal or even better light output in comparison with conventional LED chips. This advantage serves to realize a small SMD, and thus serves to downsize portable electronic devices, such as mobile phones, into which such small SMDs are incorporated.

Note that when the LEDs are used in a dot-matrix display device, it is applicable to embody the LEDs as a COB (chip-on board) LEDs, rather than SMD LEDs. That is to say, the LEDs are disposed directly on a circuit board in a matrix to constitute a dot-matrix display device. Specific examples of dot-matrix display devices are given later.

Embodiment 5

In the embodiments described above, the p-electrode is formed into a specific shape so as to improve the luminance efficiency, without increasing the drive current. In an embodiment 5, however, it is mainly the semiconductor multilayer structure that is formed into a specific shape.

Figure 29A:
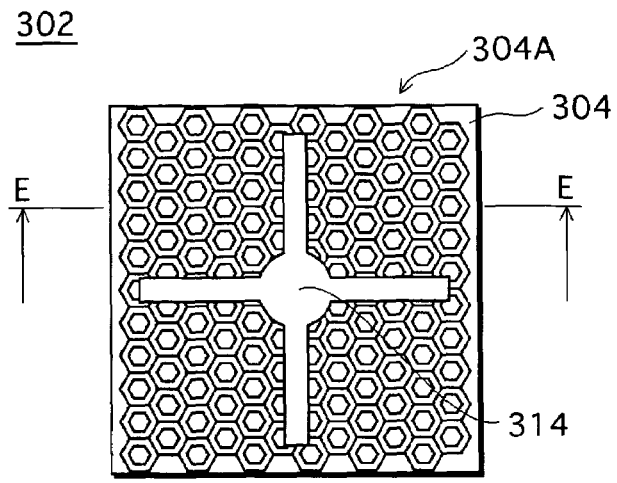
FIG. 29 are views of an LED chip according to an embodiment 5 of the present invention.
Figure 29B:
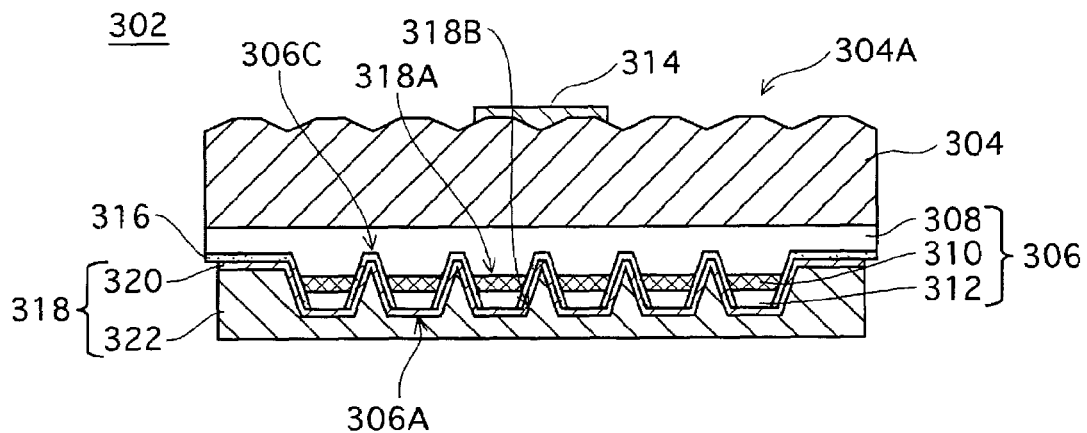

FIG. 29 shows an LED chip 302 according to the embodiment 5. FIG. 29 is a plan view of the LED chip 302, whereas FIG. 29B is a sectional view taken along the line E-E of FIG. 29A.

As shown in FIGS. 29A and 29B, the LED chip 302 is composed of an n-GaN substrate 304 as a base substrate, and a semiconductor multilayer structure 306 epitaxially grown on then-GaN substrate 304. The semiconductor multilayer structure 306 is mainly composed of an n-AlGaN layer 308 (2 μm thick), an InGaN/GaN quantum well emission layer 310 (200 nm thick), a p-AlGaN layer 312 (200 nm thick) laminated over the n-GaN substrate 304 in the stated order.

In order to improve light extraction efficiency, the n-GaN substrate 304 has a projection-depression surface profile 304A defined by truncated hexagonal cones projecting on its upper surface (light extraction surface). An n-electrode 314 is formed in the shape of a cross on the upper surface of the n-GaN substrate 304, by laminating Ti/Au films in the stated order.

Figure 29C:
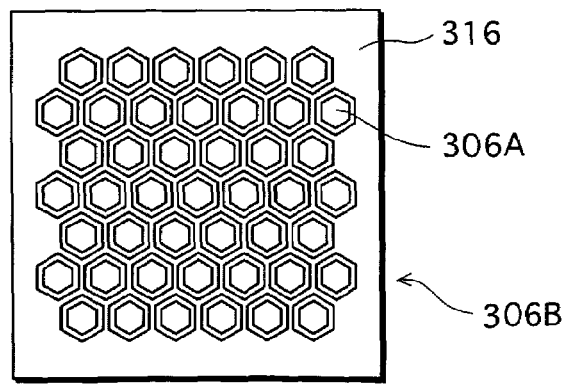

FIG. 29C is a bottom view of the LED chip 302 from which a later-described p-electrode 318 (FIG. 29B) is removed. That is, what is visible in FIG. 29C is part of the undersurface of semiconductor multilayer structure 306 and a later-described insulating film 316 (FIG. 29B). As shown in FIGS. 29C and 29B, the undersurface (main surface facing away from the n-GaN substrate 304) of the semiconductor multilayer structure 306 has a projection-depression surface profile 306B defined by projections 306A each having the shape of a truncated hexagonal cone. The projections 306A are distributed substantially uniformly, and the pitch of the projections and depressions is about 20 μm.

The bottom of each depression 306C in the projection-depression surface profile 306B is recessed into a middle of the n-AlGaN layer 308 in the thickness direction. That is, the emission layer 310 (as well as the p-AlGaN layer 312) is sectioned into as many pieces as the projections 306A.

The insulating film 316 is formed to cover regions of the undersurface of the semiconductor multilayer structure 306 other than the top surfaces of the projections 306A (i.e. the bottom surfaces of the depressions 306C and the side surfaces (inclined surfaces) of projections 306A). The insulating film 316 is made of silicon nitride.

Formed subsequently to the insulating film 316 is the p-electrode 318 so as to face the substantially entire surface of the semiconductor multilayer structure 306. The p-electrode. 318 is composed of a stack of Rh/Pt/Au films 320 and an Au film 322 laminated over the semiconductor multilayer structure 306 in the stated order. The stack of Rh/Pt/Au films 320 acts as a reflecting film that reflects emission light from the emission layer 310 at high reflectivity. By the presence of the insulating film 316, the p-electrode 318 is electrically connected with the semiconductor multilayer structure 306 only via the top surface of each projection 306A (p-AlGaN layer 312). In addition, since the p-electrode 318 is formed to fill the depressions 306C in the projection-depression surface profile 306B of the semiconductor multilayer structure 306, the surface of the p-electrode 318 facing toward the semiconductor multilayer structure 306 inherently has projections and depressions conforming to the projection-depression surface profile 306B. Thus, the side walls 318B of each depression 318A are outwardly inclined toward the n-GaN substrate 304.

On application of an electric current to the LED chip 302 having the above structure via the p-electrode 318 and the n-electrode 314, the emission layer 310 emits blue light at a wavelength of 460 nm. Part of the blue light emitted from the emission layer 310 travels directly toward the p-AlGaN layer 312 (travels downward) and is reflected by the stack of Rh/Pt/Au films 320 toward the n-GaN substrate 304 (reflected upward). In addition, part of the blue light travels laterally and is reflected upwardly toward the n-GaN substrate 304 by the side walls (inclined surfaces) 318B of the depressions 318A. The blue light incident on the n-GaN substrate 304 exits without being reflected, owing to the effect of the projection-depression surface profile 304A.

As described above, the LED chip 302 ensures an excellent luminous efficiency. It is because the LED chip 302 allows extraction of light including not only light emitted from the emission layer 310 directly toward the n-GaN substrate 304 (emitted upward), but also light emitted downwardly and laterally. The downwardly and laterally emitted light exits the LED chip 302 after being reflected by the stack of Rh/Pt/Au films 320 toward the n-GaN substrate 304.

Although facing substantially entirely of the surface of semiconductor multilayer structure 306, the p-electrode 318 makes electrical contact with the semiconductor multilayer structure 306 (p-AlGaN layer 312) at the top surfaces of the uniformly distributed projections 306A. As a result, an electric current (drive current) supplied to the p-electrode 318 is intensively injected to the projections 306A (i.e. with higher current density than would otherwise be). The injected current is in turn injected to the emission layer 310, with the higher current density substantially maintained. As a result, the current density (carrier density) within the emission layer 310 increases to cause the screening effect, which cancels out the piezoelectric effect. This increases the radiative recombination rate, and thus improves the luminous efficiency. Since the projections 306A are distributed substantially uniformly throughout the surface of the semiconductor multiyear structure 306, the amount of light emitted from the overall semiconductor multilayer structure 306 increases.

Now, with reference to FIGS. 30-32, a description is given to a manufacturing method of the LED chip 302 having the above structure. In FIGS. 30-32, materials of the components of LED chip 302 are denoted by reference numbers in the five thousands, and the last three digits correspond to the reference numbers denoting the respective LED chip components.

First, as shown in FIG. 30, the following layers are epitaxially grown by the MOCVD method over an n-GaN substrate 5304. That is, a 30 nm thick GaN undercoating layer (not illustrated), an n-AlGaN layer 5308, an InGaN/GaN quantum well emission layer 5310, a p-AlGaN layer 5312 are laminated in the stated order [Step A3]. Note that the N-GaN substrate measures 2 inches in diameter and 200 μm in thickness.

Next, predetermined regions of the semiconductor multilayer structure 5306 are removed by etching to a midway of then-AlGaN layer 5308 in thickness, so as to form the hexagonal truncated projections 306A [Step B3].

To form an insuring layer 316, a silicon nitride film is provided on the upper surface of the semiconductor multilayer structure, leaving the top surfaces of projections 306A exposed [Step C3]

Next, the stack of Rh/Pt/Au films 320 is laminated over the semiconductor multilayer structure to cover a region that later becomes the LED chip 302 [Step D3].

The Au film 322 is formed by plating [Step E3] for protection of the projection-depression surface profile 306B (FIG. 29). Note that the Au film 322 measures about 30 μm in thickness.

Next, the n-GaN substrate 5304 is ground to a thickness of about 100 μm [Step F3].

The rear surface of the n-GaN substrate 5304 is shaped into the projection-depression surface profile 5304A by patterning [Step G3].

The n-electrode 314 is formed at a predetermined location on the surface of the n-GaN substrate 5304 [Step H3].

Finally, the in-process wafer is cut into chips with a dicing blade DB, thereby completing the LED chip 302 [Step I3].

Embodiment 6

In the embodiment 5 above, in order to improve luminous efficiency of the LED chip without increasing the drive current, the surface of the semiconductor multilayer structure facing toward the p-electrode is formed to have a projection-depression surface profile defined by hexagonal truncated projections that are substantially uniformly distributed. Although the same effect is achieved, an embodiment 6 differs largely from the embodiment 5 in that the projection-depression surface profile of the semiconductor multilayer structure is defined by hexagonal truncated depressions (pits) that are distributed substantially uniformly.

Figure 33A:
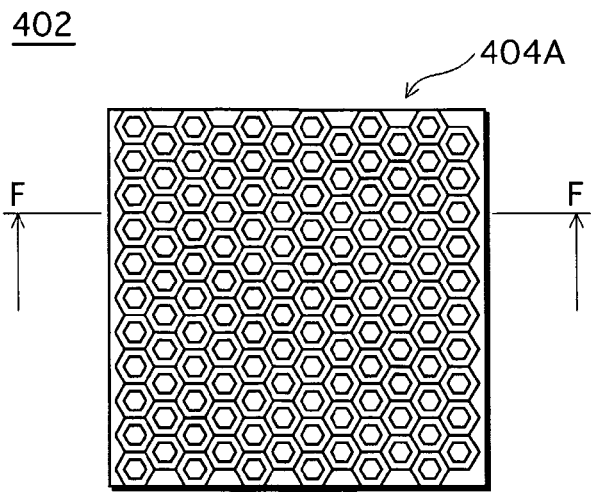
FIG. 33 are views of an LED chip according to an embodiment 6 of the present invention.
Figure 33B:
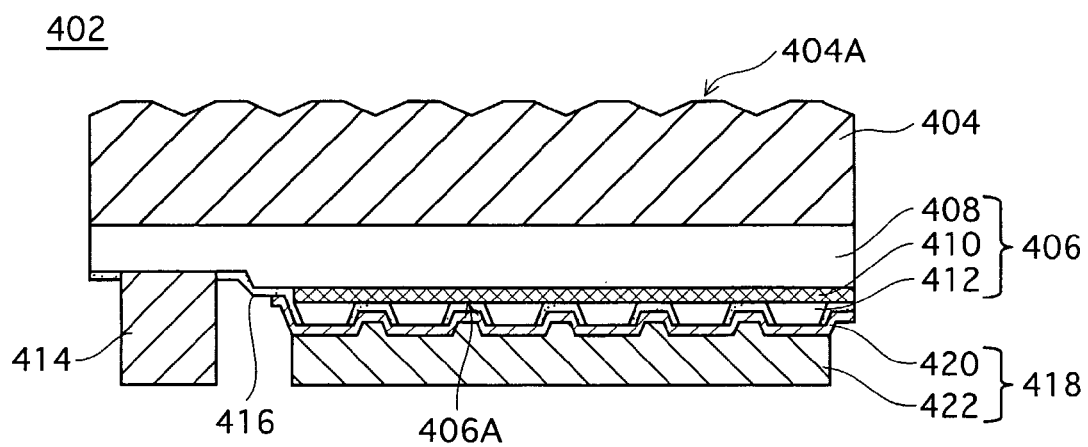

FIG. 33 show an LED chip 402 according to the embodiment 6. FIG. 33A is a plan view of the LED chip 402, whereas FIG. 33B is a sectional view taken along the line F-F of FIG. 33A.

As shown in FIGS. 33A and 33B, the LED chip 402 is composed of an n-GaN substrate 404 as a base substrate, and a semiconductor multilayer structure 406 epitaxially grown on then-GaN substrate 404. The semiconductor multilayer structure 406 is mainly composed of an n-AlGaN layer 408 (2 μm thick), an InGaN/GaN quantum well emission layer 410 (200 nm thick), a p-AlGaN layer 412 (200 nm thick) laminated over the n-GaN substrate 404 in the stated order.

In order to improve light extraction efficiency, the n-GaN substrate 404 has a projection-depression surface profile 404A defined by truncated hexagonal cones projecting on its upper surface (light extraction surface).

A corner region of the semiconductor multilayer structure 406 is cut away partially in thickness. The cut-away region ranges from the p-AlGaN layer 412 to a midway of the n-AlGaN layer 408. An n-electrode 414 is provided at a location of the cut-away region. Note that the n-electrode 414 is made of gold (Au).

Figure 33C:
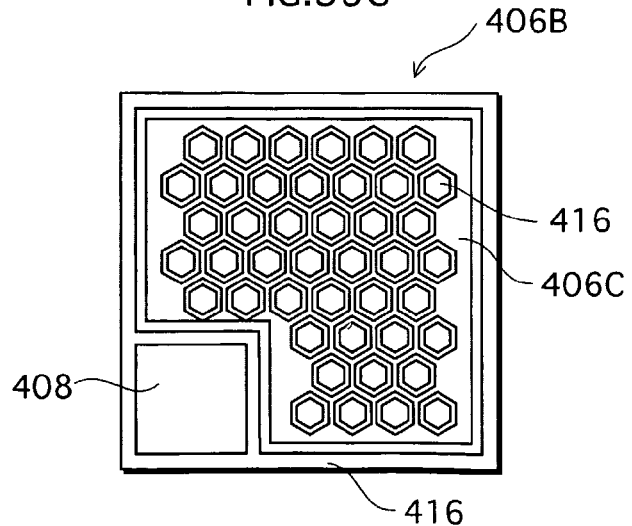

FIG. 33C is a bottom view of the LED chip 402 from which the n-electrode 414 and a later-described p-electrode 418 (FIG. 33B) is removed. That is, what is visible in FIG. 33C is part of the semiconductor multilayer structure 406 and a later-described insulating film 416. In FIG. 33C, each one of double-hexagons represents a depression 406A that is recessed toward the rearward direction as seen in the figure. Since the double-hexagons (depressions 406A) are illustrated with exaggeration for the sake of clarity, no double-hexagon is illustrated along the edges of the semiconductor multilayer structure 406. Yet, in practice, the depressions 406A represented by the double-hexagons are present on the semiconductor multilayer structure 406 from edge to edge. Specifically, each inner hexagon represents the bottom of the depression 406A, whereas each outer hexagon represents the outer edge of side walls. The portion of the figure between the outer and inner hexagons represents the side walls of the depression 406A that are tapered toward the bottom.

As shown in FIGS. 33C and 33B, the undersurface (main surface of the semiconductor multilayer structure 406 facing away from the n-GaN substrate 404) has a projection-depression surface profile 406B defined by truncated hexagonal depressions 406A that are uniformly distributed. The pitch of projections and depressions is about 20 μm.

The bottom of each depression 406A is recessed into the emission layer 410. That is, the p-AlGaN layer 412 is meshed by the presence of the depressions 406A.

The insulating film 416 is formed to coat the bottom and side surfaces of the depressions 406A. The insulating film 416 is made of silicon nitride.

Subsequently to the insulating film 416, the p-electrode 418 of the semiconductor multilayer structure 406 is formed. The p-electrode 418 is composed of a stack of Rh/Pt/Au films 420 and an Au film 422 laminated over the semiconductor multilayer structure 406 in the stated order. The stack of Rh/Pt/Au films 420 acts as a reflecting film that reflects emission light from the emission layer 410 at high reflectivity.

By the presence of the insulating film 416, the p-electrode 418 is electrically connected with the semiconductor multilayer structure 406 only via the undersurfaces of the p-AlGaN layer 412 (i.e. the top surfaces of the projection 406C in the projection-depression surface profile 406B (FIG. 33C)).

In addition, since the p-electrode 418 is formed on the semiconductor multilayer structure 406 so as to fill the depressions 406A in the projection-depression surface profile 406B, the surface of the p-electrode 418 facing toward the semiconductor multilayer structure 406 inherently has projections and depressions conforming to the projection-depression surface profile 406B. Thus, the side surfaces of each projection are tapered toward the n-GaN substrate 404.

On application of an electric current to the LED chip 402 having the above structure via the p-electrode 418 and the n-electrode 414, the emission layer 410 emits blue light at a wavelength of 460 nm. Part of the blue light emitted from the emission layer 410 travels directly toward the p-AlGaN layer 412 (travels downward) and is reflected by the stack of Rh/Pt/Au films 420 toward the n-GaN substrate 404 (reflected upward). Blue light incident on the n-GaN substrate 404 exits without being reflected, owing to the effect of the projection-depression surface 404A.

As described above, the LED chip 402 ensures an excellent luminous efficiency. It is because the LED chip 402 allows extraction of light including not only light emitted from the emission layer 410 directly toward the n-GaN substrate 404 (emitted upward), but also light emitted downwardly. The downwardly emitted light exits the LED chip 402 after being reflected by the stack of Rh/Pt/Au films 420 toward the n-GaN substrate 404.

In addition, the p-electrode 418 makes electrical contact with the semiconductor multilayer structure 406 (p-AlGaN layer 412) at the top surface of the meshed projection 406C. As a result, an electric current (drive current) supplied to the p-electrode 418 is intensively injected to the top surface of the meshed projection 406C (i.e. with higher current density than would otherwise be). The injected current is in turn injected to the emission layer 410, with the higher current density substantially maintained. As a result, the current density (carrier density) within the emission layer 410 increases to cause the screening effect, which cancels out the piezoelectric effect. This increases the radiative recombination rate and thus improves the luminous efficiency. Since the top surface of the meshed projection 406C extends substantially uniformly thorough out the surface of the semiconductor multiyear structure 406, the amount of light emitted from the overall semiconductor multilayer structure 406 increases.

Embodiment 7

Now, a description is given to examples of SMD LEDs composed of the LED chips according to the embodiments 1-3, 5, and 6.

Although any of the LED chips of the above embodiments is applicable, the LED chip 402 of the embodiment 6 is used in the following example.

Figure 34A:
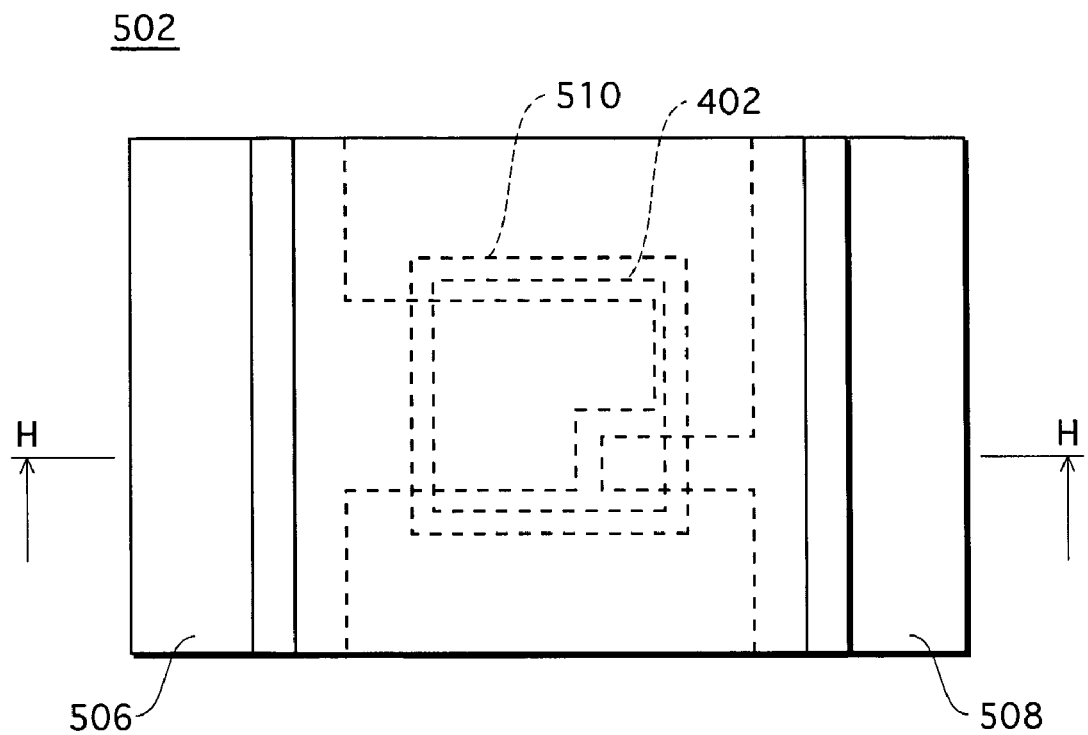
FIG. 34 are views of an SMD LED according to an embodiment 7 of the present invention.
Figure 34B:
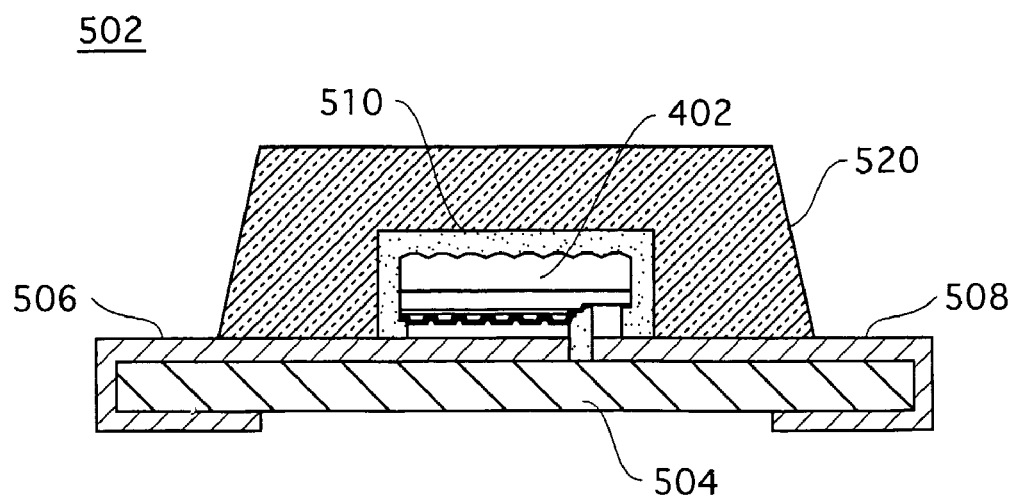

FIG. 34A is a plan view of an SMD LED 502 according to the embodiment 7 (hereinafter, simply "LED 502"), whereas FIG. 34B is a sectional view taken along the line H-H of FIG. 34A.

The LED 502 is composed of a rectangular plate-like ceramic substrate 504, and a pair of supply terminals 506 and 508. The supply terminals 506 and 508 are both formed on the upper surface of the ceramic substrate and extend across different side surfaces to the undersurface. The LED chip 402 is mounted on the upper surface of the ceramic substrate 504 so as to cover the exposed edges of the supply terminals 506 and 508. A phosphor film 510 is formed over the ceramic substrate 504 to cover the LED chip 402. The phosphor film 510 is in turn sealed within a film of epoxy resin 520, which is a sealing agent.

On application of an electric current to the LED 502 having the above structure via the supply terminals 506 and 508, the LED chip 402 emits blue light. The blue light is converted by the phosphor film 510 into white light, and the resulting white light transmits the epoxy resin film 520 to the outside.

Note the LED 502 is surface-mounted on an electric appliance by electrically connecting a printed wiring board provided within the appliance, to the supply terminals 506 and 508 at their edges exposed on the undersurface of the ceramic substrate 504.

Embodiment 8

Now, a description is given to examples in which the LED chips according to the above embodiments 1-3, 5, and 6 are used as a light source for a display device.

Although any of the LED chips of the above embodiments is applicable, the LED chip 402 of the embodiment 6 is used in the following example.

Figure 35A:
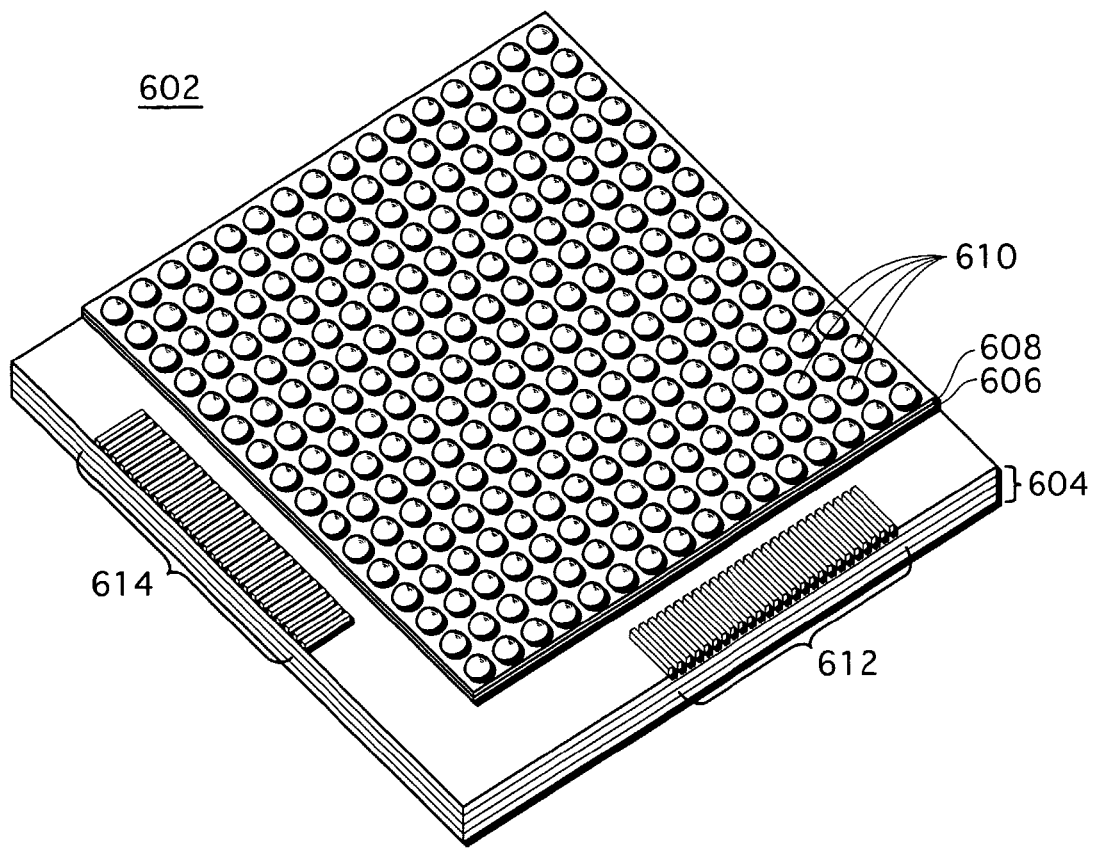
FIG. 35 are views of a dot-matrix display device according to an embodiment 8 of the present invention.

FIG. 35A is an oblique view of a dot-matrix display device 602, which is one type of a display device (hereinafter, simply "display device 602").

The display device 602 is composed of a multilayer printed wiring board (PWB) 604, and a reflecting mirror 606 and a lens plate 608 that are laminated in the stated order in a region of one main surface of the PWB 604. Within the region, a total of 256 light emitting units 610 are arranged in 16 rows×16 columns. Each light emitting unit 610 includes one LED chip 402 as described later.

The multilayer PWB 604 is further provided with connecting terminals 612 and 614 positioned outside the above region of the main surface. The connecting terminals 612 and 614 are connected to an external driving circuit (not illustrated) for driving the LED chip 402 included in each light emitting unit 610. Each of the connecting terminals 612 and 614 are also connected to each LED chip 402 through a wiring pattern of the multi-layer PWB 604. Thus, each LED chip 402 is individually operated by the external driving circuit and thus can be separately turned ON and OFF.

Figure 35B:
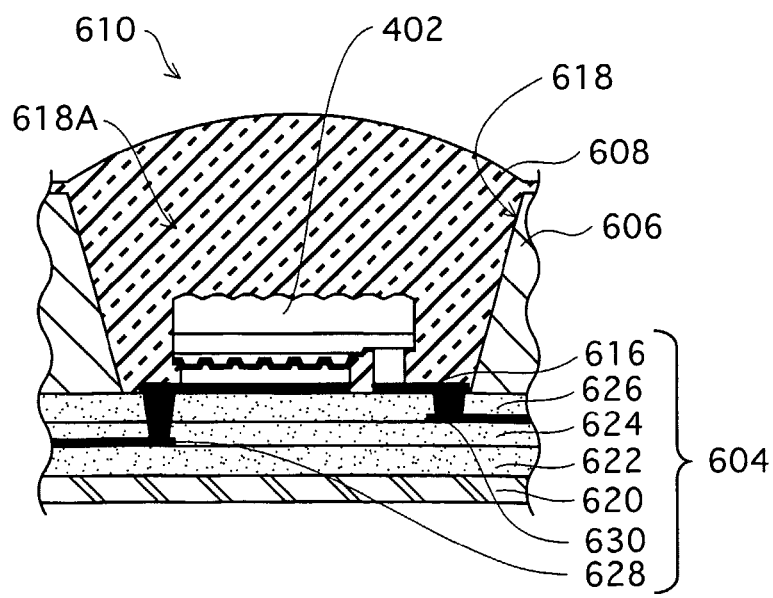

FIG. 35B is an enlarged sectional view of the light emitting unit 610.

As shown in FIG. 35B, the LED chip 402 is flip-chip mounted by attaching the LED chip 402 to a conductive land 616 disposed on the main surface of the multilayer PWB 604. The reflecting mirror 606 is disposed so that its reflecting surface 618 surrounds the LED chip 402. In addition, a downwardly tapered hole 618A is formed by the reflecting surface 618 and filled with an epoxy resin, thereby forming part of the lens plate 608.

The multilayer PWB 604 is composed of a first layer of a metal layer 620, and three insulating layers 622, 624, and 626 laminated over the metal layer 620. In addition, a wiring layer 628 is sandwiched between the insulating layers 622 and 624, and a wiring layer 630 is sandwiched between the insulating layers 624 and 626. The conductive land 616 is connected to the wiring layers 630 and 628 using via holes.

Up to this point, the present invention has been described by way of the above embodiments. It is naturally appreciated, however, that the present invention is not limited to the above specific embodiments and various modifications including the following are possible.

(1) In the above embodiments, every emission layer is of a multiple quantum well structure. Yet, the emission layers may be of a single quantum well structure.

(2) The method for forming high-defect and low-defect regions by localizing lattice defects is not limited to the one described in the embodiment 2. Alternatively, the method disclosed in JP Patent Application Publication No. 2001-308462 or a technique known as ELOG (Epitaxial Lateral Overgrowth) may be used. Furthermore, although the above embodiments use sapphire substrates for epitaxial growth of the semiconductor multilayer structures, the present invention is not limited to such. It is applicable to replace the sapphire substrates with semiconductor substrates, such as GaN substrates, SiC substrates, Si substrates, and GaAs substrates.

(3) In the above embodiment 2, the semiconductor multilayer structure is epitaxially grown on a sapphire substrate and subsequently separated into individual chips (semiconductor light emitting devices) on the sapphire substrate. Yet, the present invention is not limited to such. Instead of separating the semiconductor multilayer structure into chips on the sapphire substrate, the separation may be performed after wholly transferring the grown semiconductor multilayer structure onto a base substrate (high-resistance Si substrate), which will be the substrate of a finished LED chips.

Furthermore, although the above embodiments relate to the cases where the semiconductor multilayer structure is transferred onto an Si substrate, the semiconductor multilayer structure may be transferred onto a substrate made of another metal (such as Cu), semiconductor (such as SiC), and ceramics (such as AlN).

(4) In the embodiments 5 and 6, the semiconductor multilayer structure has a projection-depression surface profile on the surface facing toward the p-electrode. The bottom of each depression is recessed into the n-semiconductor layer according to the embodiment 5, and into the emission layer according to the embodiment 6. Yet, the present invention is not limited to such, and it is applicable that the bottom of each depression is recessed into the p-semiconductor layer.

(5) In the above embodiments 5 and 6, the projections or depressions are hexagonal in transverse cross-section. Yet, the present invention is not limited to such, and the cross-section may have any of the shapes shown in FIGS. 18C, 18D, and 19.

(6) It is applicable to modify the white LED chip of the embodiment 1 or 2 to include the semiconductor multilayer structure and the p-electrode of the embodiment 5 or 6. In other words, the modified white LED chip is basically identical to the white LED chip according to the embodiment 1 or 2, except the semiconductor multilayer structure and the p-electrode that are according to the embodiment 5 or 6.

(7) It is applicable to modify the embodiment 5 or 6 by controlling, as described in the embodiment 2, lattice defects yielded in the semiconductor multilayer structure to be localized in regions not in contact with the p-electrode (high-defect regions). Consequently, the regions of semiconductor multilayer structure (p-semiconductor layer) that are in contact with the p-electrode have less lattice defects (low-defect regions).

That is, as described with reference to FIGS. 29 and 33, a plurality of projections (306A) in the case of embodiment 5, and depressions (406A) in the case of embodiment 6 are formed in a substantially uniformly distributed relation on the surfaces of the semiconductor multilayer structure (306 or 406) facing toward the p-electrode (318 or 418), thereby defining the projection-depression surface profile (306B or 406B). The semiconductor multilayer structure (306 or 406) is brought into electrical connect with the p-electrode (318 or 418) at the top surface of each projection (306A or 406C). According to the modified structures, low defect regions present on the surfaces of the semiconductor multilayer structure (306 or 406) are located at positions corresponding to the top surface of each projection (306A or 406C), and high-defect regions are present at the other locations.

(8) It is applicable to form the phosphor layer by dispersing phosphor powder in a low-melting glass. According to the above embodiments, in addition, one phosphor layer is formed with a mixture of a plurality of different phosphor materials. Yet, the present invention is not limited to such. For example, it is applicable to form a plurality of phosphor layers each with a different phosphor material and laminate the resulting phosphor layers. The latter arrangement suppresses resorption of light that would otherwise occur among different phosphor materials, and makes it easier to control chromaticity.

(9) According to the embodiment 1, the depression 24C of the p-electrode 24 is filled with the insulator 26, as shown in FIG. 1. Yet, the present invention is not limited to such. For example, the depression 24C may be filled with the p-GaN layer (p-semiconductor layer).

Figure 36A:
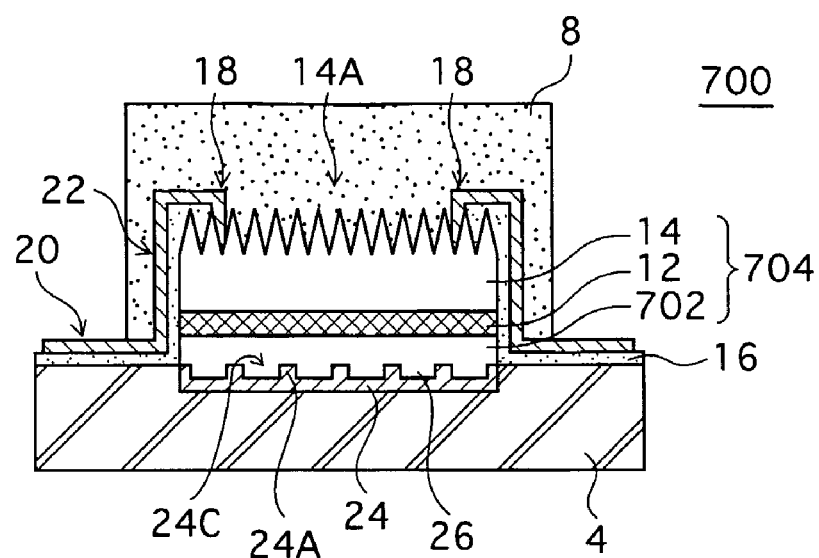
FIG. 36 are views of an LED chip according to a modification of the embodiment 1.
Figure 36B:
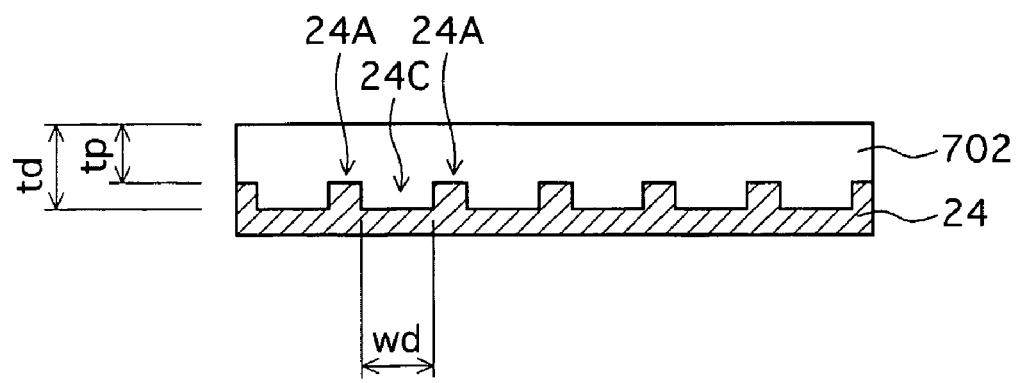

FIGS. 36A and 36B show an LED chip 70 having such a structure.

Apart from the profile of the p-GaN layer, the LED chip 700 is basically identical to the LED chip 2 of the embodiment 1. Thus, the same reference numbers are used in FIG. 36 to denoted similar components to those of the LED chip 2. In addition, no description is given to such similar components and the description below focuses on the difference.

FIG. 36A is a sectional view of the LED chip 700, and corresponds to FIG. 1B. FIG. 36B is an enlarged view of the p-electrode 24 and the p-GaN layer 702 shown in FIG. 36A. Similarly to the figures mentioned above, FIGS. 36A and 36B do not show the components on the same scale.

In the LED chip 700, the p-GaN layer 702 has such a profile that fills the depression 24C of the p-electrode layer 24.

Further, the p-GaN layer 702, the emission layer 12, and the n-GaN layer 14 together constitute a semiconductor multilayer structure 704.

Here, consideration is given to the thickness tp of the p-GaN layer 702 measured in a region corresponding to the top surface of any projection 24A of the p-electrode 24. When the thickness tp is thin enough to satisfy the following relation, the same effect is ensured as achieved by the LED chip 2 of the embodiment 1, regardless of the fact that the depression 24C is not filled with the insulator 24C.

Now, let td denote the thickness of the p-GaN layer 702 measured at a region corresponding to the depression 24C, and let wd denote the width of the depression 24C (the width of the spacing).

It is preferable that tp and td satisfy the relation tp<td. It is more preferable that the relation 5tp<td is satisfied. It is even more preferable that the relation 10tp<td is satisfied.

In addition, it is preferable that tp and wd satisfy the relation tp<wd. It is more preferable that the relation $2tp \leqq wd$ is satisfied. It is even more preferable that the relation $5tp \leqq wd$ is satisfied.

When the relation between tp and td and/or between tp and tw is maintained within the above range, an electric current supplied from the top surfaces of the projections 24A to the p-GaN layer 702 flows directly upward the emission layer 12, without substantial divergence in the surface direction.

In terms of a specific size of tp, it is preferable that $tp \leqq 0.5$ μm is satisfied. It is more preferable that $tp \leqq 0.2$ μm is satisfied. It is even more preferable that $tp \leqq 0.1$ μm is satisfied.

INDUSTRIAL APPLICABILITY

A semiconductor light emitting device according to the present invention is suitable as an LED used in the filed of illumination where the LED is required to have high luminous efficiency.

The invention claimed is:

1. A semiconductor light emitting device, comprising:
   a semiconductor multilayer structure composed of a p-semiconductor layer, a quantum well emission layer, and an n-semiconductor layer each made of a nitride semiconductor and laminated in the stated order, light from the emission layer exiting through the n-semiconductor layer; and
   a p-electrode facing and in electrical connection with the p-semiconductor layer, wherein
   the p-semiconductor layer has, on a surface facing toward the p-electrode, (i) high-defect of dislocation-density regions in which defects of dislocation are localized and (ii) low-defect of dislocation-density regions, the high and low-defect of dislocation-density regions being at regularly or selectively distributed locations,
   the p-electrode has, on a surface facing toward the p-semiconductor layer, a plurality of projections or depressions that are distributed substantially uniformly, and
   the p-electrode is directly in contact, at a top surface thereof, with the low-defect of dislocation-density regions of the p-semiconductor layer.

2. The semiconductor light emitting device according to claim 1, wherein
   the p-electrode is made of a metal that reflects light from the emission layer toward the n-semiconductor layer.

3. The semiconductor light emitting device according to claim 2, further comprising
   an insulator disposed on a recessed surface of the p-electrode to fill a space between the recessed surface and the p-semiconductor layer.

4. The semiconductor light emitting device according to claim 3, wherein
   the insulator is made of a material transparent to light emitted by the emission layer.

5. The semiconductor light emitting device according to claim 3, wherein
   the insulator has a substantially same refractive index as a refractive index of the nitride semiconductor forming the p-semiconductor layer.

6. The semiconductor light emitting device according to claim 1, wherein
   a drive current for driving the semiconductor light emitting device is maintained within such a range that results in an average current density not exceeding 50 A/cm$^2$, the average current density being calculated by dividing the drive current by an area of a main surface of the emission layer,
   the p-electrode faces substantially entirely of the main surface of the emission layer, and
   a ratio between the top and recessed surfaces of the p-electrode is determined so that an electric current flowing through the top surface of the p-electrode measures at least 100 A/cm$^2$ in current density.

7. The semiconductor light emitting device according to claim 1, wherein
   the high-defect of dislocation-density regions are distributed to define one of a quadrangular grid, a hexagonal grid, a triangular grid, and a staggered grid.

8. The semiconductor light emitting device according to claim 1, wherein
   a intensive-injection region is realized by a contact structure of the p-semiconductor layer with the p-electrode.

9. The semiconductor light emitting device according to claim 8, wherein
   the semiconductor multilayer structure has, on a surface facing toward the p-electrode, a plurality of projections or depressions that are distributed substantially uniformly, and
   the semiconductor multilayer structure is in contact with the p-electrode at a top surface of the p-semiconductor layer.

10. The semiconductor light emitting device according to claim 9, wherein
    the p-electrode is made of a metal that reflects light from the emission layer toward the n-semiconductor layer.

11. The semiconductor light emitting device according to claim 9, wherein
    a recessed surface of the semiconductor multilayer structure is present in the n-semiconductor layer.

12. The semiconductor light emitting device according to claim 9, wherein
    the semiconductor multilayer structure has, on the surface facing toward the p-electrode, a high-defect of dislocation region in which lattice defects of dislocation are localized and a low-defect of dislocation region formed adjacent to the high-defect of dislocation region, and
    the low-defect of dislocation region is present at the top surface of the semiconductor multilayer structure.

13. The semiconductor light emitting device according to claim 1, further comprising:
    a base substrate supporting the semiconductor multilayer structure from a direction of the p-semiconductor layer; and
    a phosphor film disposed on a main surface of the semiconductor multilayer structure facing away from the base substrate, the phosphor film extending across a side surface of the semiconductor multilayer structure to the base substrate.

14. A lighting module comprising:

a mounting substrate; and the semiconductor light emitting device as defined in claim 1.

15. A lighting device comprising, as a light source, the lighting module as defined in claim 14.

16. A surface mounting device comprising:

a substrate;

a semiconductor light emitting device as defined in claim 1, and mounted on the substrate; and a resin molding the semiconductor device.

17. A dot-matrix display device comprising:

semiconductor light emitting devices as defined in claim 1 and are arranged in a matrix.

* * * * *